United States Patent
Asanuma et al.

(10) Patent No.: US 8,722,194 B2
(45) Date of Patent: May 13, 2014

(54) POLYVINYL ACETAL COMPOSITION, LAMINATE, AND USE THEREOF

(75) Inventors: Yoshiaki Asanuma, Okayama (JP); Koichiro Isoue, Okayama (JP)

(73) Assignee: Kuraray Co., Ltd., Okayama (JP)

( * ) Notice: Subject to any disclaimer, the term of this patent is extended or adjusted under 35 U.S.C. 154(b) by 102 days.

(21) Appl. No.: 13/389,268

(22) PCT Filed: Aug. 4, 2010

(86) PCT No.: PCT/JP2010/063207
§ 371 (c)(1),
(2), (4) Date: Apr. 23, 2012

(87) PCT Pub. No.: WO2011/016495
PCT Pub. Date: Feb. 10, 2011

(65) Prior Publication Data
US 2012/0202070 A1     Aug. 9, 2012

(30) Foreign Application Priority Data

Aug. 7, 2009 (JP) ................. 2009-185103
Feb. 26, 2010 (JP) ................. 2010-042139
Mar. 31, 2010 (JP) ................. 2010-080645

(51) Int. Cl.
*B32B 17/10* (2006.01)

(52) U.S. Cl.
USPC ............ 428/436; 428/437; 428/501; 428/524

(58) Field of Classification Search
USPC .................. 428/436, 437, 501, 524
See application file for complete search history.

(56) References Cited

U.S. PATENT DOCUMENTS

| | | | |
|---|---|---|---|
| 4,128,694 A | 12/1978 | Fabel et al. | 428/412 |
| 4,293,615 A | 10/1981 | Bowen et al. | 428/412 |
| 6,887,577 B1 * | 5/2005 | Keller et al. | 428/436 |
| 2004/0198909 A1 | 10/2004 | Breitscheidel et al. | 525/165 |
| 2007/0148419 A1 | 6/2007 | Wiedemann et al. | 428/198 |
| 2009/0246517 A1 | 10/2009 | Hatta | 428/339 |
| 2009/0305058 A1 * | 12/2009 | Marumoto | 428/437 |

FOREIGN PATENT DOCUMENTS

| | | |
|---|---|---|
| CN | 1978499 | 6/2007 |
| JP | 53-139684 A | 12/1978 |
| JP | 57-20352 A | 2/1982 |
| JP | 59-111954 A | 6/1984 |

(Continued)

OTHER PUBLICATIONS

China Office action, dated Feb. 21, 2013 along with an English translation thereof.

(Continued)

*Primary Examiner* — D. S. Nakarani
(74) *Attorney, Agent, or Firm* — Greenblum & Bernstein, P.L.C.

(57) ABSTRACT

It is an object of the invention to provide a plasticized polyvinyl acetal composition that is suitably used for an intermediate film of a laminated glass and other applications, specifically, the polyvinyl acetal composition being characterized in that in cases when a layer that is composed of the polyvinyl acetal composition and another resin layer such as a resin layer of a polycarbonate, a poly(meth)acrylic acid ester, or a styrene thermoplastic elastomer are laminated, the plasticizer does not migrate from the polyvinyl acetal layer. The present invention relates to a polyvinyl acetal composition including 100 parts by mass of a polyvinyl acetal and 0.5 to 100 parts by mass of an ester plasticizer or ether plasticizer that is amorphous or has a melting point of 30° C. or less, and has a hydroxyl value of 15 to 450 mgKOH/g.

34 Claims, 1 Drawing Sheet

(56) References Cited

FOREIGN PATENT DOCUMENTS

| | | |
|---|---|---|
| JP | 64-1737 A | 1/1989 |
| JP | 7-17745 A | 1/1995 |
| JP | 8-259334 A | 10/1996 |
| JP | 11-227114 A | 8/1999 |
| JP | 2001-506198 A | 5/2001 |
| JP | 2001-240435 A | 9/2001 |
| JP | 2005-501156 A | 1/2005 |
| JP | 2005-306326 A | 11/2005 |
| JP | 2006-28382 A | 2/2006 |
| JP | 2007-91491 A | 4/2007 |
| JP | 2007-136057 A | 6/2007 |
| JP | 2008-66556 A | 3/2008 |
| JP | 2008-280480 A | 11/2008 |
| WO | 98/26927 A1 | 6/1998 |
| WO | 01/42158 A1 | 6/2001 |
| WO | 2007/029541 A1 | 3/2007 |
| WO | 2008/096403 A1 | 8/2008 |
| WO | 2010/008053 A1 | 1/2010 |

OTHER PUBLICATIONS

U.S. Appl. No. 13/388,903 to Yoshiaki Asanuma et al., filed Feb. 3, 2012.

International Search Report for PCT/JP2010/063207, mailed Oct. 26, 2010.

\* cited by examiner (a)            (b)

(a)            (b)

POLYVINYL ACETAL COMPOSITION, LAMINATE, AND USE THEREOF

TECHNICAL FIELD

The present invention relates to a polyvinyl acetal composition, laminate, and use thereof.

BACKGROUND ART

Polyvinyl acetal represented by polyvinyl butyral has excellent adhesiveness and compatibility with various organic and inorganic substrates and excellent solubility in an organic solvent. As such, it is widely used as various adhesives, and a binder for ceramics, various ink, paint, or the like, or an intermediate film of a laminated glass.

Recently, for giving various functions to an intermediate film of a laminated glass, a laminated intermediate film in which a plasticized polyvinyl acetal sheet and a sheet consisting of a resin other than polyvinyl acetals is laminated is being studied. For example, for the purpose of giving a high sound insulation property to an intermediate film of a laminated glass, studies are made regarding an intermediate film of a sound proof glass in which a plasticized polyvinyl acetal sheet and a styrene-diene block copolymer sheet having an excellent sound insulation property are laminated (refer to Patent Documents 1 to 3) or a highly sound proof front board of a pachinko machine in which such laminated glass is used (refer to Patent Document 4) is studied.

In the prior art literatures above, a plasticizer used for plasticized polyvinyl acetal is not specifically mentioned. However, when a carboxylic acid ester compound of monovalent alcohol and polyvalent carboxylic acid like dihexyl adipate and dioctyl phthalate that is commonly used as a polyvinyl acetal intermediate film of a laminated glass or a carboxylicacid ester compound of monovalent carboxylic acid and polyhydric alcohol like triethylene glycol di 2-ethylhexanoate (3G8) and triethylene glycol diheptanonate is used, the plasticizer migrates from a plasticized polyvinyl acetal sheet to a styrene-diene block copolymer sheet to cause a decrease in dynamic strength or an increase in haze, as shown in the Comparative Examples described below (Comparative Examples 1 to 8).

Further, as another intermediate film of a high performance laminated glass, studies are made on an intermediate film having improved penetration resistance by laminating a plasticized polyvinyl acetal sheet with polycarbonate or poly(meth)acrylic acid ester.

However, as shown in the Comparative Examples described below (Comparative Examples 1 to 8) and also pointed out in Patent Document 5, migration of a plasticizer occurs when a common plasticizer like those described above is used even for a laminate consisting of a plasticized polyvinyl acetal sheet and polycarbonate or poly(meth)acrylic acid ester, yielding problems like a decrease in dynamic strength of polycarbonate or poly(meth)acrylic acid ester or an increase in haze.

Under the purpose of inhibiting migration of a plasticizer from a resin composition added with a plasticizer to another resin, a plasticizer with relatively high molecular weight, i.e. a polymer plasticizer, may be used. As a composition including a plasticizer with high molecular weight, an intermediate film of a laminated film consisting of polyvinyl acetal and poly(ε-caprolactone) (trade name: PLACCEL H5, manufactured by Daicel Chemical Industries, Ltd.), that is an intermediate film of a laminated glass using a composition which consists of polycaprolactone having average polymerization degree of 10 to 2,000 as a polymer of polyvinyl butyral and ε-caprolactone, is disclosed (for example, refer to Patent Document 6). However, since the polycaprolactone used therein is highly crystalline and has relatively high melting temperature (melting point: 60° C.), the polycaprolactone contained in the intermediate film is crystallized to cause phase separation or the intermediate film has white cloudiness when the composition is kept at room temperature for a long period of time. Further, since the polycaprolactone has high melting temperature and also high polymerization degree, the effect of plasticizing polyvinyl acetal is not sufficient, and therefore the intermediate film of a laminated glass has only insufficient flexibility.

A ceramic binder using a composition consisting of polyvinyl butyral and polycaprolactone is disclosed (for example, refer to Patent Document 7) and a ceramic binder consisting of polyvinyl butyral and carboxylic acid polyester is disclosed (for example, refer to Patent Document 8). However, it is not expected by the invention disclosed in Patent Document 7 to obtain the effect of plasticizing the polyvinyl acetal by polycaprolactone. It describes only the use of poly(ε-caprolactone) having polymerization degree of 60 to 800. In fact, since the polycaprolactone used in the invention is highly crystalline and has relatively high melting temperature (melting point: 60° C.), it has an insufficient plasticizing effect for polyvinyl acetal and the polycaprolactone contained in the intermediate film is crystallized to cause phase separation when the composition is kept at room temperature for a long period of time. Further, it is not expected in Patent Document 8 that the ceramic binder thereof has an effect of plasticizing the polyvinyl acetal by polyester and the polyester described in the document is not shown to have an effect of plasticizing the polyvinyl acetal.

Further, a mixture of polyvinyl acetal and carboxylic acid polyester having no polar group like a hydroxyl group and a carboxyl group at the molecular end (i.e. carboxylic acid polyester having completely blocked terminal), which can be obtained by a reaction between dicarboxylic acid, a monovalent carboxylic acid, and a compound selected from 1,2-propane diol, 1,3-butane diol, and 1,4-butane diol, is disclosed (For example, refer to Patent Document 9). However, as shown in the Comparative Examples described below (Comparative Examples 2, 3, 9 and 10), when the average molecular weight of carboxylic acid polyester having completely blocked terminal is high, compatibility with the polyvinyl acetal is poor and phase separation may occur over time. There is also a problem in that the plasticizing effect is not sufficient. On the other hand, when the average molecular weight of carboxylic acid polyester having completely blocked terminal is low, there is a problem in that the migration resistance of a component having low molecular weight that is contained in the corresponding carboxylic acid polyester having completely blocked terminal is insufficient.

CITATION LIST

Patent Documents

Patent Document 1: Japanese Patent Application Laid-Open (JP-A) No. 2007-091491
Patent Document 2: JP-A No. 2005-306326
Patent Document 3: Japanese Patent National Application Publication (Laid-Open) No. 2001-506198
Patent Document 4: JP-A No. 2007-136057
Patent Document 5: WO2007-029541
Patent Document 6: JP-A No. 1995-17745
Patent Document 7: JP-A No. 1996-259334

Patent Document 8: JP-A No. 2008-66556
Patent Document 9: Japanese Patent National Application Publication (Laid-Open) No. 2005-501156

DISCLOSURE OF THE INVENTION

Problem to be Solved by the Invention

The present invention is devised to solve the problems described above and object of the invention is to provide a plasticized polyvinyl acetal composition that is suitably used for an intermediate film of a laminated glass and other applications, specifically, the polyvinyl acetal composition being characterized in that in cases when a layer that is composed of the polyvinyl acetal composition and another resin layer such as a resin layer of a polycarbonate, a poly(meth)acrylic acid ester, or a styrene thermoplastic elastomer are laminated, the plasticizer does not migrate from the polyvinyl acetal layer, and a laminate using the same.

Means for Solving Problem

Above mentioned object is accomplished by a polyvinyl acetal composition comprising 100 parts by mass of a polyvinyl acetal and 0.5 to 100 parts by mass of an ester plasticizer or ether plasticizer that has a melting point of 30° C. or less and a hydroxyl value of 15 to 450 mgKOH/g, or a polyvinyl acetal composition comprising 100 parts by mass of a polyvinyl acetal and 0.5 to 100 parts by mass of an ester plasticizer or ether plasticizer that is amorphous and has a hydroxyl value of 15 to 450 mgKOH/g.

Effect of the Invention

According to the polyvinyl acetal composition of the invention, the ester plasticizer or ether plasticizer has excellent compatibility with polyvinyl acetal and also an effect of plasticizing the polyvinyl acetal, and therefore it is suitably used for applications like an intermediate film of a laminated glass which requires flexible polyvinyl acetal. Further, the compound contained in the ester plasticizer or the ether plasticizer has high compatibility with the polyvinyl acetal and does not easily migrate to other resin layers like a poly(meth) acrylic acid ester, a polycarbonate, a polyolefin, a styrene thermoplastic elastomer. As a result, a decrease in dynamic properties or an increase in haze does not occur in those resin layers, and therefore it is suitably used for applications in which the resin layer and a layer consisting of the polyvinyl acetal composition are directly laminated, in particular an application for an intermediate film of a laminated glass having high performance or an encapsulant of a solar cell.

BEST MODES FOR CARRYING OUT THE INVENTION

Figure 1:
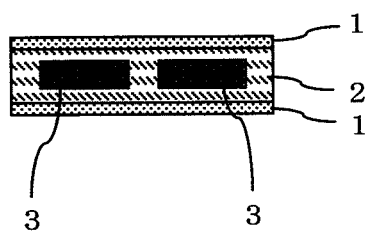
FIG. 1 is a schematic drawing which illustrates an exemplary solar cell module in which the sheet of the invention and crystal silicone are encapsulated.

The invention relates to a polyvinyl acetal composition which contains an ester plasticizer or ether plasticizer that has a melting point of 30° C. or less and a hydroxyl value of 15 to 450 mgKOH/g, or an ester plasticizer or ether plasticizer that is amorphous and has a hydroxyl value of 15 to 450 mgKOH/g, and a laminate obtained by laminating a layer A that is composed of the polyvinyl acetal composition (also referred to as composition A) and composition B which contains, as a main component, other resin which is different from the polyvinyl acetal. Examples of the ester plasticizer include the polyester and hydroxyl carboxylic acid ester compound described below and the examples of the ether plasticizer include the polyether compound described below.

First, the polyester used in the invention is explained. The polyester used in the invention has melting point of 30° C. or less, preferably 15° C. or less, and more preferably 0° C. or less. When the melting point is higher than 30° C., it is undesirable in that the polyester is crystallized, transparency of the polyvinyl acetal composition is lowered, and dynamic strength is changed when the polyvinyl acetal composition is used at the temperature of 30° C. or less. Further, the polyester used in the invention is amorphous. As used herein, the term "amorphous" means that no melting point is observed at the temperature of −20° C. or above. The polyester used in the invention is has a hydroxyl value of 15 to 450 mgKOH/g, preferably 30 to 360 mgKOH/g, and more preferably 45 to 280 mKOH/g. When the polyester has a certain hydroxyl value, the hydroxyl group contained in the polyester and polyvinyl acetal can have an interaction (i.e. hydrogen bond), and as a result, the polyvinyl acetal and polyester have an excellent compatibility and an excellent low migration property or no migration property of a polyester from the polyvinyl acetal composition to other resin can be obtained. When the hydroxyl value is less than 15 mgKOH/g, the compatibility, low migration property, or no migration property may not be obtained at sufficient level. On the other hand, when the hydroxyl value is higher than 450 mgKOH/g, moisture resistance of the polyvinyl acetal composition containing them may be deteriorated.

Examples of the type of the polyester used in the invention include a polyester containing a condensation polymer of polyvalent carboxylic acid and polyhydric alcohol (herein below, this polyester is referred to as "mutually copolymerized carboxylic acid polyester"), a polyester containing a hydroxyl carboxylic acid polymer (herein below, this composition may be referred to as a "hydroxyl carboxylic acid polyester"), and a polyester containing a condensation polymer of a carbonic acid compound and polyhydric alcohol (herein below, this polyester may be referred to as a "carbonate polyester").

The mutually copolymerized carboxylic acid polyester of the invention include a compound having at least one moiety which forms a carboxylic acid ester bond, in which a group derived from polyvalent carboxylic acid and a group derived from polyhydric alcohol are directly bonded to each other (herein below, it may be referred to as "mutual copolymers of polyvalent carboxylic acid and polyhydric alcohol"). As used herein, the term a "group derived from polyvalent carboxylic acid" means a group of a polyvalent carboxylic acid from which the —OH residue of the carboxyl group contained in the polyvalent carboxylic acid is excluded. Examples of the polyvalent carboxylic acid include a dicarboxylic acid represented by the following formula (1):

[Chemical Formula 1]

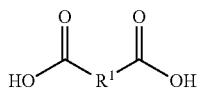

(1)

(herein, $R^1$ is absent or a divalent hydrocarbon group (for example, an aliphatic saturated hydrocarbon group (an alkylene group or the like), an aliphatic unsaturated hydrocarbon group, an alicyclic hydrocarbon group (a cycloalkylene group or the like), or a hydrocarbon group containing an aromatic ring (an arylene group or the like)). Examples of the group derived from polyvalent carboxylic acid include a group derived from carboxylic acid represented by the following formula (2):

[Chemical Formula 2]

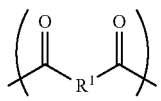

(2)

(herein, $R^1$ is absent or a divalent hydrocarbon group (for example, an aliphatic saturated hydrocarbon group (an alkylene group or the like), an aliphatic unsaturated hydrocarbon group, an alicyclic hydrocarbon group (a cycloalkylene group or the like), or a hydrocarbon group containing an aromatic ring (an arylene group or the like)). Further, the group derived from polyhydric alcohol indicates polyhydric alcohol from which the hydrogen atom of the hydroxyl group contained in the polyhydric alcohol is excluded. Examples of the polyhydric alcohol include the diol represented by the following formula (3):

[Chemical Formula 3]

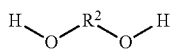

(3)

(herein, $R^2$ is a divalent hydrocarbon group (for example, an aliphatic saturated hydrocarbon group (an alkylene group or the like), an aliphatic unsaturated hydrocarbon group, an alicyclic hydrocarbon group (a cycloalkylene group or the like), or a hydrocarbon group containing an aromatic ring (an arylene group or the like)). Examples of the group derived from polyhydric alcohol include the group derived from diol represented by the following formula (4):

[Chemical Formula 4]

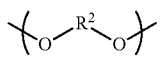

(4)

(herein, $R^2$ is a divalent hydrocarbon group (for example, an aliphatic saturated hydrocarbon group (an alkylene group or the like), an aliphatic unsaturated hydrocarbon group, an alicyclic hydrocarbon group (a cycloalkylene group or the like), or a hydrocarbon group containing an aromatic ring (an arylene group or the like)).

Further, the mutually copolymerized carboxylic acid polyester containing mutual copolymers of polyvalent carboxylic acid and polyhydric alcohol may also include a compound having at least one group derived from polyvalent carboxylic acid as a reacting material (polyvalent carboxylic acids) or a compound having at least one group derived from polyhydric alcohol as a reacting material (polyhydric alcohols-1). Most of those compounds are unreacted residuals of an esterification reaction or derivatives thereof.

Specific examples of the polyvalent carboxylic acids include polyvalent carboxylic acid, an alkali metal salt of polyvalent carboxylic acid, an alkali earth metal salt of polyvalent carboxylic acid, an ammonium salt of polyvalent carboxylic acid, and a carboxylic acid ester compound obtained by dehydration condensation of polyvalent carboxylic acid and monohydric alcohol. Specific examples of the polyhydric alcohols-1 include polyhydric alcohol and a carboxylic acid ester compound obtained by dehydration condensation of polyhydric alcohol and monovalent carboxylic acid.

The hydroxyl carboxylic acid polyester of the invention includes a compound having at least one moiety which forms a carboxylic acid ester by direct bond between two groups derived from hydroxyl carboxylic acid (herein below, it may be referred to as polymers of hydroxyl carboxylic acid). As used herein, the term a "group derived from hydroxyl carboxylic acid" indicates hydroxyl carboxylic acid from which the —OH residue of the carboxyl group and the hydrogen atom of the hydroxyl group contained in the hydroxyl carboxylic acid are excluded. Examples of the hydroxyl carboxylic acid include hydrocarboxylic acid represented by the following formula (5):

[Chemical Formula 5]

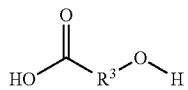

(5)

(herein, $R^3$ is a divalent hydrocarbon group (for example, an aliphatic saturated hydrocarbon group (an alkylene group or the like), an aliphatic unsaturated hydrocarbon group, an alicyclic hydrocarbon group (a cycloalkylene group or the like), or a hydrocarbon group containing an aromatic ring (an arylene group or the like)). Examples of the group derived from hydroxyl carboxylic acid include a group derived from hydrocarboxylic acid represented by the following formula (6):

[Chemical Formula 6]

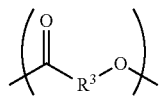

(6)

(herein, $R^3$ is a divalent hydrocarbon group (for example, an aliphatic saturated hydrocarbon group (an alkylene group or the like), an aliphatic unsaturated hydrocarbon group, an alicyclic hydrocarbon group (a cycloalkylene group or the like), or a hydrocarbon group containing an aromatic ring (an arylene group or the like)).

Further, the hydroxyl carboxylic acid polyester containing polymers of hydroxyl carboxylic acid may also include a compound having at least one group derived from hydroxyl carboxylic acid as a reacting material (hydroxyl carboxylic acids). Most of those compounds are unreacted residuals of an esterification reaction or derivatives thereof.

Specific examples of the hydroxyl carboxylic acids include hydroxyl carboxylic acid, an alkali metal salt of hydroxyl carboxylic acid, an alkali earth metal salt of hydroxyl carboxylic acid, an ammonium salt of hydroxyl carboxylic acid, a carboxylic acid ester compound obtained by dehydration condensation of hydroxyl group of hydroxyl carboxylic acid and monovalent carboxylic acid, a carboxylic acid ester compound obtained by dehydration condensation of carboxyl group of hydroxyl carboxylic acid and monohydric alcohol, and a lactone compound obtained by intramolecular dehydration condensation of carboxyl group and hydroxyl group of the hydroxyl carboxylic acid.

The carbonate polyester of the invention includes a compound having at least one moiety which forms a carbonic acid bond by direct bond between one group derived from carbonic acid (a carbonic acid from which two —OH moieties are excluded, i.e. a carbonyl group) and two groups derived from polyhydric alcohol, or one group derived from carbonic acid, one group derived from polyhydric alcohol, and one group derived from monohydric alcohol (herein below, referred to mutual copolymers of a carbonic acid compound and a polyhydric alcohol). As used herein, the term a "group derived from monohydric alcohol" indicates monohydric alcohol from which the hydrogen atom of the hydroxyl group contained in monohydric alcohol is excluded. Examples of the monohydric alcohol include a monohydric alcohol represented by the following formula (7):

[Chemical Formula 7]

(7)

(herein, R⁴ is a monovalent hydrocarbon group (for example, an aliphatic hydrocarbon group (a linear or branched alkyl group or alkenyl group or the like), an alicyclic hydrocarbon group (a cycloalkyl group, a cycloalkenyl group or the like), and a hydrocarbon group having an aromatic ring (a phenyl group, a biphenyl group, or the like)). Examples of the group derived from monohydric alcohol include a group derived from monohydric alcohol represented by the following formula (8):

[Chemical Formula 8]

(8)

(herein, R⁴ is a monovalent hydrocarbon group (for example, an aliphatic hydrocarbon group (a linear or branched alkyl group or alkenyl group or the like), an alicyclic hydrocarbon group (a cycloalkyl group, a cycloalkenyl group or the like), and a hydrocarbon group having an aromatic ring (a phenyl group, a biphenyl group, or the like)).

Further, the carbonate polyester containing the mutual copolymers of a carbonic acid compound and a polyhydric alcohol may also include a compound containing a carbonic acid bond by direct bond between one group derived from carbonic acid and two groups derived from monohydric alcohol, or one group derived from carbonic acid and two hydroxyl groups contained one group derived from the polyhydric alcohol, or a compound (polyhydric alcohols-2) having carbonates like an alkali metal salt of carbonic acid, an alkali earth metal salt of carbonic acid, and an ammonium salt of carbonic acid (herein below, referred to as carbonates) and at least one group derived from polyhydric alcohol as a reacting material. Most of those compounds are unreacted residuals of an esterification reaction or derivatives thereof. Examples of the polyhydric alcohols-2 are the same as those exemplified above for polyhydric alcohols-1.

When the polyester used in the invention is a mutually copolymerized carboxylic acid polyester, the mutual copolymers of polyvalent carboxylic acid and polyhydric alcohol contained in the mutually copolymerized carboxylic acid polyester is preferably 70% by mass or more, more preferably 90% by mass or more, and still more preferably 95% by mass or more. When the mutual copolymers of polyvalent carboxylic acid and polyhydric alcohol contained in the mutually copolymerized carboxylic acid polyester is less than 70% by mass, the effect of plasticizing polyvinyl acetal, that is inherent to the mutually copolymerized polyester used in the invention, or high compatibility with the polyvinyl acetal may not be exhibited. Further, preferably, each of the polyvalent carboxylic acids and polyhydric alcohols-1 contained in mutually copolymerized carboxylic acid polyester is 0.001 to 25% by mass and 0.01 to 30% by mass in total. More preferably, each of them is 0.001 to 9% by mass and 0.01 to 10% by mass in total. And still more preferably, each of them is 0.001 to 4% by mass and 0.01 to 5% by mass in total.

When the polyester used in the invention is a hydroxyl carboxylicacid polyester, the hydroxyl carboxylic acid polymers contained in the hydroxyl carboxylic acid polyester is preferably 80% by mass or more, more preferably 90% by mass or more, and still more preferably 95% by mass or more. When the hydroxyl carboxylic acid polymers contained in the hydroxyl carboxylic acid polyester is less than 80% by mass, the effect of plasticizing polyvinyl acetal, that is inherent to the hydroxyl carboxylic acid polyester used in the invention, or high compatibility with the polyvinyl acetal may not be exhibited. Further, preferably, the hydroxyl carboxylic acids contained in hydroxyl carboxylic acid polyester are 0.001 to 20% by mass, more preferably 0.001 to 10% by mass, and still more preferably 0.001 to 5% by mass.

When the polyester used in the invention is a carbonate polyester, the mutual copolymers of carbonic acid compound and polyhydric alcohol contained in the carbonate polyester is preferably 80% by mass or more, more preferably 90% by mass or more, and still more preferably 95% by mass or more. When the mutual copolymers of carbonic acid compound and polyhydric alcohol contained in the carbonate polyester is less than 80% by mass, the effect of plasticizing polyvinyl acetal, that is inherent to the carbonate polyester used in the invention, or high compatibility with the polyvinyl acetal may not be exhibited. Further, preferably, each of the polycarbonates and polyhydric alcohols-2 contained in carbonate polyester is 0.001 to 15% by mass and 0.01 to 20% by mass in total. More preferably, each of them is 0.001 to 9% by mass and 0.01 to 10% by mass in total. And still more preferably, each of them is 0.001 to 4% by mass and 0.005 to 5% by mass in total.

When the polyester used in the invention is a mutually copolymerized carboxylic acid polyester (i.e. condensation polymer of polyvalent carboxylic acid and polyhydric alcohol), the corresponding polyvalent carboxylic acid is, although not specifically limited, but it is preferably an aliphatic saturated polyvalent carboxylic acid having 4 to 12 carbon atoms, more preferably 5 to 11 carbon atoms, and still more preferably 6 to 10 carbon atoms. The corresponding polyvalent carboxylic acid may be either a single type or a combination of two or more types. Similarly, the corresponding polyhydric alcohol is, although not specifically limited, an aliphatic saturated polyhydric alcohol having 2 to 12 carbon atoms, preferably 3 to 11 carbon atoms, and more preferably 4 to 10 carbon atoms. The corresponding polyhydric alcohol may be either a single type or a combination of two or more types. Further, sum of the average carbon atom number of the polyvalent carboxylic acid and the average carbon atom number of the polyhydric alcohol is, although not specifically limited, preferably 8 to 20, more preferably 8 to 16, and still more preferably 8 to 14. When the sum of the average carbon atom number of the polyvalent carboxylic acid and the average carbon atom number of the polyhydric alcohol is smaller than 8 or larger than 20, compatibility between the mutually copolymerized carboxylic acid polyester and the polyvinyl acetal may be deteriorated or the plasticizing effect may become insufficient. As used herein, the term "average carbon atom number of the polyvalent carboxylic acid" can be obtained by dividing the sum of the number of all carbon atoms in the polyvalent carboxylic acid molecules used with the number of molecules of the polyvalent carboxylic acid used. Similarly, the term "average carbon atom number of the polyhydric alcohol" can be obtained by dividing the sum of the number of all carbon atoms in the polyhydric alcohol molecules used with the number of molecules of the polyhydric alcohol used.

As for the polyvalent carboxylic acid and polyhydric alcohol that are used as a reacting material for producing the mutually copolymerized carboxylic acid polyester, a conventionally known polyvalent carboxylic acid and polyhydric alcohol may be used unless it is not against the main spirit of the invention. Specific examples of the polyvalent carboxylic acid include aliphatic saturated carboxylic acid like oxalic acid, malonic acid, succinic acid, adipic acid, suberic acid, sebacic acid, dodecane diacid, 1,2-cyclohexane dicarboxylic acid, 1,3-cyclohexane carboxylic acid, and 1,4-cyclohexane carboxylic acid; aliphatic unsaturated carboxylic acid like maleic acid, fumaric acid, itaconic acid, and aconitic acid; aliphatic carboxylic acid having valency of three or more like 1,3,5-pentane tricarboxylic acid, 1,3,5-cyclohexane tricarboxylic acid, and 1,2,4-cyclohexane tricarboxylic acid; carboxylic acid containing an aromatic ring with valency of two or more like phthalic acid, isophthalic acid, terephthalic acid, trimellitic acid, 1,2-naphthalene dicarboxylic acid, 1,3-naphthalene dicarboxylic acid, 1,4-naphthalene dicarboxylic acid, 1,5-naphthalene dicarboxylic acid, 2,6-naphthalene dicarboxylic acid, and 1,4-phenylene diacetic acid, but not limited thereto. Further, unless it is not against the main spirit of the invention, polyvalent carboxylic acid which is obtained by substituting the hydrogen atom bonded to any carbon atom of the above polyvalent carboxylic acid with a hydrocarbon group or an alkoxy group can be also used. Further, a compound obtained by substituting the carboxyl group of the polyvalent carboxylic acid above with an acid chloride group, for example adipic acid chloride, a polyvalent carboxylic acid anhydride obtained by dehydration condensation between two carboxyl groups contained in the polyvalent carboxylic acid, for example succinic anhydride, and a compound obtained by dehydration condensation of the carboxyl group in the polyvalent carboxylic acid and monohydric alcohol, for example diethyl adipate, can be also suitably used. Of these, aliphatic saturated di carboxylic acid having 4 to 12 carbon atoms, preferably aliphatic saturated dicarboxylic acid having 5 to 11 carbon atoms, and more preferably aliphatic saturated dicarboxylic acid having 6 to 10 carbon atoms are desirable in that the compatibility between the polyester obtained and polyvinyl acetal, the effect of plasticizing polyvinyl acetal, and the weatherability are excellent and those polyvalent carboxylic acids are easily obtainable.

Specific examples of the polyhydric alcohol include aliphatic saturated diol like ethylene glycol, diethylene glycol, triethylene glycol, tetraethylene glycol, 1,2-propylene glycol, 1,3-propylene glycol, 1,2-butylene glycol, 1,3-butylene glycol, 1,4-butylene glycol, 1,2-pentane diol, 1,5-pentane diol, 2,4-pentane diol, 1,2-hexane diol, 1,6-hexane diol, 3-methyl-1,5-pentane diol, 3-methyl-2,4-pentane diol, 1,2-heptane diol, 1,7-heptane diol, 1,2-octane diol, 1,8-octane diol, 1,2-nonane diol, 1,9-nonane diol, 2-methyl-1,8-octane diol, 1,2-decane diol, 1,10-decane diol, 1,2-dodecane diol, 1,12-dodecane diol, 1,2-cyclohexane diol, 1,3-cyclohexane diol, 1,4-cyclohexane diol, 1,2-cyclohexane dimethanol, 1,3-cyclohexane dimethanol, and 1,4-cyclohexane dimethanol; aliphatic unsaturated diol like 2-butylene-1,4-diol and 2-methyl-2-butylene-1,4-diol; aliphatic alcohol having a valency of three or more like glycerin, pentaerythritol, dipentaerythritol, trimethylol ethane, trimethylol propane, and 1,3,5-cyclohexane triol; alcohol with an aromatic ring having a valency of two or more like 1,2-dihydroxybenzene, 1,3-dihydroxybenzene, 1,4-dihydroxybenzene, bisphenol A, bisphenol F, 4,4'-biphenol, bis(4-hydroxyphenyl)sulfone, bis(4-hydroxyphenyl)ether, 1,2-bis(hydroxymethyl)benzene, 1,3-bis(hydroxymethyl)benzene, and 1,4-bis(hydroxymethyl)benzene, but not limited thereto. Further, unless it is not against the main spirit of the invention, polyvalent alcohol which is obtained by substituting the hydrogen atom bonded to any carbon atom of the above polyhydric alcohol with a functional group like a hydrocarbon group or an alkoxy group can be also used. Of these, aliphatic saturated diol having 2 to 12 carbon atoms, preferably aliphatic saturated diol having 3 to 11 carbon atoms, and more preferably aliphatic saturated diol having 4 to 10 carbon atoms are desirable in that the compatibility between the polyester obtained and polyvinyl acetal, the effect of plasticizing polyvinyl acetal, and the weatherability are excellent and those aliphatic saturated diols are easily obtainable.

When the polyester used in the invention is a hydroxyl carboxylicacid polyester (i.e. a polymer of hydroxyl carboxylic acid), the corresponding hydroxyl carboxylic acid is, although not specifically limited, an aliphatic hydroxyl carboxylic acid having 2 to 10 carbon atoms, preferably 3 to 9 carbon atoms, and more preferably 4 to 8 carbon atoms. When the carbon atom number of the aliphatic hydroxyl carboxylic acid is larger than 10, compatibility between the polyester and the polyvinyl acetal may be deteriorated or the plasticizing effect may become insufficient. The corresponding hydroxyl carboxylic acid may be either a single type or a combination of two or more types. Further, the average carbon atom number of the corresponding hydroxyl carboxylic acid is, although not specifically limited, preferably 4 to 8, more preferably 4.5 to 7.5, and still more preferably 5 to 7. As used herein, the term "average carbon atom number of the hydroxyl carboxylic acid" can be obtained by dividing the sum of the number of all carbon atoms in the hydroxyl carboxylic acid molecules used with the number of molecules of the hydroxyl carboxylic acid used.

As for the hydroxyl carboxylic acid that is used as a raw material for hydroxyl carboxylic acid polyester, a conventionally known hydroxyl carboxylic acid may be used unless it is not against the main spirit of the invention. Further, a lactone compound obtained by intramolecular dehydration condensation between the carboxyl group and hydroxyl group of the hydroxyl carboxylic acid may be also used instead of the hydroxyl carboxylic acid. Specific examples of the hydroxyl carboxylicacid include aliphatic hydroxyl carboxylic acid like glycolic acid, lactic acid, 2-hydroxybutyric acid, 3-hydroxybutyric acid, 4-hydroxybutyric acid, 6-hydroxyhexanoic acid, 8-hydroxyhexanoic acid, 10-hydroxydecanoic acid, and 12-hydroxydodecanoic acid, and; hydroxyl carboxylic acid having an aromatic ring like 4-hydroxybenzoic acid, and 4-(2-hydroxyethyl)benzoic acid, but not limited thereto. Further, unless it is not against the main spirit of the invention, hydroxyl carboxylic acid which is obtained by substituting the hydrogen atom bonded to any carbon atom of the above hydroxyl carboxylic acid with a functional group like a hydrocarbon group or an alkoxy group can be also used. Of these, aliphatic hydroxyl carboxylic acid having 2 to 10 carbon atoms, preferably aliphatic hydroxyl carboxylic acid having 3 to 9 carbon atoms, and more preferably aliphatic hydroxyl carboxylic acid having 4 to 8 carbon atoms are desirable.

Further, specific examples of the lactone compound include an aliphatic lactone compound like γ-butyrolactone, γ-valerolactone, δ-valerolactone, β-methyl-δ-valerolactone, δ-hexanolactone, ε-caprolactone, and lactide, and a lactone compound having an aromatic ring, but not limited thereto. Further, unless it is not against the main spirit of the invention, a lactone compound which is obtained by substituting the hydrogen atom bonded to any carbon atom of the above lactone compound with a functional group like a hydrocarbon group or an alkoxy group can be also used. Of these, an aliphatic lactone compound having 2 to 10 carbon atoms, preferably an aliphatic lactone compound having 3 to 9 carbon atoms, and more preferably an aliphatic lactone compound having 4 to 8 carbon atoms are desirable. When the carbon atom number of the aliphatic lactone compound is larger than 10, the compatibility of the polyester with polyvinyl acetal or the plasticizing effect may be deteriorated.

When the polyester used in the invention is a carbonate polyester (i.e. a condensation polymer of carbonic acid compound and polyhydric alcohol), the corresponding polyhydric alcohol is, although not specifically limited, an aliphatic polyhydric alcohol having 2 to 12 carbon atoms, preferably 3 to 11 carbon atoms, and more preferably 4 to 10 carbon atoms. The corresponding polyhydric alcohol may be either a single type or a combination of two or more types. Further, the average carbon atom number of the corresponding polyhydric alcohol is, although not specifically limited, preferably 4 to 10, more preferably 4 to 9, and still more preferably 4 to 8. When the carbon atom number of the polyhydric alcohol is smaller than 2 or larger than 12, compatibility of the polyester with polyvinyl acetal may be deteriorated or the plasticizing effect may be lowered.

As for the polyhydric alcohol that is used as a raw material for carbonate polyester, a conventionally known polyhydric alcohol may be used unless it is not against the main spirit of the invention. Specifically, the polyhydric alcohol exemplified above for the mutually copolymerized carboxylic acid polyester can be also used. Further, unless it is not against the spirit of the invention, polyhydric alcohol which is obtained by substituting the hydrogen atom bonded to any carbon atom of the above polyhydric alcohol with a functional group like a hydrocarbon group or an alkoxy group can be also used. Of these, aliphatic saturated diol having 2 to 12 carbon atoms, preferably aliphatic saturated diol having 3 to 11 carbon atoms, and more preferably aliphatic saturated diol having 4 to 10 carbon atoms are preferable in that the compatibility of the polyester with polyvinyl acetal and the effect of plasticizing polyvinyl acetal are excellent, and the polyhydric alcohol can be easily obtained.

Examples of the carbonic acid compound used as a raw material for carbonate polyester include, although not specifically limited, a conventionally known carbonate ester like dimethyl carbonate, diethyl carbonate, diphenyl carbonate, and ethylene carbonate, and phosgene (herein below, they may be collectively referred to as carbonate esters).

When the polyester used in the invention is mutually copolymerized carboxylic acid polyester, hydroxyl carboxylic acid polyester, or carbonate polyester, by introducing an irregularity to a linear molecular chain included in those polyesters, it is possible to have the polyester with melting point of 30° C. or less or amorphous polyester. As for the method of introducing an irregularity, there is a method of using two or more types of polyvalent carboxylic acid, polyhydric alcohol, and polyhydric hydroxyl carboxylic acid having different chain length that are used as a raw material for the polyester, or a method of using polyvalent carboxylic acid, polyhydric alcohol, polyvalent hydroxyl carboxylic acid, or other compounds like polyvalent carboxylicacid having a side chain, polyhydric alcohol having a side chain, polyvalent hydroxyl carboxylic acid having a side chain, other compounds having a side chain. The degree of irregularity to be introduced can be suitably selected depending on purpose of use.

As having a certain hydroxyl value, the polyester used in the invention can have a strong interaction (hydrogen bond) with polyvinyl acetal, and therefore has excellent compatibility with polyvinyl acetal. Compared to the polyester with a strong interaction with polyvinyl acetal as having a certain hydroxyl value, other resins having a functional group with relatively low polarity like a polyolefin resin including polyethylene, polypropylene, polystyrene, a styrene-butadiene block copolymer, and a hydrogenated molecule thereof, an aromatic polycarbonate resin, a poly(meth)acrylic acid ester resin, an ethylene-vinyl acetate copolymer, and an ethylene-(meth)acrylic acid ester copolymer have a mild to weak interaction, or almost no interaction. Thus, when the polyvinyl acetal composition of the invention is in direct contact with a composition consisting of the resin above, the polyester does not migrate or hardly migrates. As such, when a sheet containing the composition of the invention is laminated with a sheet containing the composition which consists of the above resin and used, it is particularly preferable as an intermediate film of a laminated film with high performance.

In the polyvinyl acetal composition of the invention, a polyester having a certain hydroxyl value and a certain melting point (or amorphous) is used. In this regard, to improve the compatibility of the polyvinyl acetal with polyester and low migration property of the polyester, it is preferable that a compound included in the polyester has at least one, or more preferably two or more groups selected from a hydroxyl group, a carboxyl group, and a carboxylate group (herein below, they are collectively referred to as a polar functional group) are contained per molecule (herein below, such polyester is referred to as a polyester having polar functional group). Further, it is preferable that, in the compound included in the polyester, at least one, or more preferably two or more hydroxyl groups are contained per molecule (herein below, such polyester is referred to as a hydroxylated polyester). Herein, the carboxylate group is a carboxyl group of which hydrogen atom is substituted with a group selected from an alkali metal, an alkali earth metal, and —$NR_4$ group (R represents a hydrogen atom or a hydrocarbon group having 1 to 10 carbon atoms), and a compound having a polar functional group, in particular a hydroxyl group has high compatibility with polyvinyl acetal and has low migration property for a relatively less polar resin like polycarbonate and a styrene thermoplastic elastomer, and thus it is preferable to use a polyester consisting of those compounds.

When the polyester used in the invention is a mutually copolymerized polyester, specific examples of the polyester having a polar functional group include a mutual copolymer of polyvalent carboxylic acid and polyhydric alcohol and a compound in which polyvalent carboxylic acids and polyhydric alcohols-1 have at least one polar functional group per molecule. Further, when the polyester used in the invention is a hydroxyl carboxylic acid polyester, polymers of hydroxyl carboxylic acid and a compound in which hydroxyl carboxylic acids have at least one polar functional group per molecule can be used. Further, when the polyester used in the invention is a carbonate polyester, mutual copolymers of carbonic acid compound and polyhydric alcohol, and a compound in which carbonates and polyhydric alcohols-2 have at least one polar functional group per molecule can be used. The polyester having a polar group, in particular a hydroxylated polyester having a hydroxyl group as a polar functional group can be produced according to a conventionally known method as described below.

The hydroxyl value of the polyvinyl acetal composition of the invention is, although not specifically limited, preferably 10 mgKOH/g or less, more preferably 5 mgKOH/g or less, and still more preferably 2 mgKOH/g or less. When the acid value satisfies the above range, the polyester and polyvinyl acetal contained in the polyvinyl acetal composition do not easily decompose (i.e. hydrolysis or the like), and therefore it is preferable from the viewpoint of durability during extended time of use. To adjust the acid value of the polyvinyl acetal composition of the invention to be within the above range, it is preferable to control (i.e. to lower) in advance the acid value of the polyvinyl acetal resin used in the polyvinyl acetal composition of the invention, and also to control (i.e. to lower) in advance the acid value of the polyester contained in the polyvinyl acetal composition of the invention.

The polyester used in the invention can be produced according to a conventionally known method. For example, when the polyester of the invention is a mutually copolymerized carboxylic acid polyester, polyvalent carboxylic acid and polyhydric alcohol can be mixed in an organic solvent, if necessary, added with monohydric carboxylic acid, monohydric alcohol, and an appropriate amount of catalyst, if necessary, and heated for dehydration condensation while water or other compounds produced are removed.

Further, when the polyester used in the invention is hydroxyl carboxylic acid polyester, hydroxyl carboxylic acid or a corresponding lactone compound is dissolved in an organic solvent, if necessary, added with monohydric or polyhydric alcohol, and a catalyst, if necessary, and heated while removing water (when hydroxyl carboxylic acid is used) or other impurities for dehydration condensation (when hydroxyl carboxylic acid is used) or ring opening reaction (when a lactone compound is used).

Further, when the polyester of the invention is carbonate polyester, carbonic acid esters and polyhydric alcohol are dissolved in an organic solvent, if necessary, added with monohydric alcohol, and an appropriate amount of catalyst, if necessary, and heated for condensation while removing compounds produced (alcohol produced by ester exchange reaction between carbonic acid esters and polyhydric alcohol or monohydric alcohol ester, or hydrogen chloride produced by substitution reaction with phosgene).

When an organic solvent is used for the method of producing a polyester described above, the type and amount of the organic solvent is not specifically limited, and if it is not against the main spirit of the invention, and it can be suitably selected depending on polyvalent carboxylic acid, polyhydric alcohol, carbonic acid esters, and other compounds, and also reaction temperature or the like. Specific examples of the organic solvent include an aliphatic hydrocarbon compound like pentane, hexane, heptane, octane, and cyclohexane, an aromatic hydrocarbon like benzene, toluene, and xylene, a ketone compound like 2-butanone, dibutyl ketone, and cyclohexanone, an ether compound like diethyl ether, dibutyl ether, and 1,4-dioxane, dimethyl sulfoxide, and chloroform.

When a catalyst is used for the method of producing a polyester described above, the type and amount of the catalyst is not specifically limited, and if it is not against the main spirit of the invention, and it can be suitably selected depending on polyvalent carboxylic acid, polyhydric alcohol, and other compounds. Specific examples of the catalyst include inorganic acid like hydrochloric acid, sulfuric acid, nitric acid, and phosphoric acid, an organic acid like trifluoroacetic acid and para toluene sulfonic acid, and a Lewis acid including a titan compound like titanic acid, tetraalkoxy titan, and titan tetracarboxylate and a tin compound and also inorganic base like sodium hydroxide and potassium hydroxide, and an organic base like triethylamine, pyridine, 1,8-diazabicyclo[5,4,0]-7-undecene, and sodium acetate. The amount thereof is, compared to the total mass of the compound used as a raw material for the polyester, preferably 0.1 to 10,000 ppm, more preferably 0.5 to 1,000 ppm, and still more preferably 1 to 200 ppm. When the addition amount of the catalyst is less than 0.1 ppm, a sufficient effect may not be obtained. On the other hand, when it is more than 10000 ppm, a distinguishable effect cannot be obtained.

As for the method of producing a polyester, the reaction temperature is, although not specifically limited, preferably 100 to 250° C., and more preferably 150 to 230° C.

When the polyester used in the invention is a mutually copolymerized carboxylic acid polyester, ratio of the polyvalent carboxylic acid and polyhydric alcohol used for producing the mutually copolymerized carboxylic acid polyester is not specifically limited. However, to adjust the hydroxyl value of mutually copolymerized carboxylic acid polyester to 15 to 450 mgKOH/g, to lower the acid value of the polyvinyl acetal composition of the invention as much as possible, preferably to 10 mgKOH/g or less, and to have a hydroxylated polyester as a polyester, the polyhydric alcohol is used in slight excess amount compared to the polyvalent carboxylic acid, and it is preferably obtained by further performing the reaction according to the method described below. Specifically, it is preferable to use 0.5 to 30 molar % excess, and preferably 1 to 15 molar % excess of the polyhydric alcohol over the polyvalent carboxylic acid. Further, it is desirable to continue the reaction until the acid value of the polyester contained in the reaction solution is 10 mgKOH/g or less, preferably 5 mgKOH/g or less, and more preferably 2 mgKOH/g or less. By using a slight excess amount of the polyhydric alcohol compared to the polyvalent carboxylic acid and continuing the reaction until the acid value of the polyester contained in the reaction solution is the same or less than pre-determined value, a hydroxylated polyester having a terminal hydroxyl group can be obtained as a result of polycondensation.

When the polyester used in the invention is a hydroxyl carboxylicacid polyester, the reagent used for producing the hydroxyl carboxylic acid polyester is not specifically limited. However, to adjust the hydroxyl value of the obtained hydroxyl carboxylic acid polyester to 15 to 450 mgKOH/g, to lower the acid value of the polyvinyl acetal composition of the invention as much as possible, preferably to 10 mgKOH/g, and to obtain a hydroxylated polyester, monohydric alcohol and/or polyhydric alcohol is added with hydroxyl carboxylic acid or lactone compound and it is preferably obtained by further performing the reaction according to the method described below. Specifically, it is preferable to add 3 to 50 mol %, more preferably 5 to 35 mol % of the monohydric alcohol and/or polyhydric alcohol compared to the hydroxyl carboxylic acid or lactone compound. Further, when a hydro- carboxylic acid is used as a raw material, it is desirable to continue the reaction until the acid value of the polyester contained in the reaction solution is 10 mgKOH/g or less, preferably 5 mgKOH/g or less, and more preferably 2 mgKOH/g or less. Further, when a lactone compound is used as a raw material, it is preferable that the reaction is performed until the desired polymerization degree is obtained and the remaining lactone compound is removed under reduced pressure. By adding the monohydric alcohol and/or polyhydric alcohol with the hydroxyl carboxylic acid or lactone compound and continuing the reaction until the acid value of the polyester contained in the reaction solution is the same or less than pre-determined value (when hydroxyl carboxylic acid is used as a raw material) or removing the residual lactone compound (when a lactone compound is used as a raw material), a hydroxylated polyester having a terminal hydroxyl group can be obtained by polymerization.

When the polyester used in the invention is a carbonate polyester, the reagent used for producing the carbonate polyester is not specifically limited. However, to adjust the hydroxyl value of the carbonate polyester to 15 to 450 mgKOH/g, to lower the acid value of the polyvinyl acetal composition of the invention as much as possible, preferably to 10 mgKOH/g, and to obtain a hydroxylated polyester, the polyhydric alcohol is used in an slight excess amount compared to the carbonic acid esters and it is obtained by further performing the reaction according to the method described below. Specifically, it is preferable to add 0.5 to 30 mol % excess, and more preferably 1 to 15 mol % excess of the polyhydric alcohol compared to the carbonic acid esters. Further, it is desirable to continue the reaction until the desired polymerization degree is obtained and the remaining carbonic acid esters are removed under reduced pressure. By using the polyhydric alcohol in a slight excess amount compared to the carbonic acid ester and removing the remaining carbonic acid ester, a hydroxylated polyester having a terminal hydroxyl group can be obtained as a result of polycondensation.

The number average molecular weight of the polyester used in the invention is, although not specifically limited, 200 to 5,000, preferably 250 to 3,000, and more preferably 300 to 1,500 in terms of the number average molecular weight based one GPC (gel permeation chromatography) analysis of the components contained in the polyester. When the number average molecular weight based on GPC analysis is within this range, favorable compatibility of the polyester with polyvinyl acetal and the effect of plasticizing polyvinyl acetal and polyester can be obtained and the migration of polyester to other resin layers is low.

When the polyester used in the invention is a hydroxylated polyester, the number average molecular weight based on the hydroxyl value of the hydroxylated polyester is preferably 200 to 2,500, more preferably 200 to 1,200, and still more preferably 200 to 800. When the number average molecular weight based on hydroxyl value of the hydroxylated polyester is within this range, favorable compatibility of the polyester with polyvinyl acetal and the effect of plasticizing polyvinyl acetal and polyester can be obtained and the migration of polyester to other resin layers is low. As described herein, the number average molecular weight based on the hydroxyl value of the hydroxylated polyester is a value calculated from the following equation (1) by using the number of hydroxyl group per compound contained in the polyester and hydroxyl value (mgKOH/g) of the hydroxylated polyester.

[Formula 1]

$$\text{(Number average molecular weight based on hydroxyl value)} = 1{,}000 \times \text{(Number of hydroxyl group per compound contained in the polyester)}/\text{(Hydroxyl value of polyester)} \times (1/56)] \quad (1)$$

Next, the hydroxyl carboxylic acid ester compound used in the invention is explained. The hydroxylcarboxylic acid ester compound used in the invention has hydroxyl value of 15 to 450 mgKOH/g, preferably 15 to 350 mgKOH/g, and more preferably 15 to 250 mgKOH/g. When the hydroxyl value of the hydroxyl carboxylic acid ester compound used in the invention is within this range, excellent compatibility with polyvinyl acetal and excellent plasticizing effect can be obtained and the migration to the hydrocarbon-based polymer can be lowered, and therefore preferable.

The hydroxyl carboxylic acid ester compound used in the invention can be any one of solid and liquid. However, a compound having melting point of 30° C. or less, preferably 15° C. or less, and more preferably 0° C. or less is desirable. By using the hydroxyl carboxylic acid ester compound having the melting point within the range above, a polyvinyl acetal composition with excellent cold resistance can be obtained.

Alternatively, the hydroxyl carboxylic acid ester compound used in the invention is amorphous. As used herein, the term "amorphous" indicates non-crystallinity which exhibits no melting point at the temperature of −20° C. or above. By using the hydroxyl carboxylic acid ester compound, a polyvinyl acetal composition with excellent cold resistance can be obtained.

The hydroxyl carboxylic acid ester compound of the invention may be used either singly or in combination of two or more. As used herein, the term "hydroxyl carboxylic acid ester compound" is not specifically limited if it is a compound produced by dehydration esterification between the carboxyl group contained in the hydroxyl carboxylic acid and the hydroxyl group contained in a monohydric or polyhydric alcohol.

The hydroxyl carboxylic acid of the invention represents a compound having at least one hydroxyl group and at least one carboxyl group in the molecule and specific examples thereof include aliphatic saturated hydroxyl carboxylic acid like glycolic acid, lactic acid, tartronic acid, glyceric acid, 2-hydroxybutyric acid, 3-hydroxybutyric acid, 4-hydroxybutyric acid, 6-hydroxyhexanoic acid, malic acid, tartaric acid, citric acid, isocitric acid, and 12-hydroxystearic acid; aliphatic unsaturated hydroxyl carboxylic acid like 2-hydroxycrotonic acid and ricinoleic acid, and; hydroxyl carboxylic acid containing an aromatic ring like salicylic acid, gallic acid, and mandellic acid. Of these, from the viewpoint of easy obtainment of a hydroxyl carboxylic acid composition which is amorphous or has low melting point, aliphatic saturated hydroxyl carboxylic acid and aliphatic unsaturated hydroxyl carboxylicacid, in particular ricinoleic acid, are preferable.

The monohydric alcohol as a raw material of the hydroxyl carboxylic acid ester compound is not specifically limited and conventionally known monohydric alcohol can be used. Examples thereof include monohydric aliphatic alcohol like methanol, ethanol, 1-propanol, 2-propanol, 1-butanol, 2-butanol, 2-methyl-2-propanol, 1-pentanol, 1-hexanol, 2-ethyl-1-butanol, cyclohexanol, 1-heptanol, 1-octanol, 2-ethyl-1-hexanol, 1-nonanol, 1-decanol, 1-undecanol, 1-dodecanol, 1-hexadecanol, allyl alcohol, 3-butylen-1-ol, and; monohydric alcohol having an aromatic ring like phenol, and benzyl alcohol, but not limited thereto. As for the hydroxyl carboxylic acid ester compound used in the invention, an ester compound between monohydric aliphatic alcohol having 1 to 20 carbon atoms and hydroxyl carboxylic acid is preferable from the viewpoint of compatibility with polyvinyl acetal and the plasticizing effect.

The polyhydric alcohol as a raw material of the hydroxyl carboxylic acid ester compound is not specifically limited and conventionally known polyhydric alcohol can be used. Examples thereof include divalent aliphatic alcohol like ethylene glycol, diethylene glycol, triethylene glycol, tetraethylene glycol, 1,2-propylene glycol, 1,3-propylene glycol, 1,2-butylene glycol, 1,3-butylene glycol, 1,4-butylene glycol, 1,2-pentane diol, 1,5-pentane diol, 2,4-pentane diol, 1,2-hexane diol, 1,6-hexane diol, 3-methyl-1,5-pentane diol, 3-methyl-2,4-pentane diol, 1,2-heptane diol, 1,7-heptane diol, 1,2-octane diol, 1,8-octane diol, 1,2-nonane diol, 1,9-nonane diol, 2-methyl-1,8-octane diol, 1,2-decane diol, 1,10-decane diol, 1,2-dodecane diol, 1,12-dodecane diol, 1,2-cyclohexane diol, 1,3-cyclohexane diol, 1,4-cyclohexane diol, 1,2-cyclohexanedimethanol, 1,3-cyclohexanedimethanol, 1,4-cyclohexanedimethanol, 2-butylene-1,4-diol, and 2-methyl-2-butylene-1,4-diol; aliphatic alcohol having a valency of three or more like glycerin, pentaerythritol, dipentaerythritol, 1,1,1-trimethylol ethane, 1,1,1-trimethylol propane, and 1,3,5-cyclohexane triol, and; aromatic ring-containing alcohol having a valency of two or more like 1,2-dihydroxybenzene, 1,3-dihydroxybenzene, 1,4-dihydroxybenzene, bisphenol A, bisphenol F, 4,4'-biphenol, bis(4-hydroxyphenyl) sulfone, bis(4-hydroxyphenyl)ether, 1,2-bis(hydroxymethyl)benzene, 1,3-bis(hydroxymethyl)benzene, and 1,4-bis(hydroxymethyl)benzene, but not limited thereto. As for the hydroxyl carboxylic acid ester compound used in the invention, an ester compound between polyhydric aliphatic alcohol having 2 to 20 carbon atoms and hydroxyl carboxylic acid is preferable from the viewpoint of compatibility with polyvinyl acetal and the plasticizing effect as well as low migration of the corresponding hydroxyl carboxylic acid ester compound to a layer B.

Specific examples of the hydroxyl carboxylic acid ester compound used in the invention include monohydric alcohol ester of hydroxyl carboxylic acid like methyl ricinoleic acid, ethyl ricinoleic acid, butyl ricinoleic acid, methyl 6-hydroxyhexanoic acid, ethyl 6-hydroxyhexanoic acid, and butyl 6-hydroxyhexanoic acid; polyhydric alcohol ester of hydroxyl carboxylic acid like ethylene glycol di(6-hydroxyhexanoic acid)ester, diethylene glycol di(6-hydroxyhexanoic acid)ester, triethylene glycol di(6-hydroxyhexanoic acid)ester, 3-methyl-1,5-pentane diol di(6-hydroxyhexanoic acid)ester, 3-methyl-1,5-pentane diol di(2-hydroxybutyric acid)ester, 3-methyl-1,5-pentane diol di(3-hydroxybutyric acid)ester, 3-methyl-1,5-pentane diol di(4-hydroxybutyric acid)ester, triethylene glycol di(2-hydroxybutyric acid)ester, glycerin tri(ricinoleic acid)ester, di(1-(2-ethylhexyl)) L-tartaric acid, castor oil, and a polyhydric alcohol ester compound of a hydroxyl carboxylic acid in which a number of k groups derived from hydroxyl carboxylic acid are replaced with a group derived from carboxylic acid not containing hydroxyl group or with a hydrogen atom, and those hydroxyl carboxylic acid esters that are commercially available can be also used.

Herein, k represents a natural number of 1 or more but the same or less than (valency of polyhydric alcohol-1). Further, the group derived from hydroxyl carboxylic acid represents a carboxyl group of hydroxyl carboxylic acid from which —OH residue is removed. The group derived from carboxylic acid containing no hydroxyl group, the group derived from carboxylic acid having no hydroxyl group which represents a carboxyl group of carboxylic acid having no hydroxyl group from which —OH residue is removed represents a carboxyl group of carboxylic acid containing no hydroxyl group from which —OH residue is removed. Further, the carboxylic acid containing no hydroxyl group represents a carboxylic acid which does not contain any hydroxyl group in the molecule (except —OH moiety contained in the carboxyl group). Specific examples thereof include acetic acid, propionic acid, butyric acid, 2-ethylbutyric acid, hexanoic acid, 2-ethyl hexanoic acid, decanoic acid, lauric acid, palmitic acid, stearic acid, oleic acid, linoleic acid, and linolenic acid.

The use amount of the hydroxyl carboxylic acid ester compound is, although not specifically limited, 0.5 to 100 parts by mass, preferably 5 to 100 parts by mass, more preferably 10 to 80 parts by mass, and still more preferably 20 to 60 parts by mass compared to 100 parts by weight of the polyvinyl acetal contained in the polyvinyl acetal composition. When the use amount of the hydroxyl carboxylic acid ester compound is less than 5 parts by mass, the effect of plasticizing polyvinyl acetal is insufficient, and thus unfavorable flexibility may be obtained when the laminate of the invention is used for an intermediate film of a laminated glass. On the other hand, when it is more than 100 parts by mass, dynamic strength of the layer B that is composed of a composition B containing the hydrocarbon-based polymer may be lowered or haze of the layer may be increased.

Next, the polyether compound used in the invention is explained. Most preferably, the polyether compound of the invention has hydroxyl value of 15 to 450 mgKOH/g. However, it is also possible to adjust it to 15 to 1000 mgKOH/g or 15 to 600 mgKOH/g. When the hydroxyl value of the polyether compound used in the invention is within this range, excellent compatibility with polyvinyl acetal and excellent plasticizing effect can be obtained and the migration to the hydrocarbon-based polymer can be lowered, and therefore preferable.

The polyether compound used in the invention can be any one of solid and liquid. However, a compound having melting point of 30° C. or less, preferably 15° C. or less, and more preferably 0° C. or less is desirable. By using the polyether compound having the melting point within the range above, a polyvinyl acetal composition with excellent cold resistance can be obtained.

Alternatively, the polyether compound used in the invention is amorphous. As used herein, the term "amorphous" indicates non-crystallinity which exhibits no melting point at the temperature of −20° C. or above. By using the polyether compound, a polyvinyl acetal composition with excellent cold resistance can be obtained.

The polyether compound that is used in the invention indicates a compound having a chemical structure in which at least two molecules (polymerization degree of at least two), preferably 2 to 100 molecules (polymerization degree of 2 to 100), and more preferably 2 to 40 molecules (polymerization degree of 2 to 40) of at least one compound that is selected from ethylene glycol, 1,2-propylene glycol, 1,3-propylene glycol, 1,2-butylene glycol, 1,3-butylene glycol, 1,4-butylene glycol, and 2,3-butylene glycol (collectively referred to as a "diol as a raw material") are condensed by dehydration (referred to as a "diol polymer as a raw material") and a compound having a group derived from the diol polymer as a raw material. Lower the polymerization degree of the polyether compound, the better the compatibility with the polyvinyl acetal and the effect of plasticizing polyvinyl acetal are.

However, there is also a tendency that the low migration of the polyether compound to the layer B is compromised. Herein, the group derived from a diol polymer as a raw material represents a group excluding any one of two hydroxyl groups contained in the diol polymer as a raw material. For the reference, polyethylene glycol (ethylene glycol polymer) is represented by the formula (9):

[Chemical Formula 9]

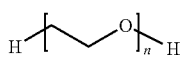

(9)

and the group derived from polyethylene glycol (i.e. a group derived from ethylene glycol polymer) is represented by the formula (10):

[Chemical Formula 10]

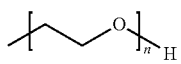

(10)

Specific examples of the diol polymer as a raw material include polyethylene glycol, poly(1,2-propylene glycol), poly(1,3-propylene glycol), poly(1,2-butylene glycol), poly (1,3-butylene glycol), poly(1,4-butylene glycol), poly(2,3-butylene glycol) and also a random copolymer or a block copolymer of two or more compounds selected from ethylene glycol, 1,2-propylene glycol, 1,3-propylene glycol, 1,2-butylene glycol, 1,3-butylene glycol, 1,4-butylene glycol, and 2,3-butylene glycol. Of these, a compound selected from a group consisting of polyethylene glycol, poly(1,2-propylene glycol), poly(1,2-butylene glycol), a compound having a group derived from polyethylene glycol, a compound having a group derived from poly(1,2-propylene glycol), and a compound having a group derived from poly(1,2-butylene glycol) are preferable in that compatibility with polyvinyl acetal and plasticizing effect are excellent and also a decrease in the dynamic strength of the layer B or an increase in the haze of the layer hardly occur.

As for the compound having a group derived from a diol polymer as a raw material, a compound in which the hydrogen atom of the hydroxyl group of monohydric alcohol is substituted with a group derived from a diol polymer as a raw material, a compound in which at least one hydrogen atom of the hydroxyl group of polyhydric alcohol is substituted with a group derived from a diol polymer as a raw material, a compound in which the hydrogen atom of the carboxyl group of monovalent carboxylic acid is substituted with a group derived from a diol polymer as a raw material, a compound in which at least one hydrogen atom of the carboxyl group of polyvalent carboxylic acid is substituted with a group derived from a diol polymer as a raw material, and a compound in which at least one hydrogen atom and/or at least one hydrogen atom of the hydroxyl group of the carboxyl group of hydroxyl carboxylic acid is substituted with a group derived from a diol polymer as a raw material (herein below, collectively referred to as a terminal-modified diol polymer as a raw material) can be also used as the polyether compound of the invention. Examples thereof include a compound in which the hydrogen atom of the hydroxyl group of methanol represented in the formula (11):

[Chemical Formula 11]

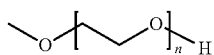

(11)

is substituted with a group derived from an ethylene glycol polymer, a compound in which two hydrogen atoms of the hydroxyl group of 3-methyl-1,5-pentane diol represented in the formula (12):

[Chemical Formula 12]

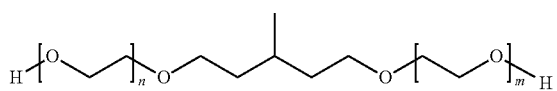

(12)

is substituted with a group derived from an ethylene glycol polymer, a compound in which the hydrogen atom of the carboxyl group of 2-ethyl hexanoic acid represented in the formula (13):

[Chemical Formula 13]

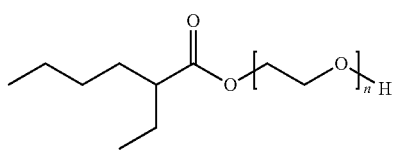

(13)

is substituted with a group derived from an ethylene glycol polymer, a compound in which two hydrogen atoms of the carboxyl group of adipic acid represented in the formula (14):

[Chemical Formula 14]

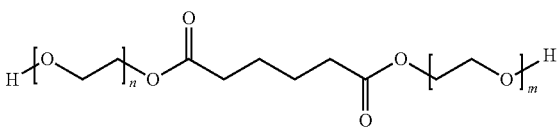

(14)

are substituted with a group derived from an ethylene glycol polymer, and a compound in which the hydrogen atom of the carboxyl group and the hydrogen atom of the hydroxyl group of 6-hydroxyhexanoic acid represented in the formula (15):

[Chemical Formula 15]

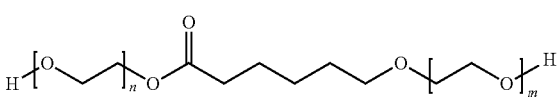

(15)

are substituted with a group derived from an ethylene glycol polymer.

The number average molecular weight of the polyether compound is, although not specifically limited, preferably 200 to 2000, more preferably 200 to 1500, and still more preferably 200 to 1200. When the number average molecular weight is less than 200, migration of the polyether compound from the layer A to layer B may easily occur. On the other hand, when the number average molecular weight is more than 2000, the compatibility with polyvinyl acetal and the effect of plasticizing polyvinyl acetal may not be obtained at sufficient level. Meanwhile, the number average molecular weight of the polyether compound is obtained based on a hydroxyl value.

Specific examples of the monohydric alcohol include monovalent aliphatic saturated alcohol like methanol, ethanol, 1-butanol, 2-butanol, hexanol, 2-ethylbutanol, heptanol, octanol, 2-ethyl-1-hexanol, decanol, dodecanol, palmityl alcohol, stearyl alcohol, and 6-butoxyhexanol; monovalent aliphatic unsaturated alcohol like allyl alcohol and 3-butylen-1-ol, and alcohol having an aromatic ring like benzyl alcohol, but not limited thereto. Specific examples of the polyhydric alcohol include dihydric aliphatic saturated alcohol like ethylene glycol, 1,2-propylene glycol, 1,2-butylene glycol, 1,2-pentane diol, 1,5-pentane diol, 2,4-pentane diol, 1,2-hexane diol, 1,6-hexane diol, 3-methyl-1,5-pentane diol, 3-methyl-2,4-pentane diol, 1,2-heptane diol, 1,7-heptane diol, 1,2-octane diol, 1,8-octane diol, 1,2-nonane diol, 1,9-nonane diol, 2-methyl-1,8-octane diol, 1,2-decane diol, 1,10-decane diol, 1,2-dodecane diol, 1,12-dodecane diol, 1,2-cyclohexane diol, 1,3-cyclohexane diol, 1,4-cyclohexane diol, 1,2-cyclohexane dimethanol, 1,3-cyclohexane dimethanol, 1,4-cyclohexane dimethanol; divalent aliphatic unsaturated alcohol like 2-butylene-1,4-diol, and 2-methyl-2-butylene-1,4-diol; aliphatic saturated alcohol having a valency of three or more like glycerin, pentaerythritol, 1,1,1-trimethylol ethane, 1,1,1-trimethylol propane, 1,3,5-cyclohexane triol; aliphatic unsaturated alcohol having a valency of three or more, and; an aromatic-ring containing alcohol having a valency of two or more like 1,2-dihydroxybenzene, 1,3-dihydroxybenzene, 1,4-dihydroxybenzene, bisphenol A, bisphenol F, 4,4'-biphenol, bis(4-hydroxyphenyl)sulfone, bis(4-hydroxyphenyl) ether, 1,2-bis(hydroxymethyl)benzene, 1,3-bis(hydroxymethyl)benzene, and 1,4-bis(hydroxymethyl)benzene. Of these, the monovalent aliphatic saturated alcohol, divalent aliphatic saturated alcohol, and aliphatic saturated alcohol having a valency of three or more are preferable from the viewpoint of weatherability.

Specific examples of the monovalent carboxylic acid include monovalent aliphatic saturated dicarboxylic acid like formic acid, acetic acid, propionic acid, butanoic acid, pentanoic acid, hexanoic acid, 2-ethylbutanoic acid, heptanoic acid, octanoic acid, nonanoic acid, decanoic acid, undecanoic acid, dodecanoic acid, palmitic acid, stearic acid; monovalent aliphatic unsaturated carboxylic acid like crotonic acid, oleic acid, linoleic acid, linolenic acid, and; monovalent carboxylic acid having an aromatic ring like benzoic acid. Specific examples of the polyvalent carboxylic acid include divalent aliphatic saturated carboxylic acid like oxalic acid, malonic acid, succinic acid, adipic acid, suberic acid, sebacic acid, dodecane diacid, 1,2-cyclohexane dicarboxylic acid, 1,3-cyclohexane dicarboxylic acid, 1,4-cyclohexane dicarboxylic acid; divalent aliphatic unsaturated carboxylic acid like maleic acid, fumaric acid, itaconic acid, and aconitic acid; aliphatic saturated carboxylic acid having valency of three or more like 1,3,5-pentane tricarboxylic acid like 1,3,5-cyclohexane tricarboxylic acid, 1,2,4-cyclohexane tricarboxylic acid; aliphatic unsaturated carboxylic acid having a valency of three of more, and; aromatic group containing carboxylic acid having a valency of two of more like phthalic acid, terephthalic acid, and trimellitic acid. Of these, monovalent aliphatic saturated carboxylic acid, divalent aliphatic saturated carboxylic acid, and aliphatic saturated carboxylic acid having a valency of three of more are preferable from the viewpoint of weatherability.

Specific examples of the hydroxyl carboxylic acid include aliphatic saturated hydroxyl carboxylic acid like glycolic acid, lactic acid, tartronic acid, glyceric acid, 2-hydroxybutyric acid, 3-hydroxybutyric acid, 4-hydroxybutyric acid, 6-hydroxyhexanoic acid, malic acid, tartaric acid, citric acid, isocitric acid, and 12-hydroxystearic acid; aliphatic unsaturated hydroxyl carboxylic acid like 2-hydroxycrotonic acid and ricinoleic acid; hydroxyl carboxylic acid having an aromatic ring like salicylic acid, gallic acid, and mandellic acid. Of these, from the viewpoint of weatherability, aliphatic saturated hydroxyl carboxylic acid is preferable.

Method of producing the polyether compound used in the invention is not specifically limited, and those produced by conventionally known method can be used. Further, it is also possible that a compound selected from a diol compound as a raw material, monohydric alcohol, polyhydric alcohol, monovalent carboxylic acid, polyvalent carboxylic acid, hydroxyl carboxylic acid, a diol polymer as a raw material which is separately prepared, and a terminal-modified diol polymer as a raw material, and a compound selected from ethylene oxide, 1,2-propylene oxide, oxetane, 1,2-butylene oxide, 2,3-butylene oxide, 1,3-butylene oxide, tetrahydrofuran, and the like are reacted in the presence of an alkali catalyst like sodium hydroxide and potassium hydroxide or an acid catalyst in a catalytic amount, if necessary in an appropriate organic solvent, and the catalyst is neutralized after the reaction, if necessary, and the solvent, unreacted compound, or product having low boiling point are removed under reduced pressure to obtain the polyether compound used in the invention. The polyether compound which can be obtained by this method have at least one hydroxyl group per molecule, it has excellent compatibility with polyvinyl acetal and excellent plasticizing effect. Further, as having low migration to a hydrocarbon-based polymer, it is particularly preferable.

The polyether compound obtained according to above can be used as it is, or if necessary, can be purified by distillation or the like. Further, two or more types of the polyether compound that are prepared by different methods can be mixed with each other and used as the polyether compound of the invention.

The use amount of the polyether compound is, although not specifically limited, 0.5 to 100 parts by mass, preferably 5 to 100 parts by mass, more preferably 10 to 80 parts by mass, and still more preferably 20 to 60 parts by mass compared to 100 parts by mass of the polyvinyl acetal included in the polyvinyl acetal composition. When the use amount of the polyether compound is less than 5 parts by mass, the effect of plasticizing polyvinyl acetal is insufficient, yielding poor flexibility when the laminate is used for an intermediate film of a laminated glass. On the other hand, when it is more than 100 parts by weight, migration of the polyether compound to the layer B may easily occur and a reduction in dynamic strength or an increase in haze of the layer B that is composed of the composition B containing the hydrocarbon-based polymer may be caused.

Next, the polyvinyl acetal used in the invention is explained. The polyvinyl acetal is typically produced from a vinyl alcohol polymer as a raw material. The vinyl alcohol polymer can be obtained by a common method, i.e. a vinyl ester monomer is polymerized and the resulting polymer is saponified. Examples of polymerizing the vinyl ester monomer include a conventionally known method like solution polymerization, bulk polymerization, suspension polymerization, and emulsion polymerization. Depending on polymerization method, the polymerization initiator like an azo initiator, a peroxide initiator, and a redox initiator is appropriately selected. The saponification may be carried out by alcoholysis or hydrolysis using a known alkali catalyst or and acid catalyst. Among them, the saponification reaction in which methanol is used as a solvent and caustic soda (NaOH) is used as a catalyst is most preferable, as it is convenient to carry out.

Examples of the vinyl ester monomer include vinyl formate, vinyl acetate, vinyl propionate, vinyl butyrate, vinyl isobutyrate, vinyl pyvarate, vinyl versatate, vinyl caproate, vinyl caprylate, vinyl laurate, vinyl palmitate, vinyl stearate, vinyl oleate, and vinyl benzoate. Vinyl acetate is particularly preferable.

Further, when the vinyl ester monomer is polymerized, it may be copolymerized with other monomers within the range that the effect of the invention is not impaired. Examples of the monomer include α-olefin like ethylene, propylene, n-butylene, and isobutylene; acrylic acid and a salt thereof; acrylic esters like methyl acrylate, ethyl acrylate, n-propyl acrylate, i-propyl acrylate, n-butyl acrylate, i-butyl acrylate, t-butyl acrylate, 2-ethylhexyl acrylate, dodecyl acrylate, and octadecyl acrylate; methacrylic acid and a salt thereof, methacrylate esters like methyl methacrylate, ethyl methacrylate, n-propyl methacrylate, i-propyl methacrylate, n-butyl methacrylate, i-butyl methacrylate, t-butyl methacrylate, 2-ethylhexyl methacrylate, dodecyl methacrylate, and octadecyl methacrylate; acrylamide and acrylamide derivative like N-methylacrylamide, N-ethylacrylamide, N,N-dimethylacrylamide, diacetone acrylamide, acrylamide propane sulfonic acid and a salt thereof, and N-methylol acrylamide and a derivative thereof; methacrylamide and methacrylamide derivative like N-methyl methacrylamide, N-ethyl methacrylamide, methacrylamide propane sulfonic acid and a salt thereof, methacrylamide propyl dimethylamine, a salt thereof, and a quaternary salt thereof, and N-methylol methacrylamide or a derivative thereof; vinyl ethers like methyl vinyl ether, ethyl vinyl ether, n-propyl vinyl ether, i-propyl vinyl ether, n-butyl vinyl ether, i-butyl vinyl ether, t-butyl vinyl ether, dodecyl vinyl ether, and stearyl vinyl ether; nitriles like acrylonitrile and methacrylonitrile; vinyl halides like vinyl chloride and vinyl fluoride; vinylidene halide like vinylidene chloride and vinylidene fluoride; an allyl compound like allyl acetate and allyl chloride; maleic acid, a salt thereof, an ester thereof, or an anhydride thereof; vinylsilyl compound like vinyltrimethoxysilane, and; isopropenyl acetate. These monomers are generally used at the ratio of less than 10 mol % compared to the vinyl ester monomer.

Further, when the vinyl ester monomer is polymerized, it may be copolymerized with other monomer if it is not against the main spirit of the invention. Examples of other monomer include the compounds that are exemplified above as the aliphatic unsaturated hydrocarbon compound having 2 to 12 carbon atoms and aromatic unsaturated hydrocarbon compound having 8 to 12 carbon atoms used for polymerization of the hydrocarbon-based polymer used in the composition B, and the compounds that are exemplified above as the compounds copolymerizable with the aliphatic unsaturated hydrocarbon compound having 2 to 12 carbon atom and aromatic unsaturated hydrocarbon compound having 8 to 12 carbon atoms (e.g., acrylic acid and a salt thereof, and methacrylic acid) within the range that the effect of the invention is not impaired, but not limited thereto. The monomer is generally used in ratio of less than 10 mol % compared to the vinyl ester monomer.

Viscosity average degree of polymerization of the vinyl alcohol polymer, which is used as a raw material of the polyvinyl acetal used in the invention, is appropriately selected depending on use. However, it is preferably 150 to 3,000 and more preferably 200 to 2,000. When the viscosity average degree of polymerization of the vinyl alcohol polymer is less than 150, dynamic strength inherent to the polyvinyl acetal may not be exhibited. On the other hand, when it is greater than 3,000, handlability (solvent solubility or melt-kneading property) of the polyvinyl acetal tends to be impaired.

The polyvinyl acetal used in the invention may be obtained by the following method, for example. First, an aqueous solution of vinyl alcohol polymer having concentration of 3 to 30% by mass is adjusted to the temperature range of 80 to 100° C. and then the temperature is gradually cooled over 10 to 60 min. When the temperature is lowered to −10 to 30° C., an aldehyde and an acid catalyst are added and the acetalization is carried out for 30 to 300 min while maintaining constant temperature. After that, the reaction solution is increased to the temperature of 30 to 80° C. over 30 to 200 min and maintained at the same temperature for 10 to 300 min, 1 to 6 hours. Then, the reaction solution is preferably cooled to room temperature and washed with water. If necessary, it is neutralized by adding a neutralizing agent like alkali, washed, and dried to obtain the polyvinyl acetal used in the invention.

The acid catalyst used for the acetalization is not specifically limited, and both an organic acid and an inorganic acid can be used. Examples thereof include acetic acid, para toluene sulfonic acid, nitric acid, sulfuric acid, and hydrochloric acid. Of these, hydrochloric acid, sulfuric acid, and nitric acid are preferably used. Hydrochloric acid is particularly preferably used.

The aldehyde used for the acetalization of the invention is not specifically limited. However, an aldehyde having 1 to 8 carbon atoms is preferably used. Examples of the aldehyde having 1 to 8 carbon atoms include formaldehyde, acetaldehyde, propion aldehyde, n-butyl aldehyde, isobutyl aldehyde, n-hexyl aldehyde, 2-ethylbutylaldehyde, n-octyl aldehyde, 2-ethylhexylaldehyde, and benzaldehyde. It may be used either singly or in combination of two or more. Of these, from the viewpoint of obtaining dynamic strength of the polyvinyl acetal, an aldehyde having 4 to 6 carbon atoms, in particular n-butyl aldehyde is preferably used. In other words, as a polyvinyl acetal, polyvinyl butyral is particularly preferable.

Average degree of acetalization of the polyvinyl acetal is preferably 40 to 85 mol %, more preferably 48 to 82 mol %, still more preferably 50 to 82 mol %, even still more preferably 55 to 81 mol %, and most preferably 60 to 80 mol %. By using the polyvinyl acetal having the degree of acetalization within this range, a polyvinyl acetal composition which has excellent compatibility with the polyester, hydroxyl carboxylic acid ester compound, or polyether compound and excellent transparency can be obtained. Further, to achieve more preferably the purpose of the invention, the content of vinyl ester unit in the polyvinyl acetal is 0.01 to 30 mol %, preferably 0.05 to 15 mol %, and more preferably 0.1 to 5 mol %. The polyvinyl acetal having the vinyl ester unit content within this range has more favorable weatherability, and therefore preferable. Further, the content of vinyl alcohol unit is 10 to 50 mol %, preferably 12 to 40 mol %, and most preferably 15 to 35 mol %. Meanwhile, the degree of acetalization, content of the vinyl ester unit, and content of vinyl alcohol unit are the value obtained by dividing mass amount of the acetalized unit, mass amount of the vinyl ester unit, and mass amount of the vinyl alcohol unit with the total mass amount of monomer units contained in the polyvinyl acetal.

The polyvinyl acetal composition of the invention may also contain a plasticizer other than polyester, a hydroxyl carboxylic acid ester compound, and a polyether compound, if it is not against the main spirit of the invention. Examples of the plasticizer that can be used include a carboxylic acid ester plasticizer like monovalent carboxylic acid ester and polyvalent carboxylic acid ester plasticizer, a phosphoric acid ester plasticizer, and an organic phosphorus acid plasticizer, but not limited thereto. It can be appropriately selected depending on use. However, when a common laminate is produced by using them, using a plasticizer which migrates from the layer A to the layer B or may impair the physical properties or transparency of the layer B and adhesion between the layer A and the layer B and adding it in an amount to cause such problems are often undesirable.

Examples of the monovalent carboxylic acid ester include a compound obtained by condensation between a monovalent carboxylicacid like butanoic acid, isobutanoic acid, hexanoic acid, 2-ethylhexanoiic acid, heptanoic acid, octyl acid, 2-ethyl hexanoic acid, and lauric acid and a polyhydric alcohol like ethylene glycol, diethylene glycol, triethylene glycol, tetraethylene glycol, polyethylene glycol, and glycerin, except the polyether compound of the invention. Specific examples thereof include triethylene glycol di 2-ethylhexanoate, triethylene glycol diisobutanoate, triethylene glycol di 2-hexanoate, triethylene glycol di 2-ethylbutanoate, triethylene glycol dilaurate, ethylene glycol di 2-ethylhexanoate, diethylene glycol di 2-ethylhexanoate, tetraethylene glycol di 2-ethylhexanoate, tetraethylene glycol diheptanoate, PEG#400 di 2-ethylhexanoate, triethylene glycol mono 2-ethylhexanoate, and glycerin tri 2-ethylhexanoate. Herein, PEG#400 represents polyethylene glycol having average molecular weight of 350 to 450.

Examples of the polyvalent carboxylic acid ester include a compound obtained by polycondensation between a polyvalent carboxylicacid like adipic acid, succinic acid, azelaic acid, sebacic acid, phthalic acid, isophthalic acid, terephthalic acid, and trimethylic acid and an alcohol having 1 to 12 carbon atoms like methanol, ethanol, hexanol, 2-ethyl butanol, heptanol, octanol, 2-ethyl hexanol, decanol, dodecanol, butoxy ethanol, butoxyethoxy ethanol, and benzyl alcohol. Specific examples of the compound include dihexyl adipic acid, di-2-ethylhexyl adipic acid, diheptyl adipic acid, dioctyl adipic acid, di 2-ethylhexyl adipic acid, di(butoxyethyl)adipic acid, di(butoxyethoxyethyl)adipic acid, mono (2-ethylhexyl)adipic acid, dibutyl phthalic acid, dihexyl phthalic acid, di(2-ethylbutyl)phthalic acid, dioctyl phthalic acid, di(2-ethylhexyl)phthalic acid, benzylbutyl phthalic acid, and didodecyl phthalic acid, but not limited thereto.

Examples of the phosphoric acid plasticizer and phosphorus acid plasticizer include a compound obtained by polycondensation of phosphoric acid or phosphorus acid with an alcohol having 1 to 12 carbon atoms like methanol, ethanol, hexanol, 2-ethyl butanol, heptanol, octanol, 2-ethyl hexanol, decanol, dodecanol, butoxy ethanol, butoxyethoxy ethanol, and benzyl alcohol. Specific examples of the compound include trimethyl phosphate, triethyl phosphate, tripropyl phosphate, tributyl phosphate, tri(2-ethylhexyl)phosphate, tri(butoxyethyl)phosphate, and tri(2-ethylhexyl)phosphorus acid.

Of these, triethylene glycol di 2-ethylhexanoate, triethylene glycol di 2-ethylbutylater, tetraethylene glycol di 2-ethylhexanoate, tetraethylene glycol diheptanonate, dihexyl adipate, dioctyl adipate, and di(2-ethylhexyl)adipate are preferable According to the invention, when a plasticizer other than polyester, a hydroxyl carboxylic acid ester compound, and a polyether compound is used, it may be used either singly or in combination of two or more. The use amount is not specifically limited. Compared to 100 parts by mass of the polyvinyl acetal contained in the polyvinyl acetal composition, it is used in an amount of 0.1 to 80 parts by mass, preferably 0.1 to 60 parts by mass, more preferably 5 to 70 parts by mass, still more preferably 5 to 50 parts by mass, and most preferably 20 to 45 parts by mass. When the use amount of the plasticizer is less than 0.1 part by mass compared to 100 parts by mass of the polyvinyl acetal contained the polyvinyl acetal composition, the plasticizing effect may not be obtained at sufficient level. On the other hand, when it is more than 80 parts by mass, an excellent plasticizing effect may not be obtained, either.

It is required for the polyvinyl acetal composition of the invention to contain, compared to 100 parts by mass of the polyvinyl acetal, 0.5 to 100 parts by mass of polyester, hydroxyl carboxylic acid ester compound, or polyether compound that has a melting point of 30° C. or less or is amorphous, while having a hydroxyl value of 15 to 450 mgKOH/g. More preferably, it contains them in an amount of 5 to 90 parts by mass. Still more preferably, it contains them in an amount of 20 to 80 parts by mass. When the content of the polyester, hydroxyl carboxylic acid ester compound, or polyether compound in the polyvinyl acetal composition of the invention is within this range, a polyvinyl acetal composition having excellent flexibility and excellent dynamic strength and transparency inherent to the polyvinyl acetal can be provided.

Acid value of the polyvinyl acetal composition that is used in the invention is not specifically limited. However, it preferably has an acid value of 10 mgKOH/g or less. More preferably, it is 7 mgKOH/g or less. Still more preferably, it is 5 mgKOH/g or less. When the polyvinyl acetal composition that is used in the invention has the acid value within the range, deterioration hardly occurs during long term use, and therefore preferable.

Glass transition temperature of the polyvinyl acetal composition used in the invention is not specifically limited. However, it is preferably 0 to 50° C., more preferably 5 to 45° C., and still more preferably 10 to 40° C. When the glass transition temperature of the polyvinyl acetal composition satisfies the above condition, a sheet which can be obtained by using the polyvinyl acetal composition, e.g., an intermediate film of a laminated glass, has excellent flexibility at room temperature and exhibits suitable dynamic strength, and therefore preferable. It is particularly preferable when the laminate of the invention is used as an intermediate film of a laminated glass The polyvinyl acetal composition of the invention may be also added with known additives like an anti-oxidizing agent, a UV absorbent, an adhesion modifying agent, or the like, unless it is not against the main spirit of the invention. They are explained herein below.

As for the anti-oxidizing agent used for the polyvinyl acetal composition of the invention, the type of the agent is not specifically limited. However, preferred examples thereof include a phenol-based anti-oxidizing agent, a phosphorus-based anti-oxidizing agent, and a sulfur-based anti-oxidizing agent. Of these, the phenol-based anti-oxidizing agent is preferable. The alkyl-substituted phenol-based anti-oxidizing agent is particularly preferable.

Examples of the phenol-based anti-oxidizing agent include an acrylate compound like 2-t-butyl-6-(3-t-butyl-2-hydroxy-5-methylbenzyl)-4-methylphenylacrylate and 2,4-di-t-amyl-6-(1-(3,5-di-t-amyl-2-hydroxyphenyl)ethyl)phenylacrylate, an alkyl-substituted phenol-based compound like 2,6-di-t-butyl-4-methylphenol, 2,6-di-t-butyl-4-ethylphenol, octadecyl-3-(3,5-)di-t-butyl-4-hydroxyphenyl)propionate, 2,2'-methylene-bis(4-methyl-6-t-butylphenol), 4,4'-butylidene-bis(4-methyl-6-t-butylphenol), 4,4'-butylidene-bis(6-t-butyl-m-cresol), 4,4'-thiobis(3-methyl-6-t-butylphenol), bis(3-cyclohexyl-2-hydroxy-5-methylphenyl)methane, 3,9-bis(2-(3-(3-t-butyl-4-hydroxy-5-methylphenyl)propionyloxy)-1,1-dim ethylethyl)-2,4,8,10-tetraoxaspiro[5,5]undecane, 1,1,3-tris(2-methyl-4-hydroxy-5-t-butylphenyl)butane, 1,3,5-trimethyl-2,4,6-tris(3,5-di-t-butyl-4-hydroxybenzyl)benzene, tetrakis(methylene-3-(3',5'-di-t-butyl-4'-hydroxyphenyl)propionate)methane, and triethylene glycol bis(3-(3-t-butyl-4-hydroxy-5-methylphenyl)propionate), and a triazine group-containing phenol-based compound like 6-(4-hydroxy-3,5-di-t-butylanilino)-2,4-bis-octylthio-1,3,5-triazine, 6-(4-hydroxy-3,5-dimethylanilino)-2,4-bis-octylthio-1,3,5-triazine, 6-(4-hydroxy-3-methyl-5-t-butylanilino)-2,4-bis-octylthio-1,3,5-triazine, and 2-octylthio-4,6-bis-(3,5-di-t-butyl-4-oxyanilino)-1,3,5-triazine.

Examples of the phosphorus-based anti-oxidizing agent include a monophosphite compound like triphenylphosphite, diphenyl isodecylphosphite, phenyl diisodecylphosphite, tris(nonylphenyl)phosphite, tris(dinonylphenyl)phosphite, tris(2-t-butyl-4-methylphenyl)phosphite, tris(cyclohexylphenyl)phosphite, 2,2-methylenebis(4,6-di-t-butylphenyl)octylphosphite, 9,10-dihydro-9-oxa-10-phosphaphenanthrene-10-oxide, 10-(3,5-di-t-butyl-4-hydroxybenzyl)-9,10-dihydro-9-oxa-10-phosphaphenanthrene-10-oxide, and 10-decyloxy-9,10-dihydro-9-oxa-10-phosphaphenanthrene, and a diphosphite compound like 4,4'-butylidene-bis(3-methyl-6-t-butylphenyl-di-tridecylphosphite), 4,4'-isopropylidene-bis(phenyl-di-alkyl(C12-C15)phosphite), 4,4'-isopropylidene-bis(diphenylmonoalkyl(C12-C15)phosphite), 1,1,3-tris(2-methyl-4-di-tridecylphosphite-5-t-butylphenyl)butane, and tetrakis(2,4-di-t-butylphenyl)-4,4'-biphenylenephosphite. Of these, the monophosphite compound is preferable.

Examples of the sulfur-based anti-oxidizing agent include dilauryl 3,3'-thiodipropionate, distearyl 3,3'-thiodipropionate, lauryl stearyl 3,3'-thiodipropionate, pentaerythritol-tetrakis-(β-lauryl-thiopropionate), and 3,9-bis(2-dodecylthioethyl)-2,4,8,10-tetraoxaspiro[5,5]undecane.

The anti-oxidizing agent may be used either singly or in combination of two or more. The addition amount of the anti-oxidizing agent is 0.001 to 5 parts by mass, and preferably 0.01 to 1 parts by mass compared to 100 parts by mass of the polyvinyl acetal resin. When the addition amount of the anti-oxidizing agent is less than 0.001 parts by mass, the effect may not be obtained at sufficient level. On the other hand, when it is more than 5 parts by mass, an excellent effect may not be obtained, either.

The polyvinyl acetal composition of the invention may also contain a UV absorbent. Examples of the UV absorbent that can be used include a benzotriazole UV absorbent like 2-(5-methyl-2-hydroxyphenyl)benzotriazole, 2-[2-hydroxy-3,5-bis(α,α'-dimethylbenzyl)phenyl]-2H-benzotriazole, 2-(3,5-di-t-butyl-2-hydroxyphenyl)benzotriazole, 2-(3-t-butyl-5-methyl-2-hydroxyphenyl)-5-chlorobenzotriazole, 2-(3,5-di-t-butyl-5-methyl-2-hydroxyphenyl)-5-chlorobenzotriazole, 2-(3,5-di-t-amyl-2-hydroxyphenyl)benzotriazole, and 2-(2'-hydroxy-5'-t-octylphenyl)benzotriazole, a hindered amine UV absorbent like 2,2,6,6-tetramethyl-4-piperidylbenzoate, bis(2,2,6,6-tetramethyl-4-piperidyl)sebacate, bis(1,2,2,6,6-pentamethyl-4-piperidyl)-2-(3,5-di-t-butyl-4-hydroxybenzyl)-2-n-butylmalonic acid, and 4-(3-(3,5-di-t-butyl-4-hydroxyphenyl)propionyloxy)-1-(2-(3-(3,5-di-t-buty 1-4-hydroxyphenyl)propionyloxy)ethyl)-2,2,6,6-tetramethylpiperidine, and a benzoate UV absorbent like 2,4-di-t-butylphenyl-3,5-di-t-butyl-4-hydroxybenzoate and hexadecyl-3,5-di-t-butyl-4-hydroxybenzoate. The UV absorbent may be used singly or in combination of two or more. The addition amount of the UV absorbent is 10 to 50,000 ppm, and preferably 100 to 10,000 ppm compared to the mass of the polyvinyl acetal composition. When the addition amount of the UV absorbent is less than 10 ppm, the effect may not be obtained at sufficient level. On the other hand, when it is more than 50,000 ppm, an excellent effect may not be obtained, either. The UV absorbent may be also used in combination of two or more.

The polyvinyl acetal composition of the invention can be obtained by mixing polyvinyl acetal and the polyester, hydroxyl carboxylic acid ester compound, or polyether compound according to a known method. For example, it can be obtained by kneading the polyvinyl acetal and the polyester and the like, and additives like an anti-oxidizing agent, a UV absorbent, a plasticizer, or the like as necessary, by using a mixing roll, a Plast mill, or the like. Further, it is also possible to produce the composition by dissolving the polyvinyl acetal and the polyester and the like, and additives like an anti-oxidizing agent, a UV absorbent, a plasticizer, or the like as necessary, in a good solvent which can dissolve both the polyvinyl acetal and the polyester followed by casting and drying. Examples of the good solvent for polyvinyl acetal include a lower alcohol like ethanol, propanol, and butanol, acetone, methyl ethyl ketone, tetrahydrofuran, 1,4-dioxane, dimethyl sulfoxide, and chloroform, but not limited thereto.

The polyvinyl acetal composition of the invention can be obtained by mixing polyvinyl acetal and the polyester, hydroxyl carboxylic acid ester compound, or polyether compound, and additives, if necessary, according to a known method. Specific examples of the mixing method include melt kneading using a mixing roll, a Plast mill, an extruder, or the like or dissolving the components of the polyvinyl acetal composition in an appropriate organic solvent and then removing the solvent. However, it is not specifically limited if it is not against the main spirit of the invention.

When molded into a sheet, the polyvinyl acetal composition of the invention can be used for various applications, in particular an intermediate film of a laminated glass. Explanations are given below regarding the sheet. The sheet composed of the polyvinyl acetal composition of the invention can be obtained by molding the polyvinyl acetal composition of the invention into a sheet according to a known method using a hot press molding machine, a calendar roll, or an extruder. Further, a concave/convex structure may be formed on the surface of a sheet by a known method like Meltfracture and embossing, and it is particularly preferable when the sheet is used as an intermediate film of a laminated glass. Shape of Meltfracture and embossing is not specifically limited, and a conventionally known shape can be used.

Thickness of the sheet of the invention is 20 to 10,000 μm, preferably 20 to 3,000 μm, and more preferably 20 to 1,600 μm.

For improving the flexibility of an intermediate film, the polyvinyl acetal composition contained in the sheet of the invention may also contain a plasticizer other than a polyester, a hydroxyl carboxylic acid ester compound, and a polyether compound if it is not against the main spirit of the invention. In such case, the total content of the polyester, hydroxyl carboxylic acid ester compound or polyether compound, and plasticizer is not specifically limited if it is not against the main spirit of the invention. However, from the viewpoint of flexibility and strength of the sheet, it is preferably 20 to 100 parts by mass, more preferably 25 to 80 parts by mass, and still more preferably 30 to 70 parts by mass compared to 100 parts by mass of the polyvinyl acetal.

When a sheet composed of the polyvinyl acetal composition of the invention or a laminate of the invention in which a resin layer composed of the polyvinyl acetal composition and other resin layer are laminated is used for application which requires suitable adjustment of adhesion with glass, for example, an intermediate film of a laminated glass, a solar cell module, or the like, it is preferable that the polyvinyl acetal composition used in the invention is added with an adhesion modifying agent. Examples of the adhesion modifying agent that can be used include those described in International Publication No. 03/033583, and an alkali metal salt and/or alkali earth metal salt of carboxylic acid is preferably added. In particular, potassium acetate and/or magnesium acetate is preferable. The addition amount is preferably 1 to 10,000 ppm, more preferably 5 to 1,000 ppm, and still more preferably 10 to 300 ppm compared to the mass of the polyvinyl acetal composition used for a sheet. The most suitable addition amount of the adhesion modifying agent varies depending on the additives used. It also varies depending on a place in which it is used when the sheet of the invention is used as an intermediate film of a laminated glass. However, when the adhesion between a sheet and a glass is evaluated by using a laminated glass subjected to Pummel test (described in International Publication No. 03/033583 or the like), it is suitably adjusted to 3 to 10. When high resistance to penetration is required in particular, it is preferably adjusted to 3 to 6. When a high glass shatterproof property is required, it is preferably adjusted to 7 to 10. When a high glass shatterproof property is required, it is also useful not to add any adhesion modifying agent.

The polyester, hydroxyl carboxylic acid ester compound, or polyether compound contained in the polyvinyl acetal composition of the invention does not easily migrate to polycarbonate and styrene thermoplastic elastomer as well as polyethylene, polypropylene, an ethylene-vinyl acetate copolymer, polymethacrylic acid, poly(meth)acrylic acid ester, and an ethylene-(meth)acrylic acid ester copolymer. Thus, a laminate in which an intermediate film of a laminated glass composed of these resin layers and the polyvinyl acetal composition of the invention are directly laminated can be suitably used as an intermediate film with high performance. In particular, a laminate of the polycarbonate sheet or poly (meth)acrylic acid ester is suitably used as an intermediate film of a laminated glass having very high penetration resistance and a laminate with an styrene thermoplastic elastomer is suitably used as an intermediate film of a laminated glass having very high soundproof property.

Further, when the sheet of the invention is directly laminated on a layer composed of various thermoplastic resins as a main component, the polyester, hydroxyl carboxylic acid ester compound, or polyether compound contained in the polyvinyl acetal composition of the invention does not easily migrate to the layer composed of thermoplastic resins as a main component, and therefore preferable. Herein, the layer composed of thermoplastic resins as a main component indicates a layer in which the ratio of the thermoplastic resin is 60% by mass or more, preferably 80% by mass or more, and more preferably 90% by mass or more compared to the total mass of the layer. Examples of the thermoplastic resin include poly(meth)acrylic acid ester, polycarbonate, polyvinyl chloride, polyethylene, polypropylene, ethylene-propylene copolymer, polystyrene, styrene-propylene block copolymer, acrylonitrile-styrene copolymer, acrylonitrile-butadiene-styrene copolymer, nylon, polyurethane, and polyacetal resin (collectively referred to as a resin against a laminate). Of these, poly(meth)acrylic acid ester, polycarbonate, and a polyolefin polymer like polyethylene, polypropylene, ethylene-propylene copolymer, polystyrene, and styrene-polyene block copolymer are preferable for laminating the sheet of invention. Herein below, they are explained in order.

A laminate which can be obtained by laminating the sheet of the invention with a layer (layer B) composed of a composition (composition B) which contains the resin selected from poly(meth)acrylic acid ester and polycarbonate has both the soundproof property inherent to the sheet of the invention and the penetration resistance inherent to poly(meth)acrylic acid ester and polycarbonate, and therefore preferable.

The poly(meth)acrylic acid ester that is used in the invention is not specifically limited if it is a polymer which contains a (meth)acrylic acid ester unit as a main component. Herein, the polymer which contains a (meth)acrylic acid ester unit as a main component indicates a polymer in which a unit derived from (meth)acrylic acid ester, which is included in the polymer, is 70% by mass or more, preferably 80% by mass or more, and more preferably 90% by mass or more. When a unit derived from (meth)acrylic acid ester included in the polymer is less than 70% by mass, transparency or dynamic strength inherent to poly(meth)acrylic acid ester may not be exhibited. The (meth)acrylic acid ester that is used as a raw material of corresponding polymer is not specifically limited and a known ester can be used. Further, it is possible to use two or more kinds of (meth)acrylic acid ester in combination. Specific examples of the (meth)acrylic acid ester include methyl (meth)acrylate, ethyl(meth)acrylate, propyl(meth)acrylate, butyl(meth)acrylate, hexyl(meth)acrylate, 2-ethyl hexyl (meth)acrylate, and phenyl(meth)acrylate. Of these, methyl methacrylate is preferable from the viewpoint of transparency and dynamic strength.

The polycarbonate that is used in the invention is not specifically limited and a conventionally known polycarbonate can be used. An aromatic polycarbonate that is derived from aromatic diol compound like 2,2-bis(4-hydroxyphenyl)propane and bis(4-hydroxyphenyl)methane, dimethyl carbonate, diphenyl carbonate, and phosgene is preferable from the viewpoint of transparency and dynamic strength.

A laminate which can be obtained by laminating the sheet of the invention with a layer composed of a composition which contains polyolefin (hydrocarbon-based polymer), in particular a layer composed of a composition which contains the resin obtained by block copolymerization described below, has a high soundproof property inherent to the block copolymer, and therefore preferable. Explanations are given below regarding the laminate.

Content of the hydrocarbon-based polymer contained in the composition B is not specifically limited, if it is not against the main spirit of the invention. However, compared to the mass of the composition B, it is preferably 30% by mass or more, more preferably 80% by mass or more, and still more preferably 90% by mass or more. When the content of the hydrocarbon-based polymer is less than 30% by mass compared to the mass of the composition B, the low water absorption property or various dynamic properties inherent to the hydrocarbon-based polymer, and properties like sound proof property of a block copolymer described below tend to be lowered.

The hydrocarbon-based polymer used in the invention is not specifically limited, if it is a polymer which contains a hydrocarbon component as a main component, and it can be appropriately selected depending on specific purpose. However, a polymer of at least one compound selected from an aliphatic unsaturated hydrocarbon compound having 2 to 12 carbon atoms and an aromatic unsaturated hydrocarbon compound having 8 to 12 carbon atoms, or a hydrogenated molecule thereof are preferable in that they have excellent interlayer adhesion and various excellent dynamic properties and also they can be easily obtained. As used herein, a polymer of at least one compound selected from an aliphatic unsaturated hydrocarbon compound having 2 to 12 carbon atoms and an aromatic unsaturated hydrocarbon compound having 8 to 12 carbon atoms, or a hydrogenated molecule thereof are a polymer or a hydrogenated molecule thereof in which the total mass ratio of the aliphatic unsaturated hydrocarbon compound having 2 to 12 carbon atoms and aromatic unsaturated hydrocarbon compound having 8 to 12 carbon atoms is 80% by mass or more, preferably 95% by mass or more, and most preferably 98% by mass or more compared to whole monomers contained in the polymer. When the total mass ratio of the aliphatic unsaturated hydrocarbon compound having 2 to 12 carbon atoms and aromatic unsaturated hydrocarbon compound having 8 to 12 carbon atoms is less than 80% by mass compared to whole monomers contained in the polymer, the low water absorption property or various dynamic properties inherent to the polyolefin and properties like sound proof property of a block copolymer described below tend to be lowered.

Specific examples of the aliphatic unsaturated hydrocarbon compound having 2 to 12 carbon atoms include an aliphatic monoene compound like ethylene, propylene, butylene, 2-butylene, isobutylene, pentene, hexene, heptene, octane, nonene, decene, undecene, dodecane, cyclohexene, and cyclooctene, an aliphatic conjugated polyene compound like butadiene, isoprene, 1,3-hexadiene, 1,3-octadiene, 1,3,5-hexatriene, 1,3-cyclopentadiene, 1,3-cyclohexadiene, and 1,3-cyclooctadiene, and an aliphatic non-conjugated polyene compound like 1,4-pentadiene, 1,5-hexadiene, and 1,5-cyclooctadiene. Of these, ethylene, propylene, butadiene and isoprene are preferable.

Further, specific examples of the aromatic unsaturated hydrocarbon compound having 8 to 12 carbon atoms include an aromatic monoene compound like styrene, α-methylstyrene, β-methylstyrene, 2-methylstyrene, 3-methylstyrene, 4-methylstyrene, 4-ethylstyrene, 4-butylstyrene, 4-tert-butylstyrene, (1-naphthyl)ethylene, and (2-naphthyl)ethylene, an aromatic conjugated polyene compound like 1-phenylbutadiene and 2-phenylbutadiene, and an aromatic non-conjugated polyene compound like 1-phenyl-1,4-pentadiene and 1-phenyl-1,3-cyclohexadiene. Of these, styrene is preferable.

The hydrocarbon-based polymer contained in the composition B may be copolymerized with, in addition to the compounds exemplified above, the following compounds within the range that the effect of the invention is not impaired: for example, acrylic acid and a salt thereof; acrylic esters like methyl acrylate, ethyl acrylate, n-propyl acrylate, i-propyl acrylate, n-butyl acrylate, i-butyl acrylate, t-butyl acrylate, 2-ethylhexylacrylate, dodecyl acrylate, and octadecyl acrylate; methacrylic acid and a salt thereof, methacrylate esters like methyl methacrylate, ethyl methacrylate, n-propyl methacrylate, i-propyl methacrylate, n-butyl methacrylate, i-butyl methacrylate, t-butyl methacrylate, 2-ethylhexyl methacrylate, dodecyl methacrylate, and octadecyl methacrylate; acrylamide and acrylamide derivative like N-methylacrylamide, N-ethylacrylamide, N,N-dimethylacrylamide, diacetone acrylamide, acrylamide propane sulfonic acid and a salt thereof, and N-methylol acrylamide and a derivative thereof; methacrylamide and methacrylamide derivative like N-methylmethacrylamide, N-ethylmethacrylamide, methacrylamide propane sulfonic acid and a salt thereof, and N-methylol methacrylamide or a derivative thereof; vinyl ethers like methyl vinyl ether, ethyl vinyl ether, n-propyl vinyl ether, i-propyl vinyl ether, n-butyl vinyl ether, i-butyl vinyl ether, t-butyl vinyl ether, dodecyl vinyl ether, and stearyl vinyl ether; nitriles like acrylonitrile and methacrylonitrile; vinyl halides like vinyl chloride and vinyl fluoride; vinylidene halide like vinylidene chloride and vinylidene fluoride; an allyl compound like allyl acetate and allyl chloride; maleic acid, a salt thereof, an ester thereof, or an anhydride thereof; an vinylsilyl compound like vinyl trimetoxysilane or 3-methacryloxypropyl trimetoxysilane, and: isopropenyl acetate.

Specific examples of the polymer of at least one compound selected from an aliphatic unsaturated hydrocarbon compound having 2 to 12 carbon atoms and an aromatic unsaturated hydrocarbon compound having 8 to 12 carbon atoms, or a hydrogenated molecule include high density polyethylene, low density polyethylene, ultra low density polyethylene, polypropylene, polystyrene, polybutadiene, polyisoprene, an ethylene-propylene copolymer, hydrogenated polybutadiene, hydrogenated polyisoprene, and also a block copolymer like a styrene-butadiene block copolymer, a styrene-isoprene block copolymer, a styrene-butadiene-isoprene block copolymer, and a hydrogenated molecule thereof. Further, their polymerization method is not specifically limited, and a polymer obtained by a conventional polymerization method can be used, for example. When the laminate of the invention is used as an intermediate film of a sound proof laminated glass, a block copolymer of a block (X) consisting of a polymer of an aromatic unsaturated hydrocarbon compound having 8 to 12 carbon atoms and a block (Y) consisting of a polymer of an aliphatic conjugated polymer compound having 2 to 12 carbon atoms, and a hydrogenated molecule thereof (herein below, they are collectively referred to as a "block copolymer") like styrene-butadiene block copolymer, styrene-isoprene block copolymer, styrene-butadiene-isoprene copolymer, and a hydrogenated molecule thereof are preferably used as they have an excellent vibration damping property and sound proof property. Herein below, they are explained in greater detail.

The block copolymer used in the invention is not specifically limited if it has a block (X) part and a block (Y) part. For example, a block copolymer like $[(X)-(Y)]_k$ and $[(X)(Y)]_m-(X)$, $(Y)-[(X)-(Y)]$, can be used, wherein k, m, and n are any natural number. Among them, a block copolymer having two or more block (X) and one or more block (Y) is preferable. A triblock copolymer consisting of (X)-(Y)-(X) is particularly preferable. Further, when the block copolymer used in the invention contains two or more block (X) or two or more block (Y), each block (X) and block (Y) may be the same or different from each other.

Content of the block (X) and block (Y) in the block copolymer is not specifically limited if it is not against the purpose of the invention. However, from the viewpoint of vibration damping property and sound proof property, content of the block (X) is preferably 5 to 95% by mass, and more preferably 10 to 70% by mass compared to the total mass of the block copolymer. When the content of the block (X) is within the range, the vibration damping property and sound proof property inherent to the block copolymer are exhibited, and therefore desirable.

The weight average molecular weight of the block (X) and block (Y) in the block copolymer is not specifically limited. However, the weight average molecular weight per single block (X) is preferably 2,500 to 75,000, and the weight average molecular weight per single block (Y) is preferably 1,000 to 100,000. Further, the weight average molecular weight of the block copolymer is preferably 10,000 to 1,000,000, and more preferably 15,000 to 200,000. When the weight average molecular weight of the block (X) and block (Y) is too low, performance of the block copolymer may not be exhibited. Further, when the weight average molecular weight of the block copolymer is too low, dynamic strength may be lowered too much when it is prepared as a laminate. On the other hand, when the weight average molecular weight of the block copolymer is too high, handlability is impaired at the time of molding. Glass transition temperature, melting point or the like of the block copolymer may be appropriately selected depending on purpose.

Glass transition temperature of the block copolymer used in the invention is not specifically limited and it may be appropriately selected depending on purpose. However, it is preferably −50 to 50° C., more preferably −45 to 30° C., and still more preferably −40 to 20° C. When the glass transition temperature of the block copolymer satisfies the above condition, favorable dynamic physical properties and various favorable properties are obtained for the laminate of the invention.

The tan δ peak temperature of the block copolymer used in the invention is not specifically limited and it may be appropriately selected depending on purpose. However, it is preferably −40 to 30° C., more preferably −35 to 25° C., and still more preferably −30 to 20° C.

The dynamic strength of the block copolymer used in the invention is not specifically limited and it may be appropriately selected depending on purpose. However, when described as tensile break strength as an indicator, it is preferably 0.1 MPa or more, more preferably 0.5 MPa or more, and still more preferably 1.0 MPa or more.

The MFR value of the block copolymer used in the invention is not specifically limited and it may be appropriately selected depending on purpose. However, when measured according to ASTM D1238 with a load of 2.16 kg and temperature of 190° C., MRF value is preferably 0.1 to 100 g/10 min, more preferably 0.1 to 70 g/10 min, and still more preferably 0.1 to 50 g/10 min.

Block (Y) part of the block copolymer used in the invention may be either hydrogenated or non-hydrogenated. However, from the viewpoint of weatherability, it is preferably hydrogenated. The hydrogenation ratio is preferably 50 mol % or more, more preferably 80 mol % or more, and still more preferably 95 mol % or more.

The block copolymer described above may be produced by a conventionally known method. However, it may be also produced by a method in which an organolithium reagent is used as an initiator and an aromatic unsaturated hydrocarbon compound having 8 to 12 carbon atoms and an aliphatic conjugated polyene compound having 2 to 12 carbon atoms are added in order to react with each other, for example, but the production method is not limited thereto.

The composition B used in the invention may be also added with an anti-oxidizing agent, a UV absorbent, known additives, or the like.

When the anti-oxidizing agent is added to the composition B used in the invention, type of the agent is not specifically limited. However, preferred examples thereof include a phenol-based anti-oxidizing agent, a phosphorus-based anti-oxidizing agent, and a sulfur-based anti-oxidizing agent. Of these, the phenol-based anti-oxidizing agent is preferable. The alkyl-substituted phenol-based anti-oxidizing agent is particularly preferable. Examples of the phenol-based anti-oxidizing agent, phosphorus-based anti-oxidizing agent, and sulfur-based anti-oxidizing agent include those exemplified above as the anti-oxidizing agent that can be added to the composition A. The anti-oxidizing agent may be used either singly or in combination of two or more. The addition amount of the anti-oxidizing agent is 0.001 to 5% by mass, and preferably 0.01 to 1% by mass compared to the mass of the composition B. When the addition amount of the anti-oxidizing agent is less than 0.001% by mass, the effect may not be obtained at sufficient level. On the other hand, when it is more than 5% by mass, an excellent effect may not be obtained, either.

When the UV absorbent is added to the composition B used in the invention, type of the UV absorbent is not specifically limited. However, preferred examples of the UV absorbent that can be used include those exemplified above as the UV absorbent that can be added to the composition A. The addition amount of the UV absorbent is preferably 0.001 to 5% by mass, and more preferably 0.01 to 1% by mass compared to the mass of the composition B. When the addition amount of the UV absorbent is less than 0.001% by mass, the effect may not be obtained at sufficient level. On the other hand, when it is more than 5% by mass, an excellent effect may not be obtained, either. The UV absorbent may be used either singly or in combination of two or more.

The composition B of the invention can be obtained by mixing hydrocarbon-based polymer, and additives, if necessary, according to a known method. Specific examples of the mixing method include melt kneading using a mixing roll, a Plast mill, an extruder, or the like or dissolving the components of the composition B in an appropriate organic solvent and then removing the solvent. However, it is not specifically limited if it is not against the main spirit of the invention.

The method for producing the laminate of the invention is not specifically limited, and it can be produced by a known method like coextrusion molding, multilayer injection molding, and dry lamination.

The lamination constitution of the laminate of the invention is not specifically limited, and it may contain two or more of the layer A and layer B as long as it has a constitution in which the layer A and the layer B are laminated on each other. Further, when two or more layers are contained, they may the same or different from each other. Further, the laminate of the invention may also contain a layer other than those above (herein below, referred to as layer C). Specific examples of the layer C include a polyester layer, a polyamide layer, and a polyimide layer, but not limited thereto. Specific examples of the layer constitution in the laminate of the invention include layer A/layer B, layer A/layer B/layer A, layer A/layer B/layer A/layer B/layer A, layer B/layer A/layer B, layer A/layer B/layer B/layer A, layer A/layer B/layer C/layer B/layer A, layer A/layer B/layer C/layer A, layer A/layer B/layer C, but not limited thereto.

Thickness of each layer is not specifically limited as long as the laminate of the invention has a constitution in which the layer A and the layer B are laminated on each other. However, thickness of the layer A and layer B is 0.001 to 5 mm, preferably 0.01 to 3 mm, and most preferably 0.1 to 1.6 mm. When the laminate of the invention contains two or more layers, thickness of the layers may be the same or different from each other. Further, thickness of each layer may be either even or uneven. Even thickness is preferable.

The method for producing the laminate of the invention is not specifically limited, and it can be produced by a known method like coextrusion molding, multilayer injection molding, and dry lamination. For example, for a laminate having a constitution in which the layer A and layer B are laminated on each other, it is preferably produced by coextrusion molding, and it can be carried out by lamination inside a die in which components of each layer are brought into contact with each other inside a die or lamination outside a die in which they are brought into contact with each other outside a die. The extrusion temperature can be appropriately selected, but is 150 to 300° C., or preferably 180 to 250° C.

It is also possible that the layer A and layer B contained in the laminate of the invention is added with various adhesives or surface of the layer may be coated with them depending on the purpose of use. Further, a laminate in which a hard coat layer is further provided on the surface of the layer can be also used.

The laminate obtained according to above can be used for various applications. For example, when a laminate having a constitution of (sheet of the invention/polycarbonate resin layer/sheet of the invention) or a laminate having a constitution of (sheet of the invention/poly(methyl methacrylate)/sheet of the invention) is inserted between two glass plates, a laminated glass with excellent penetration resistance can be provided. Further, a laminate having a constitution of (polycarbonate resin layer/sheet of the invention/polycarbonate resin layer) or a laminate having a constitution of (poly(methyl methacrylate) resin layer/sheet of the invention/poly(methyl methacrylate)resin layer) is lightweight and has high transparency and high strength, and it is suitably used as a laminate having excellent soundproof property that is inherent to the sheet of the invention.

The sheet or laminate of the invention is inserted between glasses and preferably used as a laminated glass. In other words, the film or laminate of the invention is preferably used as an intermediate film of a laminated glass. Herein below, it is explained in greater detail. The glass used for a laminated glass of the invention is not specifically limited, and examples of the glass that can be used include an inorganic glass like a float plate glass, a polished plate glass, a figure plate glass, a wire mesh plate glass, a heat-absorbing plate glass, a heat-reflecting glass, and a reinforced glass, and a known organic glass like poly(methyl methacrylate) and polycarbonate. They can be colorless or colored, and also transparent or opaque. The glass may be used either singly or in combination of two or more. Further, although not specifically limited, the thickness of the glass is preferably 100 mm or less. More preferably, it is 50 mm or less. Still more preferably, it is 1 to 10 mm.

The method for producing the laminated glass of the invention is not specifically limited, and it can be produced according to a conventionally known method. For example, the intermediate film of a laminated glass of the invention is inserted between two float plate glasses, placed in a vacuum pack, and maintained in vacuum state for 30 min at 100° C., or the intermediate film of a laminated glass of the invention is inserted between two float plate glasses and treated with nip roll under heating at 30 to 120° C. for pre-compression. By treating the pre-compressed body in an autoclave at 120 to 150° C. under pressure of 1.5 to 20 kg/cm$^2$, a laminated glass can be obtained.

When the laminate of the invention is used as an intermediate film of a laminated glass, constitution of the laminate is not specifically limited. However, it is preferable that a suitable layer having adhesiveness with a glass is present on the outermost layer of the laminate of the invention. In particular, when an inorganic glass is used as a glass, the outermost layer is preferably the layer A having excellent adhesiveness with a glass. The outer most layer is the layer A. Specific examples of the laminate of the invention include layer A/layer B/layer A, layer A/layer B/layer C/layer B/layer A, and layer A/layer B/layer C/layer A.

When the laminate of the invention is used as an intermediate film of a laminated glass, shape of the outermost layer of the laminate is not specifically limited. However, considering the handlability (defoamability) at the time of laminating with a glass, a concave/convex structure formed on the outermost surface of the laminate by a known method like Meltfracture and embossing is preferable.

Further, as used as an encapsulant for a solar cell module, the laminate of the invention is preferably used in a field in which a soundproof property is required, in particular, a building integrated photovoltaic solar cell like BIPV. It is explained herein below. The type of the solar cell used for the solar cell module of the invention is not specifically limited. Examples thereof include a crystal type like monocrystal silicone and polycrystal silicone, a thin film silicone type like amorphous silicone and a laminate of amorphous silicone and a polycrystal thin film, a thin film type like a chemical semiconductor type using CIS, CIGS, CdTe, or GaAs, and an organic solar cell type.

Basic constitution of the solar cell module includes an electric generating element (cell) consisting of a silicon compound like crystal silicone and amorphous silicone, or CIS, CIGS, CdS/CdTe, GaAs, or the like, and an organic polymer encapsulant for protecting the element against an external shock, in which they are inserted between glasses, laminate resin sheets, or monolayer resin sheets to give a laminate for protecting an encapsulant or blocking moisture which causes a cell deterioration.

For example, a schematic diagram of the solar cell module in which crystal silicone is encapsulated is illustrated in FIG. 1. The sheet or laminate of the invention is used as flexible organic polymer encapsulant 2 to encapsulate the solar cell 3 (electric generating element) which consists of crystal silicone. As for the laminate resin sheet 1 used for such module, a sheet in which a resin layer having low water permeability like polyethylene terephthalate and polyethylene 2,6-naphthalate and a resin having high weatherability like fluorine-containing resin are used for the innermost layer (i.e. a layer in contact with the encapsulant 2), i.e. the laminate sheet 1 having constitution of (resin layer with low water permeability/resin layer with weatherability), is generally used. Further, a monolayer resin sheet can be used instead of the laminate resin sheet 1. Examples of the monolayer resin sheet include a polyester sheet with weatherability which is commonly used, and a sheet to which inorganic materials are deposited, laminated, or dispersed therein for increasing the water impermeability can be also used.

Figure 2:
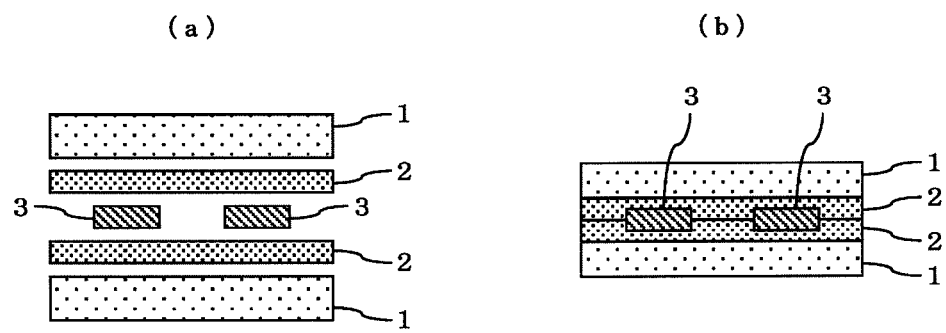
FIG. 2 is a schematic drawing which illustrates an exemplary solar cell module in which the laminate of the invention and crystal type solar cell are used.

When the solar cell used in the solar cell module of the invention is a crystal type, a constitution illustrated in FIG. 2(b), which is obtained by overlaying the crystal type solar cell 3, the encapsulant 2, a glass and a back sheet 1 or the like (herein below, referred to as a glass) as illustrated in FIG. 2(a) and laminating them, can be mentioned. When at least one of the encapsulant 2 used in this case is the laminate of the invention, it is also possible to use other encapsulants, for example, encapsulants consisting of a known composition of crosslinkable ethylene-vinyl acetate copolymer or composition consisting of plasticized polyvinyl acetal.

Figure 3:
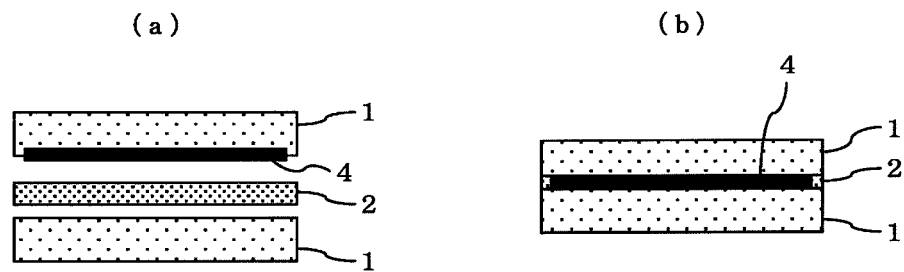
FIG. 3 is a schematic drawing which illustrates an exemplary solar cell module in which the laminate of the invention and thin film type solar cell are used.

Further, when the solar cell used in the solar cell module of the invention is a thin film type, a constitution illustrated in FIG. 3(b), which is obtained by overlaying a glass having a surface deposited with the solar cell 4 (it may not also contain a transparent electrode layer containing ITO, ATO, or FTO) as illustrated in FIG. 3(a), the encapsulant 2, and the glass 1 and laminating them, can be mentioned. Similar to the above, as encapsulant 2, encapsulants consisting of a composition of crosslinkable ethylene-vinyl acetate copolymer or composition consisting of plasticized polyvinyl acetal can be also used in combination, if necessary.

Except that the sheet of the invention is used as the encapsulant 2, the solar cell module of the invention may have a known constitution. For example, it may include an electrode for connecting the solar cell 3, a transparent electrode, or the like.

The method of producing the solar cell module of the invention is not specifically limited. For example, glass (a layer of electric generating element like amorphous silicone and CIGS may be formed on the surface of the encapsulant 2)/sheet or laminate of the invention (encapsulant 2)/laminate resin sheet 1 are laminated and treated according to a conventionally known method, for example, heated and compressed in a vacuum laminator at the temperature of 100 to 180° C., preferably 115 to 175° C., and more preferably 120 to 170° C., with deaeration time of 0.1 to 10 min, press pressure of 0.1 to 20 kg/cm², and press time of 1 to 120 min to encapsulate the crystal silicone 3.

The glass used in the invention is not specifically limited, and examples of the glass that can be used include an inorganic glass like a float plate glass, a polished plate glass, a figure plate glass, a wire mesh plate glass, and a heat-absorbing plate glass and a known organic glass. Further, the back sheet is not specifically limited either, but those having excellent weatherability and low water permeability are preferably used. For example, a polyester film, a fluoro-resin film, a laminate thereof, and the film laminated with an inorganic film can be used.

The solar cell module of the invention can be further combined with a known frame, a junction box, a sealing material, an attached jig and board, an anti-reflection film, various facilities using solar energy, a gutter structure, or the like.

The laminated glass and the solar cell module of the invention can be produced according to a conventionally known method, and examples include a method of using a vacuum laminator, a method of using a vacuum bag, a method of using a vacuum ring, and a method of using nip roll. Further, a method of introducing to an autoclave process after pre-compression can be also carried out.

When a vacuum laminator is used, the lamination is carried out by using a known apparatus used for production of a solar cell under the reduced pressure of 1 to 30000 Pa, and temperature of 100 to 200° C., in particular 130 to 160° C. Further, the method of using a vacuum bag or a vacuum ring is described in the detailed description of European Patent No. 1 235 683, and the lamination is carried out under the pressure of about 20000 Pa, and temperature of 130 to 145° C., for example.

When a nip roll is used, a method of carrying out the first pre-compression at the temperature lower than the flow beginning temperature of the plasticized polyvinyl acetal resin and an additional pre-compression at the temperature close to the flow beginning temperature can be mentioned. For example, it is heated at 30 to 70° C. by using an infrared heater or the like, released from the roll, further heated at 50 to 120° C., and compressed with a roll for adhesion or pre-adhesion.

The autoclave process which is additionally carried out after the pre-compression is carried out, for example, under the pressure of about 1 to 1.5 MPa, at the temperature of 130 to 145° C. for 0.5 to 2 hours, although it may vary depending on thickness and constitution of a module and a laminated glass.

The haze value of the laminated glass obtained as above is not specifically limited. Lower haze value is preferable. Preferred range is 5% or less. More preferred range is 3% or less, and still more preferred range is 1% or less.

EXAMPLES

Herein below, the invention is explained in greater detail in view of the examples, but the invention is not limited to them. Further, as used in the following examples, the term "%" and "parts" means "% by mass" and "parts by mass", respectively, unless specifically described otherwise.

Synthetic Example 1

Production of Polyvinyl Acetal

To a 10 L (liter) glass vessel equipped with a reflux condenser, a thermometer, and an anchor type stirring wing, 8100 g of ion exchange water and 660 g of polyvinyl alcohol (PVA-1) (viscosity average degree of polymerization: 1700, saponification degree: 99 mol %) (PVA concentration: 7.5%) were added and completely dissolved by increasing the temperature to 95° C. Then, under stirring at 120 rpm, the mixture was gradually cooled to 5° C. over about 30 min and added with 384 g of n-butyl aldehyde and 540 mL of 20% hydrochloric acid for performing the butyralization for 150 min. The temperature was increased to 50° C. over 60 min, maintained at 50° C. for 120 min, and then cooled to room temperature. The precipitated resin was washed with ion exchange water, added with an excess amount of an aqueous solution of sodium hydroxide, washed again, and dried to obtain polyvinyl butyral (PVB-1). The PVB-1 obtained has degree of butyralization (average degree of acetalation) of 69 mol %, vinyl acetate group content of 1 mol %, and vinyl alcohol group content of 30 mol %. The acid value was 0.1 mgKOH/g. The degree of butyralization of PVB-1, the content of residual vinyl acetate group, and the acid value were measured according to JIS K6728.

Synthetic Example 2

Polyvinyl butyral (PVB-2) was obtained in the same manner as the Synthetic Example 1 except that the use amount of n-butyl aldehyde and hydrochloric acid is changed to 420 g and 820 mL, respectively, and the reaction temperature after temperature increase is changed to 65° C. The degree of butyralization of the PVB-2 was 75 mol %, content of vinyl acetate is 1 mol %, content of the vinyl alcohol group is 24 mol %, and the acid value is 0.1 mgKOH/g.

Synthetic Example 3

Production of Polyester

To a 500 mL separable flask, 100 g of 3-methyl-1,5-pentane diol and 93 g of adipic acid were added and the esterification reaction was carried out under normal pressure at 200° C. while removing from the system the water generated. When the acid value is 30 mgKOH/g or less, as a catalyst, 5 mg of tetraisopropyl titanate was added and the reaction was continued under reduced pressure of 100 to 200 mmHg. Once the acid value reaches 1 mgKOH/g, vacuum degree was slowly increased by using a vacuum pump to complete the reaction. After that, the mixture was cooled to 100° C., added with 5 g of water, and reacted for 2 hours under stirring to deactivate the catalyst. By removing water under reduced pressure, polyester (PEs-1: hydroxylated polyester, number of hydroxyl group per molecule=2) was obtained.

(Measurement of Melting Point of Polyester)

According to JIS K7121, melting point of the PEs-1 was measured by DSC (differential scanning calorimetry). As a result, it was found to be lower than −20° C. or amorphous (if no melting point of −20° C. or above is observed when the measurement is carried out in the temperature range of −20°

C. to 100° C., it is determined as "lower than −20° C. or amorphous", and it is simply described as "<−20" in the Table 1).

(Measurement of Hydroxyl Value of Polyester)

The measurement was carried out according to JIS K1557.

(Measurement of Acid Value of Polyester)

The measurement was carried out according to JIS K1557.

(Number Average Molecular Weight Based on GPC Measurement of Polyester)

The measurement was carried out under the following conditions. Column for measurement: Shodex GPC KF-802, KF-802.5, KF-803 in series (manufactured by Showa Denko K.K.), measurement temperature: 40° C., solution: THF 0.1% solution, flow rate: 1 mL/min, detector: IR, reference sample: polystyrene.

(Content of Mutual Copolymers of Polyvalent Carboxylic Acid and Polyhydric Alcohol in Polyester)

GPC measurement was carried out in the same manner as (Number average molecular weight based on GPC measurement of polyester). From the result obtained (i.e. an area value), it was calculated according to the following equation (2).

[Formula 2]

$$100 \times [(\text{Total area value}) - (\text{Area value of compound other than polymer})]/(\text{Total area value}) \quad (2)$$

(Number Average Molecular Weight Based on Hydroxyl Value of Polyester)

It was calculated according to the following equation (3).

[Formula 3]

$$(\text{Number average molecular weight based on hydroxyl value}) = 1,000 \times 56 \times (\text{Number of hydroxyl group in molecule})/(\text{Hydroxyl value}) \quad (3)$$

(Average Carbon Atom Number)

Based on the amount of polyvalent carboxylic acid and the amount of polyhydric alcohol that are used as a raw material for synthesis and the amount of polyvalent carboxylic acid and the amount of polyhydric alcohol removed from the reactor during synthesis of the polyester, the amount of a group derived from polyvalent carboxylic acid and the amount of a group derived from polyhydric alcohol contained in the polyester were calculated.

Synthetic Example 4

Polyester (PEs-2: hydroxylated polyester, number of hydroxyl group per molecule=2) was obtained in the same manner as the Synthetic Example 3 except that the use amount of adipic acid is changed to 97 g. Analysis result of the PEs-2 is given in the Table 1.

Synthetic Example 5

Polyester (PEs-3: hydroxylated polyester, number of hydroxyl group per molecule=2) was obtained in the same manner as the Synthetic Example 3 except that the use amount of adipic acid is changed to 100 g. Analysis result of the PEs-3 is given in the Table 1.

Synthetic Example 6

Polyester (PEs-4: hydroxylated polyester, number of hydroxyl group per molecule=2) was obtained in the same manner as the Synthetic Example 3 except that the use amount of adipic acid is changed to 105 g. Analysis result of the PEs-4 is given in the Table 1.

Synthetic Example 7

Polyester (PEs-5: hydroxylated polyester, number of hydroxyl group per molecule=2) was obtained in the same manner as the Synthetic Example 3 except that 50 g of 3-methyl-1,5-pentane diol and 68 g of 1,9-nonane diol are used instead of 100 g of 3-methyl-1,5-pentane diol. Analysis result of the PEs-5 is given in the Table 1.

Synthetic Example 8

Polyester (PEs-6: hydroxylated polyester, number of hydroxyl group per molecule=2) was obtained in the same manner as the Synthetic Example 3 except that 136 g of a mixture of 1,9-nonane diol and 2-methyl-1,8-octane diol (mixing ratio=85:15) is used instead of 100 g of 3-methyl-1,5-pentane diol. Analysis result of the PEs-6 is given in the Table 1.

Synthetic Example 9

Polyester (PEs-7: hydroxylated polyester, number of hydroxyl group per molecule=2) was obtained in the same manner as the Synthetic Example 3 except that 171 g of 1,12-dodecane diol is used instead of 100 g of 3-methyl-1,5-pentane diol. Analysis result of the PEs-7 is given in the Table 1.

Synthetic Example 10

Polyester (PEs-8: hydroxylated polyester, number of hydroxyl group per molecule=3) was obtained in the same manner as the Synthetic Example 3 except that a mixture of 3-methyl-1,5-pentane diol (60 g) and glycerin (28 g) is used instead of 100 g of 3-methyl-1,5-pentane diol. Analysis result of the PEs-8 is given in the Table 1.

Synthetic Example 11

Polyester (PEs-9: hydroxylated polyester, number of hydroxyl group per molecule=2) was obtained in the same manner as the Synthetic Example 3 except that 131 g of sebacic acid used instead of 95 g of adipic acid. Analysis result of the PEs-9 is given in the Table 1.

Synthetic Example 12

The reaction was carried out in the same manner as the Synthetic Example 11 except that use amount of sebacic acid is changed to 134 g to obtain polyester (PEs-10: hydroxylated polyester, number of hydroxyl group per molecule=2). Analysis result of the PEs-10 is given in the Table 1.

Synthetic Example 13

The reaction was carried out in the same manner as the Synthetic Example 11 except that use amount of sebacic acid is changed to 138 g to obtain polyester (PEs-11: hydroxylated polyester, number of hydroxyl group per molecule=2). Analysis result of the PEs-10 is given in the Table 1.

Synthetic Example 14

The reaction was carried out in the same manner as the Synthetic Example 3 except that 112 g of cyclohexane dicarboxylic acid is used instead of 95 g of adipic acid to obtain polyester (PEs-12: hydroxylated polyester, number of hydroxyl group per molecule=2). Analysis result of the PEs-12 is given in the Table 1.

Synthetic Example 15

The reaction was carried out in the same manner as the Synthetic Example 3 except that 80 g of adipic acid and 17 g of isophthalic acid are used instead of 95 g of adipic acid to obtain polyester (PEs-13: hydroxylated polyester, number of hydroxyl group per molecule=2). Analysis result of the PEs-13 is given in the Table 1.

Synthetic Example 16

The reaction was carried out in the same manner as the Synthetic Example 3 except that 76 g of succinic acid is used instead of 95 g of adipic acid to obtain polyester (PEs-14: hydroxylated polyester, number of hydroxyl group per molecule=2). Analysis result of the PEs-14 is given in the Table 1.

Synthetic Example 17

The reaction was carried out in the same manner as the Synthetic Example 3 except that 31 g of 2-ethyl hexanoic acid is added at the beginning of the reaction to obtain polyester (PEs-15). Analysis result of the PEs-15 is given in the Table 1.

Synthetic Example 18

The reaction was carried out in the same manner as the Synthetic Example 17 except that addition amount of 2-ethyl hexanoic acid is changed to 53 g to obtain polyester (PEs-16). Analysis result of the PEs-16 is given in the Table 1.

Synthetic Example 19

The reaction was carried out in the same manner as the Synthetic Example 17 except that addition amount of 2-ethyl hexanoic acid is changed to 104 g and unreacted 2-ethyl hexanoic acid is removed under reduced pressure after deactivating the catalyst to obtain polyester (PEs-17). Analysis result of the PEs-17 is given in the Table 1.

Synthetic Example 20

The reaction was carried out in the same manner as the Synthetic Example 5 except that 27 g of 2-ethyl hexanoic acid is added at the beginning of the reaction and unreacted 2-ethyl hexanoic acid is removed under reduced pressure after deactivating the catalyst to obtain polyester (PEs-18). Analysis result of the PEs-18 is given in the Table 1.

TABLE 1

| No. | Polyvalent carboxylic acid | Polyhydric alcohol | Monovalent carboxylic acid | Content of polymers (% by mass) | Hydroxyl value (mgKOH/g) | Molecular weight (GPC) | Molecular weight (Hydroxyl value) | Melting point (°C.) | Acid value (mgKOH/g) | Average carbon atom number |
|---|---|---|---|---|---|---|---|---|---|---|
| PEs-1 | Adipic acid | MPD | — | 93 | 226 | 369 | 496 | <−20 | 0.1 | 12.0 |
| PEs-2 | Adipic acid | MPD | — | 97 | 106 | 920 | 1057 | <−20 | 0.2 | 12.0 |
| PEs-3 | Adipic acid | MPD | — | 99 | 55 | 3790 | 2036 | <−20 | 0.1 | 12.0 |
| PEs-4 | Adipic acid | MPD | — | 99 | 30 | 7450 | 3733 | <−20 | 0.1 | 12.0 |
| PEs-5 | Adipic acid | 1,9-Nonane diol/MPD | — | 92 | 197 | — | 569 | 21 | 0.1 | 13.5 |
| PEs-6 | Adipic acid | 1,9-Nonane diol/2-Methyl-1,8-octane diol | — | 92 | 201 | — | 557 | <−20 | 0.1 | 15.0 |
| PEs-7 | Adipic acid | 1,12-dodecane diol | — | 92 | 188 | — | 596 | <−20 | 0.3 | 18.0 |
| PEs-8 | Adipic acid | MPD/Glycerin | — | 88 | 340 | — | 494 | <−20 | 0.1 | 10.9 |
| PEs-9 | Sebacic acid | MPD | — | 93 | 189 | — | 593 | <−20 | 0.9 | 16.0 |
| PEs-10 | Sebacic acid | MPD | — | 97 | 100 | — | 1120 | <−20 | 0.4 | 16.0 |
| PEs-11 | Sebacic acid | MPD | — | 99 | 49 | — | 2286 | <−20 | 0.3 | 16.0 |
| PEs-12 | Cyclohexane dicarboxylic acid | MPD | — | 92 | 221 | — | 507 | <−20 | 0.5 | 14.0 |
| PEs-13 | Adipic acid/Isophthalic acid | MPD | — | 96 | 120 | — | 933 | <−20 | 0.7 | 12.3 |
| PEs-14 | Succinic acid | MPD | — | 92 | 218 | — | 514 | <−20 | 0.3 | 11.0 |
| PEs-15 | Adipic acid | MPD | 2-Ethyl hexanoic acid | 92 | 145 | 453 | — | <−20 | 1 | 12.0 |
| PEs-16 | Adipic acid | MPD | 2-Ethyl hexanoic acid | 92 | 95 | 480 | — | <−20 | 0.9 | 12.0 |
| PEs-17 | Adipic acid | MPD | 2-Ethyl hexanoic acid | 91 | 6 | 502 | — | <−20 | 1.2 | 12.0 |
| PEs-18 | Adipic acid | MPD | 2-Ethyl hexanoic acid | 99 | 2 | 3870 | — | <−20 | 1.5 | 12.0 |

MPD: 3-Methyl-1,5-pentane diol

Synthetic Example 21

To a 500 mL separable flask, 110 g of 3-methyl-1,5-pentane diol, 335 g of s-caprolactone, and 0.5 mg of tetrabutyl titanate were added and the reaction was carried out for 5 hours at 165° C. under nitrogen atmosphere. After that, unreacted s-caprolactone was removed under reduced pressure to obtain polyester (PEs-19: hydroxylated polyester, number of hydroxyl group per molecule=2). Analysis result of the PEs-19 is given in the Table 2.

Synthetic Example 22

To a 1 L separable flask, 135 g of 1,4-cyclohexane dimethanol, 370 g of s-caprolactone, and 0.5 mg of tetrabutyl titanate were added and the reaction was carried out for 10 hours at 165° C. under nitrogen atmosphere. After that, unreacted ε-caprolactone was removed under reduced pressure to obtain polyester (PEs-20: hydroxylated polyester, number of hydroxyl group per molecule=2). Analysis result of the PEs-20 is given in the Table 2.

Synthetic Example 23

To a 500 mL separable flask, 50 g of ethylene glycol and 400 g of β-methyl-δ-valero lactone were added and the temperature was adjusted to 30° C. with stirring under nitrogen atmosphere. Then, 2 g of 1,8-diazabicyclo[5,4,0]-7-undecene was added and the reaction was carried out for 25 hours. After that, unreacted β-methyl-δ-valerolactone was removed under reduced pressure to obtain polyester (PEs-21: hydroxylated polyester, number of hydroxyl group per molecule=2). Analysis result of the PEs-21 is given in the Table 2.

(PEs-23: hydroxylated polyester, number of hydroxyl group per molecule=2). Analysis result of the PEs-23 is given in the Table 2.

Synthetic Example 26

The reaction was carried out in the same manner as the Synthetic Example 3 except that 110 g of terephthalic acid is used instead of adipic acid to obtain polyester (PEs-24: number of hydroxyl group per molecule=2). Analysis result of the PEs-24 is given in the Table 2.

Synthetic Example 27

The reaction was carried out in the same manner as the Synthetic Example 5 except that 136 g of 1,9-nonane diol is used instead of 3-methyl-1,5-pentane diol to obtain polyester (PEs-25: number of hydroxyl group per molecule=2). Analysis result of the PEs-25 is given in the Table 2.

TABLE 2

| No. | Polyvalent carboxylic acid or carbonate esters | Polyhydric alcohol | Hydroxyl carboxylic acid | Content of polymers (% by mass) | Hydroxyl value (mgKOH/g) | Molecular weight (Hydroxyl value) | Melting point (° C.) | Acid value (mgKOH/g) | Average carbon atom number |
|---|---|---|---|---|---|---|---|---|---|
| PEs-19 | — | MPD | ε-Caprolactone | 99 | 199 | 563 | 15 | 1 | 6.0 |
| PEs-20 | — | 1,4-Cyclohexane dimethanol | ε-Caprolactone | 99 | 212 | 528 | 13 | 0.1 | 6.0 |
| PEs-21 | — | Ethylene glycol | β-Methyl-δ-valerolactone | 99 | 237 | 473 | <−20 | 0.1 | 6.0 |
| PEs-22 | Diethyl carbonate | MPD | — | 93 | 222 | 505 | <−20 | 0.1 | 6.0 |
| PEs-23 | Diethyl carbonate | MPD/1,10-Dodecane diol | — | 93 | 230 | 487 | <−20 | 0.1 | 8.0 |
| PEs-24 | Terephthalic acid | MPD | — | 97 | 130 | 862 | 43 | 0.3 | 14.0 |
| PEs-25 | Adipic acid | 1,9-Nonane diol | — | 98 | 62 | 1806 | 37 | 0.6 | 15.0 |

MPD: 3-Methyl-1,5-pentane diol

Synthetic Example 24

To a 500 mL separable flask, 175 g of diethyl carbonate, 195 g of 3-methyl-1,5-pentane diol, and 38 mg of tetraisopropyl titanate were added and the diethyl carbonate was refluxed under nitrogen atmosphere. The reaction was carried out while removing the ethanol generated according to the progress of the reaction simultaneously with diethyl carbonate. Once the elution of ethanol starts to decrease, the temperature was increased to 200° C. and the reaction was further carried out at the same temperature. When the elution of ethanol has stopped, the reaction solution was cooled, depressurized by using a vacuum pump, and heated again to remove unreacted diethyl carbonate. As a result, polyester (PEs-22: hydroxylated polyester, number of hydroxyl group per molecule=2) was obtained. Analysis result of the PEs-22 is given in the Table 2.

Synthetic Example 25

The reaction was carried out in the same manner as the Synthetic Example 24 except that 100 g of 3-methyl-1,5-pentane diol and 140 g of 1,10-dodecane diol are used instead of 175 g of 3-methyl-1,5-pentane diol to obtain polyester Example 1

Production of Composition A-1

40 g of PVB-1 and 16 g of PEs-1 were kneaded in a laboplast mill (150° C., 5 min) to obtain the composition A-1, which was then measured and evaluated with respect to the following items. The results are given in the Table 3.
(Measurement of Acid Value of Composition A-1)
Measurement was carried out according to JIS K6728.
(Measurement of Glass Transition Temperature of Composition A-1)
Dynamic viscoelasticity was measured according to JIS K7198 (frequency number: 1 Hz) and a glass transition temperature of composition A-1 was obtained from the tan δ peak temperature.
(Production of Film A-1)
9 g of the polyvinyl acetal composition-1 was hot pressed (12 kg/cm², 150° C., 30 min) within a frame of 10 cm×10 cm×0.8 mm to obtain the film A-1.
(Evaluation of Phase Separation in Film Over Time)
The film A-1 was kept at 30° C., 25% RH for 30 days, and white cloudiness of the film and floating of the polyester on film surface that are caused by phase separation were determined with a naked eye.

(Evaluation of Plasticizer Migration to Polycarbonate)

A sheet B (PC): 10 cm×10 cm polycarbonate sheet (trade name: Polyca Ace ECK100, manufactured by Sumitomo Bakelite Co., Ltd., thickness: 3 mm) and the film A-1 were overlaid to each other while being careful not to introduce any air bubbles. After heat treatment at 100° C. for 5 hours, a PC laminate was produced. The mass change ratio in the sheet B (PC) after the treatment was obtained according to the following equation (4). Further, the amount of change in haze was measured (haze meter manufactured by Suga Test Instruments Co., Ltd.).

[Formula 4]

$$(\text{Mass change ratio}) = 100 \times [(\text{Mass of the sheet after treatment}) - (\text{Mass of the sheet before treatment})] / (\text{Mass of the sheet before treatment}) \quad (4)$$

(Evaluation of Plasticizer Migration to Poly(Methyl Methacrylate))

A PMMA laminate was produced by the heat treatment as above except that sheet B (PMMA): poly(methyl methacrylate) sheet (trade name: Acrylite, manufactured by Mitsubishi Rayon Co., Ltd., thickness: 2 mm) was used instead of the sheet B (PC). The mass change ratio and haze change in the sheet B (PMMA) after the treatment were obtained. The mass change ratio was calculated according to the above equation (4).

(Evaluation of Plasticizer Migration to Hydrocarbon-Based Polymer)

A PO laminate was produced by the heat treatment as above except that sheet B (PO)-1 obtained by hot press (12 kg/cm$^2$, 200° C., 30 min) of 10 g hydrogenated product of hydrocarbon-based polymer-1: styrene-butadiene-styrene tri block copolymer (weight average molecular weight by GPC analysis: 100,000, content of styrene block: 18% by mass, and hydrogenation ratio of butadiene block=99% by mass) in a frame of 10 cm×10 cm×1 mm was used instead of the sheet B (PC). The mass change ratio and haze change in the sheet B (PO)-1 after the treatment were obtained. The mass change ratio was calculated according to the above equation (4).

(Production of Monolayer Film Laminated Glass)

The film A-1 and two float glass plates (thickness of 4 mm) were overlaid to each other in the order of glass/film A-1/glass while being careful not to introduce any air bubbles. After heat treatment at 145° C., 100 mmHg for 1 hour in a vacuum pack, a monolayer film laminated glass-1 was produced.

(Haze Evaluation)

Haze of the monolayer film laminated glass-1 was evaluated by using a haze meter manufactured by Suga Test Instruments Co., Ltd. As a result, it was found to be 0.6.

(Production of Laminate)

The film A-1 and two sheets of the sheet B (PC) were overlaid to each other in the order of sheet B (PC)/film A-1/sheet B (PC) while being careful not to introduce any air bubbles. After heat treatment at 145° C., 100 mmHg for 1 hour in a vacuum pack, the laminate-1 was produced.

(Haze Evaluation)

Haze of the laminate-1 was evaluated by using a haze meter manufactured by Suga Test Instruments Co., Ltd. As a result, it was found to be 0.6.

(Production of Laminated Glass Containing PC)

Two sheets of the film A-1, two float glass plates (thickness of 4 mm), and the sheet B (PC) were overlaid to each other in the order of glass/film A-1/sheet B (PC)/film A-1/glass while being careful not to introduce any air bubbles. After heat treatment at 145° C., 100 mmHg for 1 hour in a vacuum pack, a laminated glass containing PC was produced.

(Haze Evaluation)

Haze of the laminated glass containing PC was evaluated by using a haze meter manufactured by Suga Test Instruments Co., Ltd. As a result, it was found to be 0.5.

(Production of Laminated Glass Containing PO)

Two sheets of the film A-1, two float glass plates (thickness of 4 mm), and the sheet B (PO)-1 were overlaid to each other in the order of glass/film A-1/sheet B (PO)-1/film A-1/glass while being careful not to introduce any air bubbles. After heat treatment at 145° C., 100 mmHg for 1 hour in a vacuum pack, a laminated glass-1 containing PO was produced.

(Haze Evaluation)

Haze of the laminated glass-1 containing PO was evaluated by using a haze meter manufactured by Suga Test Instruments Co., Ltd. As a result, it was found to be 0.9.

Examples 2 to 4

The composition A-2 to the composition A-4 were obtained in the same manner as the Example 1 except that the use amount of the PEs-1 is changed to 13 g, 19 g, and 22 g, respectively. According to the same method as the Example 1, acid value and glass transition temperature were measured for composition A-2 to the composition A-4. In addition, a film, a PC laminate.PMMA laminate.PO laminate (herein below, referred to as PC laminate or the like), a monolayer film laminated glass, a laminated glass containing PC, and a laminated glass containing PO were produced in the same manner as the Example 1 except that each of the composition A-2 to the composition A-4 is used instead of the composition A-1, and subjected to the same evaluations. The evaluation results are given in the Table 3.

Examples 5 to 24

The composition A-5 to the composition A-24 were obtained in the same manner as the Example 1 except that the PEs-1 is changed to 16 g of PEs-2 to 16 and 19 to 23, respectively. According to the same method as the Example 1, acid value and glass transition temperature were measured for composition A-5 to the composition A-24. In addition, a film, a PC laminate or the like, a monolayer film laminated glass, a laminated glass containing PC, and a laminated glass containing PO were produced in the same manner as the Example 1 except that each of the composition A-5 to the composition A-24 is used instead of the composition A-1, and subjected to the same evaluations. The evaluation results are given in the Table 3.

TABLE 3

| | Polyvinyl acetal | Polyester composition (parts by mass) | Composition | Acid value (mgKOH/g) | Glass transition temperature (°C.) | Phase separation over time | PC Increase in mass (% by mass) | PC Change in haze | PMMA Change in mass (% by mass) | PMMA Change in haze | PO Change in mass (% by mass) | PO Change in haze | Haze of monolayer film laminated glass | Haze of laminated glass containing PC | Haze of laminated glass containing PO |
|---|---|---|---|---|---|---|---|---|---|---|---|---|---|---|---|
| Ex. 1 | PVB-1 | PEs-1 (40) | A-1 | 0.1 | 28 | No | <0.1 | <0.1 | <0.1 | <0.1 | <0.1 | <0.1 | 0.6 | 0.5 | 0.9 |
| Ex. 2 | PVB-1 | PEs-1 (32.5) | A-2 | 0.1 | 45 | No | <0.1 | <0.1 | <0.1 | <0.1 | <0.1 | <0.1 | 0.7 | 0.7 | 0.8 |
| Ex. 3 | PVB-1 | PEs-1 (47.5) | A-3 | 0.1 | 16 | No | <0.1 | <0.1 | <0.1 | <0.1 | <0.1 | <0.1 | 1.0 | 1.0 | 1.0 |
| Ex. 4 | PVB-1 | PEs-1 (55) | A-4 | 0.1 | 10 | No | <0.1 | <0.1 | <0.1 | <0.1 | <0.1 | <0.1 | 1.6 | 1.8 | 1.7 |
| Ex. 5 | PVB-1 | PEs-2 (40) | A-5 | 0.1 | 36 | No | <0.1 | <0.1 | <0.1 | <0.1 | <0.1 | <0.1 | 0.8 | 0.8 | 0.9 |
| Ex. 6 | PVB-1 | PEs-3 (40) | A-6 | 0.1 | 54 | No | <0.1 | <0.1 | <0.1 | <0.1 | <0.1 | <0.1 | 1.0 | 1.0 | 1.1 |
| Ex. 7 | PVB-1 | PEs-4 (40) | A-7 | 0.1 | 63 | No | <0.1 | <0.1 | <0.1 | <0.1 | <0.1 | <0.1 | 1.2 | 1.3 | 1.2 |
| Ex. 8 | PVB-1 | PEs-5 (40) | A-8 | 0.2 | 30 | No | <0.1 | <0.1 | <0.1 | <0.1 | <0.1 | <0.1 | 0.9 | 1.0 | 0.9 |
| Ex. 9 | PVB-1 | PEs-6 (40) | A-9 | 0.7 | 28 | No | <0.1 | <0.1 | <0.1 | <0.1 | <0.1 | <0.1 | 0.9 | 0.9 | 0.9 |
| Ex. 10 | PVB-1 | PEs-7 (40) | A-10 | 0.4 | 38 | No | <0.1 | <0.1 | <0.1 | <0.1 | <0.1 | <0.1 | 1.0 | 1.5 | 1.1 |
| Ex. 11 | PVB-1 | PEs-8 (40) | A-11 | 0.4 | 30 | No | <0.1 | <0.1 | <0.1 | <0.1 | <0.1 | <0.1 | 0.9 | 1.0 | 0.9 |
| Ex. 12 | PVB-1 | PEs-9 (40) | A-12 | 0.3 | 36 | No | <0.1 | <0.1 | <0.1 | <0.1 | <0.1 | <0.1 | 0.8 | 0.9 | 0.8 |
| Ex. 13 | PVB-1 | PEs-10 (40) | A-13 | 0.4 | 31 | No | <0.1 | <0.1 | <0.1 | <0.1 | <0.1 | <0.1 | 1.0 | 1.0 | 1.2 |
| Ex. 14 | PVB-1 | PEs-11 (40) | A-14 | 0.4 | 36 | No | <0.1 | <0.1 | <0.1 | <0.1 | <0.1 | <0.1 | 0.9 | 0.9 | 0.9 |
| Ex. 15 | PVB-1 | PEs-12 (40) | A-15 | 1.0 | 42 | No | <0.1 | <0.1 | <0.1 | <0.1 | <0.1 | <0.1 | 1.0 | 1.0 | 1.0 |
| Ex. 16 | PVB-1 | PEs-13 (40) | A-16 | 1.2 | 35 | No | <0.1 | <0.1 | <0.1 | <0.1 | <0.1 | <0.1 | 0.8 | 1.0 | 0.9 |
| Ex. 17 | PVB-1 | PEs-14 (40) | A-17 | 0.1 | 40 | No | <0.1 | <0.1 | <0.1 | <0.1 | <0.1 | <0.1 | 0.9 | 0.9 | 1.1 |
| Ex. 18 | PVB-1 | PEs-15 (40) | A-18 | 0.9 | 34 | No | 0.5 | 5.2 | 0.1 | 1.5 | 0.5 | 4.9 | 1.0 | 3.0 | 3.8 |
| Ex. 19 | PVB-1 | PEs-16 (40) | A-19 | 1.2 | 27 | No | 1.1 | 11.3 | 0.2 | 3.3 | 1 | 9.5 | 1.3 | 8.9 | 6.2 |
| Ex. 20 | PVB-1 | PEs-19 (40) | A-20 | 0.1 | 25 | No | <0.1 | <0.1 | <0.1 | <0.1 | <0.1 | <0.1 | 0.7 | 0.8 | 0.7 |
| Ex. 21 | PVB-1 | PEs-20 (40) | A-21 | 0.1 | 29 | No | <0.1 | <0.1 | <0.1 | <0.1 | <0.1 | <0.1 | 0.7 | 0.7 | 0.7 |
| Ex. 22 | PVB-1 | PEs-21 (40) | A-22 | 0.1 | 30 | No | <0.1 | <0.1 | <0.1 | <0.1 | <0.1 | <0.1 | 0.9 | 1.2 | 1.0 |
| Ex. 23 | PVB-1 | PEs-22 (40) | A-23 | 0.1 | 29 | No | <0.1 | <0.1 | <0.1 | <0.1 | <0.1 | <0.1 | 1.0 | 1.0 | 1.2 |
| Ex. 24 | PVB-1 | PEs-23 (40) | A-24 | 0.1 | 37 | No | <0.1 | <0.1 | <0.1 | <0.1 | <0.1 | <0.1 | 1.1 | 1.2 | 1.3 |

PMMA: Poly(methyl methacrylate)
PO: Hydrocarbon-based polymer-1: Hydrogenated molecule of Styrene-Butadiene-Styrene triblock copolymer Examples 25 to 48

The composition A-25 to the composition A-48 were obtained in the same manner as the Examples 1 to 24 except that the PVB-1 is changed to 40 g of PVB-2. According to the same method as the Example 1, acid value and glass transition temperature were measured for composition A-25 to the composition A-48. In addition, a film, a PC laminate or the like, a monolayer film laminated glass, a laminated glass containing PC, and a laminated glass containing PO were produced in the same manner as the Example 1 except that each of the composition A-25 to the composition A-48 is used instead of the composition A-1, and subjected to the same evaluations. The evaluation results are given in the Table 4.

TABLE 4

| | Polyvinyl acetal | Polyester composition (parts by mass) | Composition | Acid value (mgKOH/g) | Glass transition temperature (°C.) | Phase separation over time | PC Increase in mass (% by mass) | PC Change in haze | PMMA Change in mass (% by mass) | PMMA Change in haze | PO Change in mass (% by mass) | PO Change in haze | Haze of monolayer film laminated glass | Haze of laminated glass containing PC | Haze of laminated glass containing PO |
|---|---|---|---|---|---|---|---|---|---|---|---|---|---|---|---|
| Ex. 25 | PVB-2 | PEs-1 (40) | A-25 | 0.1 | 25 | No | <0.1 | <0.1 | <0.1 | <0.1 | <0.1 | <0.1 | 0.8 | 1.0 | 0.8 |
| Ex. 26 | PVB-2 | PEs-1 (32.5) | A-26 | 0.1 | 36 | No | <0.1 | <0.1 | <0.1 | <0.1 | <0.1 | <0.1 | 0.9 | 1.0 | 0.9 |
| Ex. 27 | PVB-2 | PEs-1 (47.5) | A-27 | 0.1 | 14 | No | <0.1 | <0.1 | <0.1 | <0.1 | <0.1 | <0.1 | 1.5 | 1.6 | 1.6 |
| Ex. 28 | PVB-2 | PEs-1 (55) | A-28 | 0.1 | 9 | No | <0.1 | <0.1 | <0.1 | <0.1 | <0.1 | <0.1 | 1.6 | 1.8 | 1.6 |
| Ex. 29 | PVB-2 | PEs-2 (40) | A-29 | 0.1 | 32 | No | <0.1 | <0.1 | <0.1 | <0.1 | <0.1 | <0.1 | 0.8 | 0.8 | 0.8 |
| Ex. 30 | PVB-2 | PEs-3 (40) | A-30 | 0.1 | 41 | No | <0.1 | <0.1 | <0.1 | <0.1 | <0.1 | <0.1 | 1.1 | 1.1 | 1.3 |
| Ex. 31 | PVB-2 | PEs-4 (40) | A-31 | 0.1 | 53 | No | <0.1 | <0.1 | <0.1 | <0.1 | <0.1 | <0.1 | 1.2 | 1.3 | 1.2 |
| Ex. 32 | PVB-2 | PEs-5 (40) | A-32 | 0.2 | 28 | No | <0.1 | <0.1 | <0.1 | <0.1 | <0.1 | <0.1 | 0.8 | 0.8 | 0.8 |
| Ex. 33 | PVB-2 | PEs-6 (40) | A-33 | 0.6 | 28 | No | <0.1 | <0.1 | <0.1 | <0.1 | <0.1 | <0.1 | 0.8 | 0.9 | 1.0 |
| Ex. 34 | PVB-2 | PEs-7 (40) | A-34 | 0.4 | 36 | No | <0.1 | <0.1 | <0.1 | <0.1 | <0.1 | <0.1 | 1.0 | 1.1 | 1.1 |
| Ex. 35 | PVB-2 | PEs-8 (40) | A-35 | 0.3 | 28 | No | <0.1 | <0.1 | <0.1 | <0.1 | <0.1 | <0.1 | 0.9 | 0.9 | 0.9 |
| Ex. 36 | PVB-2 | PEs-9 (40) | A-36 | 0.3 | 32 | No | <0.1 | <0.1 | <0.1 | <0.1 | <0.1 | <0.1 | 0.8 | 0.8 | 1.2 |
| Ex. 37 | PVB-2 | PEs-10 (40) | A-37 | 0.4 | 29 | No | <0.1 | <0.1 | <0.1 | <0.1 | <0.1 | <0.1 | 1.2 | 1.2 | 1.1 |
| Ex. 38 | PVB-2 | PEs-11 (40) | A-38 | 0.6 | 33 | No | <0.1 | <0.1 | <0.1 | <0.1 | <0.1 | <0.1 | 0.9 | 0.9 | 0.9 |
| Ex. 39 | PVB-2 | PEs-12 (40) | A-39 | 1.2 | 40 | No | <0.1 | <0.1 | <0.1 | <0.1 | <0.1 | <0.1 | 1.8 | 1.8 | 2.1 |
| Ex. 40 | PVB-2 | PEs-13 (40) | A-40 | 1.4 | 33 | No | <0.1 | <0.1 | <0.1 | <0.1 | <0.1 | <0.1 | 0.8 | 1.0 | 0.9 |
| Ex. 41 | PVB-2 | PEs-14 (40) | A-41 | 0.1 | 37 | No | <0.1 | <0.1 | <0.1 | <0.1 | <0.1 | <0.1 | 0.9 | 0.9 | 0.9 |
| Ex. 42 | PVB-2 | PEs-15 (40) | A-42 | 0.2 | 33 | No | 0.4 | 5.4 | 0.1 | 1.2 | 0.4 | 5.3 | 1.2 | 4.5 | 3.6 |
| Ex. 43 | PVB-2 | PEs-16 (40) | A-43 | 1.0 | 24 | No | 1.1 | 12.7 | 0.2 | 3.3 | 1.1 | 10.2 | 1.4 | 7.8 | 5.7 |

TABLE 4-continued

| | Poly-vinyl acetal | Polyester composition (parts by mass) | Com-posi-tion | Acid value (mgKOH/g) | Glass transition temperature (°C.) | Phase separation over time | PC Increase in mass (% by mass) | PC Change in haze | PMMA Change in mass (% by mass) | PMMA Change in haze | PO Change in mass (% by mass) | PO Change in haze | Haze of monolayer film laminated glass | Haze of laminated glass containing PC | Haze of laminated glass containing PO |
|---|---|---|---|---|---|---|---|---|---|---|---|---|---|---|---|
| Ex. 44 | PVB-2 | PEs-19 (40) | A-44 | 0.9 | 23 | No | <0.1 | <0.1 | <0.1 | <0.1 | <0.1 | <0.1 | 0.9 | 0.9 | 0.9 |
| Ex. 45 | PVB-2 | PEs-20 (40) | A-45 | 0.1 | 27 | No | <0.1 | <0.1 | <0.1 | <0.1 | <0.1 | <0.1 | 0.8 | 1.0 | 0.9 |
| Ex. 46 | PVB-2 | PEs-21 (40) | A-46 | 0.1 | 27 | No | <0.1 | <0.1 | <0.1 | <0.1 | <0.1 | <0.1 | 0.9 | 1.2 | 0.9 |
| Ex. 47 | PVB-2 | PEs-22 (40) | A-47 | 0.1 | 26 | No | <0.1 | <0.1 | <0.1 | <0.1 | <0.1 | <0.1 | 1.0 | 1.0 | 1.0 |
| Ex. 48 | PVB-2 | PEs-23 (40) | A-48 | 0.1 | 36 | No | <0.1 | <0.1 | <0.1 | <0.1 | <0.1 | <0.1 | 0.9 | 0.9 | 0.9 |

PMMA: Poly(methyl methacrylate)
PO: Hydrocarbon-based polymer-1: Hydrogenated molecule of Styrene-Butadiene-Styrene triblock copolymer (NMR Analysis of Hydrocarbon-Based Polymer-2)

The hydrocarbon-based polymer-2 obtained from the Synthetic Example 28 was analyzed by $^1$H-NMR spectrum using deuterated chloroform as a solvent.

(Weight Average Molecular Weight of Hydrocarbon-Based Polymer-2)

Weight average molecular weight of hydrocarbon-based polymer-2, which can be obtained from the Synthetic Example 28, was measured by GPC measurement using tetrahydrofuran as a solvent and polystyrene as a standard. Herein below, condition for GPC measurement is described.
Apparatus: SYSTEM 11 (manufactured by Showa Denko K.K.)
Column: two columns of MIXED-C (manufactured by Polymer Laboratories, Ltd.)
Mobile phase: tetrahydrofuran
Flow amount: 1.0 mL/min
Temperature: 40° C.
Concentration: 0.1%
Injection amount: 100 μL
Detector: RI
Standards: polystyrene (manufactured by Polymer Laboratories, Ltd.)

Synthetic Example 28

Synthesis of Hydrocarbon-Based Polymer

To a 200 L pressure resistant vessel flushed with dry nitrogen, 60 kg of cyclohexane and 35 g of sec-butyl lithium as a polymerization initiator were added followed by addition of 2.9 kg of styrene. After polymerization at 50 to 52° C., 0.17 kg of THF was added and 26.2 kg of butadiene and 2.9 kg of styrene were added in order for polymerization. As a result, a styrene-butadiene-styrene type block copolymer was obtained. The block copolymer obtained was hydrogenated by using Pd/C (palladium carbon) in cyclohexane with hydrogen pressure of 2.1 MPa and reaction temperature of 100° C. to obtain the hydrocarbon-based polymer-2. The hydrocarbon-based polymer-2 obtained has a weight average molecular weight of 100,400, styrene content of 18% by mass, and hydrogenation ratio of 99 mol %.

Other hydrocarbon-based polymers used in the invention are as follows.
Hydrocarbon-Based Polymer-3;
Polystyrene-polyisoprene-polystyrene triblock copolymer (polyisoprene part is completely hydrogenated), total content of polystyrene part=12%, glass transition temperature=−32° C., tan δ peak temperature=−17° C., MFR value (ASTM D1238, load of 2.16 kg) is 0.5 g/10 min at 190° C., tan δ at −20° C.=1.0, tan δ at 0° C.=0.8, tan δ at 20° C.=0.3.
Hydrocarbon-Based Polymer-4;
Polystyrene-polyisoprene-polystyrene triblock copolymer (polyisoprene part is completely hydrogenated), total content of polystyrene part=22%, glass transition temperature=−12° C., tan δ peak temperature=−5° C., MFR value (ASTM D1238, load of 2.16 kg) is 0.7 g/10 min at 190° C., tan δ at −20° C.=0.15, tan δ at 0° C.=0.8, tan δ at 20° C.=0.4.
Hydrocarbon-Based Polymer-5;
Polystyrene-polyisoprene-polystyrene triblock copolymer (polyisoprene part is not hydrogenated), total content of polystyrene part=20%, glass transition temperature=−12° C., tan δ peak temperature=−1° C., MFR value (ASTM D1238, load of 2.16 kg) is 3.8 g/10 min at 190° C., tan δ at −20° C.=0.08, tan δ at 0° C.=1.05, tan δ at 20° C.=0.9.

Examples 49 to 52

A PO laminate was produced in the same manner as the Example 1 by using a sheet obtainable by hot press of the hydrocarbon-based polymer with the film A-1 except that the hydrocarbon-based polymer 2 to 5 is used instead of hydrocarbon-based polymer 1. Then, plasticizer migration to the hydrocarbon-based polymer was evaluated for the PO laminate. The results are given in the Table 5.

TABLE 5

| | | Composition A | | | | PO Laminate | |
|---|---|---|---|---|---|---|---|
| | PVB | Polyester composition (parts by mass) | Acid value [mgKOH/g] | Glass transition temperature (°C.) | Composition B Hydrocarbon-based polymer | Change in haze (%) | Change in mass (%) |
| Ex. 49 | PVB-1 | PEs-1 (40) | 0.1 | 28 | Hydrocarbon-based POlymer-2 | <0.1 | <0.1 |

TABLE 5-continued

| | | Composition A | | | | PO Laminate | |
|---|---|---|---|---|---|---|---|
| | PVB | Polyester composition (parts by mass) | Acid value [mgKOH/g] | Glass transition temperature (° C.) | Composition B Hydrocarbon-based polymer | Change in haze (%) | Change in mass (%) |
| Ex. 50 | PVB-1 | PEs-1 (40) | 0.1 | 28 | Hydrocarbon-based POlymer-3 | <0.1 | <0.1 |
| Ex. 51 | PVB-1 | PEs-1 (40) | 0.1 | 28 | Hydrocarbon-based POlymer-4 | <0.1 | <0.1 |
| Ex. 52 | PVB-1 | PEs-1 (40) | 0.1 | 28 | Hydrocarbon-based POlymer-5 | <0.1 | <0.1 |

Comparative Example 1

The composition CA-1 was obtained in the same manner as the Example 1 except that 16 g of triethylene glycol di(2-ethylhexanoate) (melting point: <−20° C., hydroxyl value: 1 mgKOH/g or less) is used instead of PEs-1. According to the same method as the Example 1, acid value and glass transition temperature were measured for composition CA-1. In addition, a film, a PC laminate or the like, and a monolayer film laminated glass were produced in the same manner as the Example 1 except that the composition CA-1 is used instead of the composition A-1, and subjected to the same evaluations. The evaluation results are given in the Table 6.

Comparative Examples 2 to 5

The composition CA-2 to the composition CA-5 were obtained in the same manner as the Example 1 except that 16 g of each of PEs-17, 18, 24, and 25 is used instead of PEs-1. According to the same method as the Example 1, acid value and glass transition temperature were measured for the composition CA-2 to the composition CA-5. In addition, a film and a PC laminate or the like were produced in the same manner as the Example 1 except that the CA-2 to the composition CA-5 are used instead of the composition A-1, and subjected to the same evaluations. The evaluation results are given in the Table 6.

Comparative Example 6

The composition CA-6 was obtained in the same manner as the Example 1 except that 16 g of polycaprolactone (PLAC-CEL 210, manufactured by Daicel Chemical Industries, Ltd., hydroxyl value of 112 mgKOH/g, and melting point of 46 to 48° C.) is used instead of PEs-1. According to the same method as the Example 1, acid value and glass transition temperature were measured for composition CA-6. In addition, a film and a PC laminate or the like were produced in the same manner as the Example 1 except that the composition CA-6 is used instead of the composition A-1, and subjected to the same evaluations. The evaluation results are given in the Table 6.

Comparative Example 7

The composition CA-7 was obtained in the same manner as the Example 1 except that 16 g of polycaprolactone (PLAC-CEL H1P, manufactured by Daicel Chemical Industries, Ltd., melting point of 60° C.) is used instead of PEs-1. According to the same method as the Example 1, acid value and glass transition temperature were measured for composition CA-7. In addition, a film and a PC laminate or the like were produced in the same manner as the Example 1 except that the composition CA-7 is used instead of the composition A-1, and subjected to the same evaluations. The evaluation results are given in the Table 6.

Comparative Examples 8 to 14

The composition CA-8 to the composition CA-14 were obtained in the same manner as the Comparative Examples 1 to 7 except that 40 g of PBV-2 is used instead of PVE-1. According to the same method as the Example 1, acid value and glass transition temperature were measured for the composition CA-8 to the composition CA-14. In addition, a film, a PC laminate or the like, and a monolayer film laminated glass were produced in the same manner as the Example 1 except that the composition CA-8 to the composition CA-14 are used instead of the composition A-1, and subjected to the same evaluations. The evaluation results are given in the Table 6.

TABLE 6

| | Polyvinyl acetal | Polyester composition (parts by mass) | Composition | Acid value (mgKOH/g) | Glass transition temperature (° C.) | Phase separation over time | PC Increase in mass (% by mass) | PC Change in haze | PMMA Change in mass (% by mass) | PMMA Change in haze | PO Change in mass (% by mass) | PO Change in haze | Haze of monolayer film laminated glass |
|---|---|---|---|---|---|---|---|---|---|---|---|---|---|
| Comp. Ex. 1 | PVB-1 | *1 (40) | CA-1 | 0.1 | 22 | No | 3.4 | 37.2 | 1.1 | 14.1 | 2.6 | 25.3 | 0.6 |
| Comp. Ex. 2 | PVB-1 | PEs-17 (40) | CA-2 | 1 | 33 | Yes | 2.2 | 26.1 | 0.5 | 3.9 | 1.8 | 16.2 | — |
| Comp. Ex. 3 | PVB-1 | PEs-18 (40) | CA-3 | 1.2 | 48 | Yes | 0.5 | 5.0 | <0.1 | <0.1 | 0.4 | 8 | — |
| Comp. Ex. 4 | PVB-1 | PEs-24 (40) | CA-4 | 0.3 | 42 | Yes | <0.1 | <0.1 | <0.1 | <0.1 | <0.1 | <0.1 | — |

TABLE 6-continued

| | Poly-vinyl acetal | Polyester composition (parts by mass) | Composition | Acid value (mgKOH/g) | Glass transition temperature (° C.) | Phase separation over time | PC Increase in mass (% by mass) | PC Change in haze | PMMA Change in mass (% by mass) | PMMA Change in haze | PO Change in mass (% by mass) | PO Change in haze | Haze of monolayer film laminated glass |
|---|---|---|---|---|---|---|---|---|---|---|---|---|---|
| Comp. Ex. 5 | PVB-1 | PEs-25 (40) | CA-5 | 0.4 | 40 | Yes | <0.1 | <0.1 | <0.1 | <0.1 | <0.1 | <0.1 | — |
| Comp. Ex. 6 | PVB-1 | *2 (40) | CA-6 | 0.2 | 43 | Yes | <0.1 | <0.1 | <0.1 | <0.1 | <0.1 | <0.1 | — |
| Comp. Ex. 7 | PVB-1 | *3 (40) | CA-7 | 0.3 | 64 | Yes | <0.1 | <0.1 | <0.1 | <0.1 | <0.1 | <0.1 | — |
| Comp. Ex. 8 | PVB-2 | *1 (40) | CA-8 | 0.1 | 20 | No | 3.2 | 33.6 | 1.2 | 11.5 | 2.4 | 28.8 | 0.7 |
| Comp. Ex. 9 | PVB-2 | PEs-17 (40) | CA-9 | 1.1 | 30 | Yes | 2.0 | 24.0 | 0.7 | 7 | 2 | 13.1 | — |
| Comp. Ex. 10 | PVB-2 | PEs-18 (40) | CA-10 | 1.5 | 46 | Yes | 0.5 | 4.5 | 0.2 | 3.4 | 0.5 | 5 | — |
| Comp. Ex. 11 | PVB-2 | PEs-24 (40) | CA-11 | 0.3 | 37 | Yes | <0.1 | <0.1 | <0.1 | <0.1 | <0.1 | <0.1 | — |
| Comp. Ex. 12 | PVB-2 | PEs-25 (40) | CA-12 | 0.4 | 38 | Yes | <0.1 | <0.1 | <0.1 | <0.1 | <0.1 | <0.1 | — |
| Comp. Ex. 13 | PVB-2 | *2 (40) | CA-13 | 0.2 | 40 | Yes | <0.1 | <0.1 | <0.1 | <0.1 | <0.1 | <0.1 | — |
| Comp. Ex. 14 | PVB-2 | *3 (40) | CA-14 | 0.3 | 64 | Yes | <0.1 | <0.1 | <0.1 | <0.1 | <0.1 | <0.1 | — |

*1 triethylene glycol di(2-ethylhexanoate)
*2 PLACCEL 210
*3 PLACCEL H1P

As shown in the Table 6, when the polyester which does not have a hydroxyl value of 15 mgKOH/g is used and the number average molecular weight of the polyester is relatively low, the low migration property of the low molecular weight component in the polyester is not sufficient. On the other hand, when the number average molecular weight of the polyester is high, compatibility between the polyester and polyvinyl acetal is not sufficient. Further, when a polyester having a melting point of more than 30° C. is used, the polyester component is crystallized to cause phase separation when it is used after being stored for a long period of time at the temperature of less than room temperature.

(Production of Polyvinyl Acetal PVB-3)

To a 10 L (liter) glass vessel equipped with a reflux condenser, a thermometer, and an anchor type stirring wing, 8100 g of ion exchange water and 660 g of polyvinyl alcohol (PVA-1) (viscosity average degree of polymerization: 1700, saponification degree: 99 mol %) (PVA concentration: 7.5%) and completely dissolved by increasing the temperature to 95° C. Then, under stirring at 120 rpm, the mixture was gradually cooled to 5° C. over about 30 min and added with 416 g of butyl aldehyde and 540 mL of 20% hydrochloric acid for performing the butyralization for 150 min. The temperature was increased to 50° C. over 60 min, maintained at 50° C. for 120 min, and then cooled to room temperature. The precipitated resin was washed with ion exchange water, added with an excess amount of an aqueous solution of sodium hydroxide, washed again, and dried to obtain polyvinyl butyral (PVB-3). The PVB-3 obtained has degree of butyralization (average degree of acetalation) of 75 mol %, vinyl acetate group content of 1 mol %, and vinyl alcohol group content of 24 mol %. The degree of butyralization of PVB-3 and the content of residual vinyl acetate group were measured according to JIS K6728.

Production of Composition A-53

40 g of PVB-1, 16 g of glycerin tri(ricinoleic acid)ester (hydroxyl value of 180 mgKOH/g, melting point <20° C.: amorphous), 0.12 g of 2-(3,5-di-t-butyl-2-hydroxyphenyl) benzotriazole, 0.04 g of potassium acetate, and 0.05 g of 2,6-di-t-butyl-4-methylphenol were melt-kneaded by a laboplast mill (150° C., 60 rpm, 5 min) to obtain the composition A-53.

(Measurement of Acid Value of Composition A-53)

Acid value of the composition A-53 was measured according to JIS K6728.

(Measurement of Glass Transition Temperature of Composition A-53)

Dynamic viscoelasticity of the composition A-53 was measured according to JIS K7198 (frequency number: 1 Hz) and a glass transition temperature of composition A-53 was obtained from the tan δ peak temperature.

Production of Composition A-54

Composition A-54 was prepared in the same manner as the composition A-53 except that 16 g of castor oil (hydroxyl value of 160 mgKOH/g, and melting point <−20° C.: amorphous) is used instead of glycerin tri(ricinoleic acid)ester and subjected to the same measurement. Meanwhile, the castor oil that is used in the invention is a composition of glycerin tricarboxylic acid ester in which ratio of the ricinoleic acid ester is 90 mol %, total ratio of the oleic acid ester group, linoleic acid ester group, and linolenic acid group is 8 mol %, total ratio of palmitic acid ester and stearic acid ester group is 1 mol %, and ratio of other carboxylic acid ester group is 1 mol % (the ratio of the compound that is not a hydroxyl carboxylic acid ester compared to the total number of glycerin tricarboxylicacid ester molecules contained in the composition is 1% or less).

Production of Composition A-55

Composition A-55 was prepared in the same manner as the composition A-53 except that triethylene glycol di(2-hydroxybutyric acid)ester (hydroxyl value of 345 mgKOH/g, and melting point <–20° C.: amorphous) is used instead of glycerin tri(ricinoleic acid)ester, and subjected to the same measurement.

Production of Composition A-56

Composition A-56 was prepared in the same manner as the composition A-53 except that 3-methyl-1,5-pentane diol di(6-hydroxyhexanoic acid)ester (hydroxyl value of 256 mgKOH/g, and melting point=–20° C.) is used instead of glycerin tri(ricinoleic acid)ester, and subjected to the same measurement.

Production of Composition A-57

Composition A-57 was prepared in the same manner as the composition A-53 except that di(1-(2-ethylhexyl)) L-tartarate (hydroxyl value of 325 mgKOH/g, and melting point <–20° C.: amorphous) is used instead of glycerin tri(ricinoleic acid) ester, and subjected to the same measurement.

Production of Composition A-58

Composition A-58 was prepared in the same manner as the composition A-53 except that 40 g of PVB-3 is used instead of PVB-1, and subjected to the same measurement.

Production of Composition CA-15

Composition CA-15 was prepared in the same manner as the composition A-53 except that 16 g of triethylene glycol di(2-ethylhexanoate) (hydroxyl value of 5 mgKOH/g, and melting point <–20° C.: amorphous) is used instead of glycerin tri(ricinoleic acid)ester, and subjected to the same measurement.

Production of Composition B (PO)-2

100 g of Hydrocarbon-based polymer-2 and 0.1 g of 2,6-di-t-butyl-4-methylphenol were melt-kneaded in a laboplast mill (200° C., 60 rpm, 5 min) to obtain the composition B (PO)-2.

Production of Composition B (PO)-3

Composition B (PO)-3 was obtained in the same manner as the composition B (PO)-2 except that the hydrocarbon-based polymer-3 is used instead of hydrocarbon-based polymer-2.

Production of Composition B (PO)-4

Composition B (PO)-4 was obtained in the same manner as the composition B (PO)-2 except that the hydrocarbon-based polymer-4 is used instead of hydrocarbon-based polymer-2.

Production of Composition B (PO)-5

Composition B (PO)-5 was obtained in the same manner as the composition B (PO)-2 except that the hydrocarbon-based polymer-5 is used instead of hydrocarbon-based polymer-2.

Example 53

The film A-53 obtained by hot press (150° C., 12 kg/cm$^2$, 30 min) of the composition A-53 in a 10 cm×10 cm×0.3 mm frame and a film obtained by hot press (200° C., 12 kg/cm$^2$, 5 min) of the composition B (PO)-2 in a 10 cm×10 cm×0.2 mm frame were overlaid with each other in the order of (film A-53/film B (PO)-2/film A-53) and subjected to heat treatment in a frame of 10 cm×10 cm×0.8 mm at 135° C. for 30 min under the pressure of 12 kg/cm$^2$ to obtain the laminate-53.

(Evaluation of Plasticizer Migration)

The laminate-53 was treated at 100° C. for 5 hours and the amount of change in haze was measured before and after the treatment (haze meter manufactured by Suga Test Instruments Co., Ltd.). Further, the mass change ratio of the film A-53, which is contained in the laminate 53, was measured before and after the test. The results are given in the Table 7.

(Evaluation of PO-Containing Laminated Glass)

The laminate-53 was inserted between two sheets of a glass (10 cm×10 cm×3 mm) and deaerated at 50° C. using a nip roll. After the treatment in an autoclave (140° C., 12 kg/cm$^2$, 2 hours), the laminated glass-53 was obtained. By using a haze meter manufactured by Suga Test Instruments Co., Ltd., haze of the laminated glass-53 containing PO was evaluated. The results are shown in the Table 7.

Example 54

The laminated glass-54 containing PO and the laminate-54 were produced in the same manner as the Example 53 except that the composition A-54 is used instead of the composition A-53, and subjected to the same measurement. The results are given in the Table 7.

Example 55

The laminated glass-55 containing PO and the laminate-55 were produced in the same manner as the Example 53 except that the composition A-55 is used instead of the composition A-53, and subjected to the same measurement. The results are given in the Table 7.

Example 56

The laminated glass-56 containing PO and the laminate-56 were produced in the same manner as the Example 53 except that the composition A-56 is used instead of the composition A-53, and subjected to the same measurement. The results are given in the Table 7.

Example 57

The laminated glass-57 containing PO and the laminate-57 were produced in the same manner as the Example 53 except that the composition A-57 is used instead of the composition A-53, and subjected to the same measurement. The results are given in the Table 7.

Example 58

The laminated glass-58 containing PO and the laminate-58 were produced in the same manner as the Example 53 except that the composition A-58 is used instead of the composition A-53, and subjected to the same measurement. The results are given in the Table 7.

Example 59

The laminated glass-59 containing PO and the laminate-59 were produced in the same manner as the Example 54 except that the composition B(PO)-3 is used instead of the composition B(PO)-2, and subjected to the same measurement. The results are given in the Table 7.

Example 60

The laminated glass-60 containing PO and the laminate-60 were produced in the same manner as the Example 54 except that the composition B(PO)-4 is used instead of the composition B(PO)-2, and subjected to the same measurement. The results are given in the Table 7.

Example 61

The laminated glass-61 containing PO and the laminate-61 were produced in the same manner as the Example 54 except that the composition B(PO)-5 is used instead of the composition B(PO)-2, and subjected to the same measurement. The results are given in the Table 7.

Comparative Example 15

The Comparative Example laminated glass-15 containing PO and the Comparative Example laminate-15 were produced in the same manner as the Example 53 except that the composition CA-15 is used instead of the composition A-53, and subjected to the same measurement. The results are given in the Table 7.

g of ion exchange water and 660 g of polyvinyl alcohol (PVA-1) (viscosity average degree of polymerization: 1700, saponification degree: 99 mol %) (PVA concentration: 7.5%) were added and completely dissolved by increasing the temperature to 95° C. Then, under stirring at 120 rpm, the mixture was gradually cooled to 5° C. over about 30 min and added with 330 g of butyl aldehyde and 540 mL of 20% hydrochloric acid for performing the butyralization for 150 min. The temperature was increased to 50° C. over 60 min, maintained at 50° C. for 120 min, and then cooled to room temperature. The precipitated resin was washed with ion exchange water, added with an excess amount of an aqueous solution of sodium hydroxide, washed again, and dried to obtain polyvinyl butyral (PVB-4). The PVB-4 obtained has degree of butyralization (average degree of acetalation) of 60 mol %, vinyl acetate group content of 1 mol %, and vinyl alcohol group content of 39 mol %. The degree of butyralization of PVB-4 and the content of residual vinyl acetate group were measured according to JIS K6728.

(Production of Polyvinyl Acetal PVB-5)

To a 10 L (liter) glass vessel equipped with a reflux condenser, a thermometer, and an anchor type stirring wing, 8100 g of ion exchange water and 660 g of polyvinyl alcohol (PVA-1) (viscosity average degree of polymerization: 1700, saponification degree: 99 mol %) (PVA concentration: 7.5%)

TABLE 7

| | Composition A | | | | | | | | Laminate | | Haze of laminated glass |
|---|---|---|---|---|---|---|---|---|---|---|---|
| | Hydroxylcarboxylic acid ester compound | | | | | Glass | Composition B | | | | |
| | Compound | Hydroxyl value [mgKOH/g] | Melting point (° C.) | PVB | Composition | Acid value [mgKOH/g] | transition temperature (° C.) | Hydrocarbon-based polymer | Change in haze (%) | Change in mass (%) | containing PO Haze (%) |
| Ex. 53 | Glycerin tri(ricinoleic acid)ester | 180 | <−20 | PVB-1 | A-53 | 0.8 | 23 | Composition B (PO)-2 | <0.1 | <0.1 | 0.7 |
| Ex. 54 | Castor oil | 160 | <−20 | PVB-1 | A-54 | 1 | 25 | Composition B (PO)-2 | <0.1 | <0.1 | 0.6 |
| Ex. 55 | Triethylene glycol di(2-hydroxybutyric acid)ester | 345 | <−20 | PVB-1 | A-55 | 1.5 | 26 | Composition B (PO)-2 | <0.1 | <0.1 | 0.7 |
| Ex. 56 | 3-Methyl-1,5-pentane diol di(6-hydroxyhexanoic acid)ester | 256 | −20 | PVB-1 | A-56 | 2 | 25 | Composition B (PO)-2 | <0.1 | <0.1 | 0.7 |
| Ex. 57 | Di(1-(2-ethylhexyl) L-tartarate | 325 | <−20 | PVB-1 | A-57 | 0.7 | 22 | Composition B (PO)-2 | <0.1 | <0.1 | 0.5 |
| Ex. 58 | Glycerin tri(ricinoleic acid)ester | 180 | <−20 | PVB-3 | A-58 | 0.8 | 21 | Composition B (PO)-2 | <0.1 | <0.1 | 0.7 |
| Ex. 59 | Castor oil | 160 | <−20 | PVB-1 | A-54 | 1 | 25 | Composition B (PO)-3 | <0.1 | <0.1 | 0.6 |
| Ex. 60 | Castor oil | 160 | <−20 | PVB-1 | A-54 | 1 | 25 | Composition B (PO)-4 | <0.1 | <0.1 | 0.6 |
| Ex. 61 | Castor oil | 160 | <−20 | PVB-1 | A-54 | 1 | 25 | Composition B (PO)-5 | <0.1 | <0.1 | 0.6 |
| Comp. Ex. 15 | Triethylene glycol di(2-ethyl-hexanoate) *1 | ≤5 | <−20 | PVB-1 | CA-15 | 0.7 | 22 | Composition B (PO)-2 | 35 | 3 | 16 |

*1 It is not hydroxylcarboxylic acid ester composition (Production of Polyvinyl Acetal PVB-4)

To a 10 L (liter) glass vessel equipped with a reflux condenser, a thermometer, and an anchor type stirring wing, 8100 were added and completely dissolved by increasing the temperature to 95° C. Then, under stirring at 120 rpm, the mixture was gradually cooled to 5° C. over about 30 min and added with 275 g of butyl aldehyde and 540 mL of 20% hydrochloric acid for performing the butyralization for 150 min. The temperature was increased to 50° C. over 60 min, maintained at 50° C. for 120 min, and then cooled to room temperature. The precipitated resin was washed with ion exchange water, added with an excess amount of an aqueous solution of sodium hydroxide, washed again, and dried to obtain polyvinyl butyral (PVB-5). The PVB-5 obtained has degree of butyralization (average degree of acetalation) of 50 mol %, vinyl acetate group content of 1 mol %, and vinyl alcohol group content of 49 mol %. The degree of butyralization of PVB-5 and the content of residual vinyl acetate group were measured according to JIS K6728.

(Production of Polyether Compound PEt-1)

500 g of ethylene glycol and 0.6 g of potassium hydroxide were added to a 5 L (liter) autoclave and fully dehydrated under reduced pressure (50° C., 0.05 atm, 2 hours). After that, the autoclave was flushed with nitrogen, and while maintaining the reaction temperature at 140° C. and reaction pressure at 0.4 MPa, 2000 g of ethylene oxide was added thereto. The reaction was performed under stirring. After adding all the ethylene oxide, the reaction was performed at 140° C. for 1 hour, and at 100° C. and 0.02 atm, the unreacted ethylene oxide was removed. The resultant was cooled to 85° C. and added to nitrogen gas to bring it back to normal pressure. After filtration, polyether compound-1 (PEt-1) composed of the polyethylene glycol with number average molecular weight of 250 was obtained.

(Measurement of Melting Point of Polyether Compound)

According to JIS K7121, melting point of the polyether compound-1 was measured by DSC (differential scanning calorimetry). As a result, it was found to be lower than −20° C. or amorphous (if no melting point of −20° C. or above is observed when the measurement is carried out in the temperature range of −20° C. to 100° C., it is determined as "lower than −20° C. or amorphous", and it is simply described as "<−20" in the Table 8).

(Measurement of Hydroxyl Value of Polyether Compound)

The measurement was carried out according to JIS K1557. The results are given in the Table 8.

(Number Average Molecular Weight Based on Hydroxyl Value of Polyether Compound)

It was calculated according to the equation (3). The results are given in the Table 8.

(Production of Polyether Compound PEt-2)

200 g of ethylene glycol and 0.4 g of potassium hydroxide were added to a 5 L (liter) autoclave and fully dehydrated under reduced pressure (50° C., 0.05 atm, 2 hours). After that, the autoclave was flushed with nitrogen, and while maintaining the reaction temperature at 140° C. and reaction pressure at 0.4 MPa, 1800 g of ethylene oxide was added thereto. The reaction was performed under stirring. After adding all the ethylene oxide, the reaction was performed at 140° C. for 3 hours, and the unreacted ethylene oxide was removed at 100° C. and 0.02 atm. The resultant was cooled to 85° C. and added to nitrogen gas to bring it back to normal pressure. After filtration, polyether compound-2 (PEt-2) composed of the polyethylene glycol with number average molecular weight of 400 was obtained. The PEt-2 obtained was evaluated in the same manner as the PEt-1. The results are given in the Table 8.

(Production of Polyether Compound PEt-3)

120 g of ethylene glycol and 0.4 g of potassium hydroxide were added to a 5 L (liter) autoclave and fully dehydrated under reduced pressure (50° C., 0.05 atm, 2 hours). After that, the autoclave was flushed with nitrogen, and while maintaining the reaction temperature at 140° C. and reaction pressure at 0.4 MPa, 1500 g of ethylene oxide was added thereto. The reaction was performed under stirring. After adding all the ethylene oxide, the reaction was performed at 140° C. for 5 hours, and the unreacted ethylene oxide was removed at 100° C. and 0.02 atm. The resultant was cooled to 85° C. and added to nitrogen gas to bring it back to normal pressure. After filtration, polyether compound-3 (PEt-3) composed of the polyethylene glycol with number average molecular weight of 600 was obtained. The PEt-2 obtained was evaluated in the same manner as the PEt-1. The results are given in the Table 8.

(Production of Polyether Compound PEt-4)

500 g of diethylene glycol monolaurate and 0.4 g of potassium hydroxide were added to a 5 L (liter) autoclave and fully dehydrated under reduced pressure (50° C., 0.05 atm, 2 hours). After that, the autoclave was flushed with nitrogen, and while maintaining the reaction temperature at 140° C. and reaction pressure at 0.4 MPa, 1000 g of ethylene oxide was added thereto. The reaction was performed under stirring. After adding all the ethylene oxide, the reaction was performed at 140° C. for 3 hours, and the unreacted ethylene oxide was removed at 100° C. and 0.02 atm. The resultant was cooled to 85° C. and added to nitrogen gas to bring it back to normal pressure. After filtration, polyether compound-4 (PEt-4) composed of the polyethylene glycol monolaurate with number average molecular weight of 600 was obtained. The PEt-4 obtained was evaluated in the same manner as the PEt-1. The results are given in the Table 8.

(Production of Polyether Compound PEt-5)

250 g of glycerin and 0.4 g of potassium hydroxide were added to a 5 L (liter) autoclave and fully dehydrated under reduced pressure (50° C., 0.05 atm, 2 hours). After that, the autoclave was flushed with nitrogen, and while maintaining the reaction temperature at 140° C. and reaction pressure at 0.4 MPa, 1400 g of ethylene oxide was added thereto. The reaction was performed under stirring. After adding all the ethylene oxide, the reaction was performed at 140° C. for 3 hours, and the unreacted ethylene oxide was removed at 100° C. and 0.02 atm. The resultant was cooled to 85° C. and added to nitrogen gas to bring it back to normal pressure. After filtration, polyether compound-5 (PEt-5) composed of the glycerin tri(polyethylene glycol) ether with number average molecular weight of 600 was obtained. The PEt-5 obtained was evaluated in the same manner as the PEt-1. The results are given in the Table 8.

(Production of Polyether Compound PEt-6)

300 g of adipic acid and 0.4 g of potassium hydroxide were added to a 5 L (liter) autoclave and fully dehydrated under reduced pressure (50° C., 0.05 atm, 2 hours). After that, the autoclave was flushed with nitrogen, and while maintaining the reaction temperature at 140° C. and reaction pressure at 0.4 MPa, 800 g of ethylene oxide was added thereto. The reaction was performed under stirring. After adding all the ethylene oxide, the reaction was performed at 140° C. for 3 hours, and the unreacted ethylene oxide was removed at 100° C. and 0.02 atm. The resultant was cooled to 85° C. and added to nitrogen gas to bring it back to normal pressure. After filtration, polyether compound-6 (PEt-6) composed of the adipic acid di(polyethylene glycol) ester with number average molecular weight of 500 was obtained. The PEt-6 obtained was evaluated in the same manner as the PEt-1. The results are given in the Table 8.

(Production of Polyether Compound PEt-7)

190 g of 1,2-propylene glycol and 1.5 g of potassium hydroxide were added to a 5 L (liter) autoclave and fully dehydrated under reduced pressure (50° C., 0.05 atm, 2 hours). After that, the autoclave was flushed with nitrogen, and while maintaining the reaction temperature at 130° C. and reaction pressure at 0.4 MPa, 1600 g of 1,2-propylen oxide was added thereto. The reaction was performed under stirring. After adding all the 1,2-propylene oxide, the reaction was performed at 130° C. for 5 hours, and the unreacted 1,2-propylene oxide was removed at 0.02 atm. The resultant was cooled to 85° C. and added to nitrogen gas to bring it back to normal pressure. After filtration, polyether compound-7 (PEt-7) composed of the poly(1,2-propylene glycol) with number average molecular weight of 700 was obtained. The PEt-7 obtained was evaluated in the same manner as the PEt-1. The results are given in the Table 8.
(Production of Polyether Compound PEt-8)

80 g of 1,2-propylene glycol and 1.5 g of potassium hydroxide were added to a 5 L (liter) autoclave and fully dehydrated under reduced pressure (50° C., 0.05 atm, 2 hours). After that, the autoclave was flushed with nitrogen, and while maintaining the reaction temperature at 130° C. and reaction pressure at 0.4 MPa, 1100 g of 1,2-propylen oxide was added thereto. The reaction was performed under stirring. After adding all the 1,2-propylene oxide, the reaction was performed at 130° C. for 5 hours, and the unreacted 1,2-propylene oxide was removed at 0.02 atm. The resultant was cooled to 85° C. and added to nitrogen gas to bring it back to normal pressure. After filtration, polyether compound-8 (PEt-8) composed of the poly(1,2-propylene glycol) with number average molecular weight of 1050 was obtained. The PEt-8 obtained was evaluated in the same manner as the PEt-1. The results are given in the Table 8.
(Production of Polyether Compound PEt-9)

200 g of 1,2-butylene glycol and 1.8 g of potassium hydroxide were added to a 5 L (liter) autoclave and fully dehydrated under reduced pressure (50° C., 0.05 atm, 2 hours). After that, the autoclave was flushed with nitrogen, and while maintaining the reaction temperature at 140° C. and reaction pressure at 0.4 MPa, 2000 g of 1,2-butylene oxide was added thereto. The reaction was performed under stirring. After adding all the 1,2-butylene oxide, the reaction was performed at 140° C. for 5 hours, and the unreacted ethylene oxide was removed at 0.02 atm. The resultant was cooled to 85° C. and added to nitrogen gas to bring it back to normal pressure. After filtration, polyether compound-9 (PEt-9) composed of the poly(1,2-butylene glycol) with number average molecular weight of 1000 was obtained. The PEt-9 obtained was evaluated in the same manner as the PEt-1. The results are given in the Table 8.

Production of Composition A-62

40 g of PVB-5, 16 g of PEt-1 (40 parts by mass compared to 100 parts by mass of PVB), 0.12 g of 2-(3,5-di-t-butyl-2-hydroxyphenyl)benzotriazole, 0.04 g of potassium acetate, and 0.05 g of 2,6-di-t-butyl-4-methylphenol were melt-kneaded by a laboplast mill (150° C., 60 rpm, 5 min) to obtain the composition A-62.
(Measurement of Acid Value of Composition A-62)

Acid value of the composition A-62 was measured according to JIS K6728. The results are given in the Table 9.
(Measurement of Glass Transition Temperature of Composition A-62)

Dynamic viscoelasticity of the composition A-62 was measured according to JIS K7198 (frequency number: 1 Hz) and a glass transition temperature of composition A-62 was obtained the tan δ peak temperature. The results are given in the Table 9.

Production of Composition A-63

Composition A-63 was prepared in the same manner as the composition A-62 except that the PEt-2 is used instead of the PEt-1, and subjected to the same measurement. The results are given in the Table 9.

Production of Composition A-64

Composition A-64 was prepared in the same manner as the composition A-62 except that the PEt-3 is used instead of the PEt-1, and subjected to the same measurement. The results are given in the Table 9.

Production of Composition A-65

Composition A-65 was prepared in the same manner as the composition A-62 except that the PEt-4 is used instead of the PEt-1, and subjected to the same measurement. The results are given in the Table 9.

Production of Composition A-66

Composition A-66 was prepared in the same manner as the composition A-62 except that the PEt-5 is used instead of the PEt-1, and subjected to the same measurement. The results are given in the Table 9.

Production of Composition A-67

Composition A-67 was prepared in the same manner as the composition A-67 except that the PEt-6 is used instead of the PEt-1, and subjected to the same measurement. The results are given in the Table 9.

Production of Composition A-68

Composition A-68 was prepared in the same manner as the composition A-63 except that use amount of the PEt-2 is changed to 20 g (i.e. 50 parts by weight compared to 100 parts by weight of the PVB), and subjected to the same measurement. The results are given in the Table 9.

Production of Composition A-69

Composition A-69 was prepared in the same manner as the composition A-63 except that use amount of the PEt-2 is changed to 12 g (i.e. 30 parts by weight compared to 100 parts by weight of the PVB), and subjected to the same measurement. The results are given in the Table 9.

Production of Composition A-70

Composition A-70 was prepared in the same manner as the composition A-65 except that the PVB-4 is used instead of the PVB-5, and subjected to the same measurement. The results are given in the Table 9.

Production of Composition A-71

Composition A-71 was prepared in the same manner as the composition A-65 except that the PVB-1 is used instead of the PVB-5, and subjected to the same measurement. The results are given in the Table 9.

Production of Composition A-72

Composition A-72 was prepared in the same manner as the composition A-62 except that the PEt-7 is used instead of the PEt-1 and the PVB-1 is used instead of the PVB-5, and subjected to the same measurement. The results are given in the Table 9.

Production of Composition A-73

Composition A-73 was prepared in the same manner as the composition A-72 except that the PEt-8 is used instead of the PEt-7, and subjected to the same measurement. The results are given in the Table 9.

Production of Composition A-74

Composition A-74 was prepared in the same manner as the composition A-72 except that the PEt-9 is used instead of the PEt-7, and subjected to the same measurement. The results are given in the Table 9.

Production of Composition CA-16

Composition CA-16 was prepared in the same manner as the composition A-71 except that the triethylene glycol di 2-ethylhexanoate (3G8) is used instead of the PEt-4, and subjected to the same measurement. The results are given in the Table 9.

Example 62

The film (film A-62) obtained by hot press (150° C., 12 kg/cm$^2$, 30 min) of the composition A-62 in a 10 cm×10 cm×0.3 mm frame and a film (film B (PO-3)) obtained by hot press (200° C., 12 kg/cm$^2$, 5 min) of the composition B (PO)-3 in a 10 cm×10 cm×0.2 mm frame were overlaid with each other in the order of (film A-62/film B (PO)-3/film A-62) and subjected to heat treatment in a frame of 10 cm×10 cm×0.8 mm at 135° C. for 30 min under the pressure of 12 kg/cm$^2$ to obtain the laminate-62.
(Evaluation of Plasticizer Migration)
The laminate-62 was treated at 100° C. for 5 hours and the amount of change in haze was measured before and after the treatment (haze meter manufactured by Suga Test Instruments Co., Ltd.). Further, the mass change ratio of the film A-62, which is contained in the laminate 62, was measured before and after the test. The results are given in the Table 9.
(Evaluation of PO-Containing Laminated Glass)
The laminate-62 was inserted between two sheets of a glass (10 cm×10 cm×3 mm) and deaerated at 50° C. using a nip roll. After the treatment in an autoclave (140° C., 12 kg/cm$^2$, 2 hours), the laminated glass-62 containing PO was obtained. By using a haze meter manufactured by Suga Test Instruments Co., Ltd., haze of the laminated glass-62 containing PO was evaluated. The results are shown in the Table 9.

Example 63

The laminated glass-63 containing PO and the laminate-63 were produced in the same manner as the Example 62 except that the composition A-63 is used instead of the composition A-62, and subjected to the same measurement. The results are given in the Table 9.

Example 64

The laminated glass-64 containing PO and the laminate-64 were produced in the same manner as the Example 62 except that the composition A-64 is used instead of the composition A-62, and subjected to the same measurement. The results are given in the Table 9.

Example 65

The laminated glass-65 containing PO and the laminate-65 were produced in the same manner as the Example 62 except that the composition A-65 is used instead of the composition A-62, and subjected to the same measurement. The results are given in the Table 9.

Example 66

The laminated glass-66 containing PO and the laminate-66 were produced in the same manner as the Example 62 except that the composition A-66 is used instead of the composition A-62, and subjected to the same measurement. The results are given in the Table 9.

Example 67

The laminated glass-67 containing PO and the laminate-67 were produced in the same manner as the Example 62 except that the composition A-67 is used instead of the composition A-62, and subjected to the same measurement. The results are given in the Table 9.

Example 68

The laminated glass-68 containing PO and the laminate-68 were produced in the same manner as the Example 62 except that the composition A-68 is used instead of the composition A-62, and subjected to the same measurement. The results are given in the Table 9.

Example 69

The laminated glass-69 containing PO and the laminate-69 were produced in the same manner as the Example 62 except that the composition A-69 is used instead of the composition A-62, and subjected to the same measurement. The results are given in the Table 9.

Example 70

The laminated glass-70 containing PO and the laminate-70 were produced in the same manner as the Example 62 except that the composition A-70 is used instead of the composition A-62, and subjected to the same measurement. The results are given in the Table 9.

Example 71

The laminated glass-71 containing PO and the laminate-71 were produced in the same manner as the Example 62 except that the composition A-71 is used instead of the composition A-62, and subjected to the same measurement. The results are given in the Table 9.

Example 72

The laminated glass-72 containing PO and the laminate-72 were produced in the same manner as the Example 62 except that the composition A-72 is used instead of the composition A-62, and subjected to the same measurement. The results are given in the Table 9.

Example 73

The laminated glass-73 containing PO and the laminate-73 were produced in the same manner as the Example 62 except that the composition A-73 is used instead of the composition A-62, and subjected to the same measurement. The results are given in the Table 9.

Example 74

The laminated glass-74 containing PO and the laminate-74 were produced in the same manner as the Example 62 except that the composition A-74 is used instead of the composition A-62, and subjected to the same measurement. The results are given in the Table 9.

Example 75

The laminated glass-75 containing PO and the laminate-75 were produced in the same manner as the Example 62 except that the composition B(PO)-4 is used instead of the composition B(PO)-3, and subjected to the same measurement. The results are given in the Table 9.

Example 76

The laminated glass-76 containing PO and the laminate-76 were produced in the same manner as the Example 62 except that the composition B(PO)-5 is used instead of the composition B(PO)-3, and subjected to the same measurement. The results are given in the Table 9.

Comparative Example 16

The laminate-16 and laminated glass-16 of the Comparative Example were produced in the same manner as the Example 62 except that the composition CA-16 is used instead of the composition A-62, and subjected to the same measurement. The results are given in the Table 9.

TABLE 8

| Polyether compound | | Melting point (° C.) | Hydroxyl value (mgKOH/g) | Number average molecular weight based on hydroxyl value |
|---|---|---|---|---|
| PEt-1 | PEG | <−20 | 448 | 250 |
| PEt-2 | PEG | 6 | 280 | 400 |
| PEt-3 | PEG | 21 | 186 | 600 |
| PEt-4 | PEG-Monolaurate | 11 | 93 | 600 |
| PEt-5 | Glycerin tri(PEG)ether | <−20 | 280 | 600 |
| PEt-6 | Adipic acid di(PEG)ester | <−20 | 225 | 500 |
| PEt-7 | PPG | <−20 | 160 | 700 |
| PEt-8 | PPG | <−20 | 107 | 1050 |
| PEt-9 | PBG | <−20 | 112 | 1000 |

PEG: Polyethylene glycol
PPG: Poly(1,2-propylene glycol)
PBG: Poly(1,2-butylene glycol)

TABLE 9

| | Composition A | | | | Glass | | Laminate | | Haze of |
|---|---|---|---|---|---|---|---|---|---|
| | PVB (100 parts) | Polyether compound | | Composition | Acid value (mgKOH/g) | transition temperature (° C.) | Composition B Hydrocarbon-based polymer | Change in haze (%) | Change in mass (%) | laminated glass containing PO Haze (%) |
| Ex. 62 | PVB-5 | PEt-1 | 40 parts | A-62 | 0.1 | 32 | Composition B (PO)-3 | <0.1 | <0.1 | 0.8 |
| Ex. 63 | PVB-5 | PEt-2 | 40 parts | A-63 | 0.3 | 35 | Composition B (PO)-3 | <0.1 | <0.1 | 0.9 |
| Ex. 64 | PVB-5 | PEt-3 | 40 parts | A-64 | 0.2 | 38 | Composition B (PO)-3 | <0.1 | <0.1 | 0.8 |
| Ex. 65 | PVB-5 | PEt-4 | 40 parts | A-65 | 0.6 | 32 | Composition B (PO)-3 | <0.1 | <0.1 | 1.6 |
| Ex. 66 | PVB-5 | PEt-5 | 40 parts | A-66 | 0.2 | 33 | Composition B (PO)-3 | <0.1 | <0.1 | 1.7 |
| Ex. 67 | PVB-5 | PEt-6 | 40 parts | A-67 | 0.1 | 36 | Composition B (PO)-3 | <0.1 | <0.1 | 0.7 |
| Ex. 68 | PVB-5 | PEt-2 | 50 parts | A-68 | 0.4 | 32 | Composition B (PO)-3 | <0.1 | <0.1 | 0.9 |
| Ex. 69 | PVB-5 | PEt-2 | 30 parts | A-69 | 0.3 | 39 | Composition B (PO)-3 | <0.1 | <0.1 | 0.8 |
| Ex. 70 | PVB-4 | PEt-4 | 40 parts | A-70 | 0.9 | 29 | Composition B (PO)-3 | <0.1 | <0.1 | 1.8 |
| Ex. 71 | PVB-1 | PEt-4 | 40 parts | A-71 | 0.8 | 24 | Composition B (PO)-3 | <0.1 | <0.1 | 1.7 |
| Ex. 72 | PVB-1 | PEt-7 | 40 parts | A-72 | 0.2 | 31 | Composition B (PO)-3 | 2.7 | 0.2 | 2.0 |
| Ex. 73 | PVB-1 | PEt-8 | 40 parts | A-73 | 0.2 | 37 | Composition B (PO)-3 | 1.6 | 0.1 | 1.2 |
| Ex. 74 | PVB-1 | PEt-9 | 40 parts | A-74 | 0.3 | 30 | Composition B (PO)-3 | 4.8 | 0.3 | 3.7 |
| Ex. 75 | PVB-5 | PEt-1 | 40 parts | A-62 | 0.1 | 32 | Composition B (PO)-4 | <0.1 | <0.1 | 0.8 |
| Ex. 76 | PVB-5 | PEt-1 | 40 parts | A-62 | 0.1 | 32 | Composition B (PO)-5 | <0.1 | <0.1 | 0.8 |
| Comp Ex. 16 | PVB-1 | 3G8* | 40 parts | CA-16 | 0.5 | 22 | Composition B (PO)-3 | 35 | 2.6 | 18.0 |

*Triethylene glycol di 2-ethylhexanoate

INDUSTRIAL APPLICABILITY

The polyvinyl acetal composition of the invention is suitably used for an intermediate film for laminated glass, a binder for a multilayer ceramic, and other applications in which flexible polyvinyl acetal is required. Further, the ester plasticizer or the ether plasticizer contained in the polyvinyl acetal composition of the invention has high compatibility with the polyvinyl acetal and it has a low migration property to other resin layers like poly(meth)acrylic acid ester, polycarbonate, polyolefin, and a styrene thermoplastic elastomer. Thus, causing no decrease in dynamic strength or no increase in haze in the resin layers, it is suitably used for an application in which the resin layers are directly overlaid with a layer composed of the polyvinyl acetal composition, in particular, for an intermediate film of a laminated glass having high performance.

EXPLANATIONS OF REFERENCE NUMERALS

1 LAMINATE RESIN SHEET, GLASS, OR THE LIKE
2 ENCAPSULANT
3 SOLAR CELL (CRYSTAL SYSTEM)
4 SOLAR CELL (THIN FILM TYPE)

The invention claimed is:

1. A polyvinyl acetal composition comprising 100 parts by mass of a polyvinyl acetal and 0.5 to 100 parts by mass of an ester plasticizer that has a melting point of 30° C. or less and a hydroxyl value of 15 to 450 mgKOH/g, or an ester plasticizer that is amorphous and has a hydroxyl value of 15 to 450 mgKOH/g.

2. The polyvinyl acetal composition according to claim 1, wherein the ester plasticizer is a polyester.

3. The polyvinyl acetal composition according to claim 2, wherein the polyester comprises a polymer of hydroxyl carboxylic acid or a polymer of lactone compound.

4. The polyvinyl acetal composition according to claim 3, wherein the number of the carbon atoms in the hydroxyl carboxylic acid or lactone compound is 2 to 10.

5. The polyvinyl acetal composition according to claim 2, in which the polyester comprises a condensation polymer of carbonic acid compound and polyhydric alcohol.

6. The polyvinyl acetal composition according to claim 5, wherein the polyhydric alcohol is aliphatic saturated diol having 2 to 12 carbon atoms.

7. The polyvinyl acetal composition according to claim 1, wherein the polyester comprises a condensation polymer of polyvalent carboxylic acid and polyhydric alcohol.

8. The polyvinyl acetal composition according to claim 7, wherein the polyvalent carboxylic acid is aliphatic saturated dicarboxylic acid having 4 to 12 carbon atoms.

9. The polyvinyl acetal composition according to claim 7, wherein the polyhydric alcohol is aliphatic saturated diol having 2 to 12 carbon atoms.

10. The polyvinyl acetal composition according to claim 7, wherein the sum of the average carbon atom number in the polyvalent carboxylic acid and the average carbon atom number in the polyhydric alcohol is 8 to 20.

11. The polyvinyl acetal composition according to claim 1, wherein the compound comprised in the polyester comprises at least one functional group selected from a group consisting of a hydroxyl group, a carboxyl group, and a carboxylate group in the molecule.

12. The polyvinyl acetal composition according to claim 11, wherein the functional group is a hydroxyl group.

13. The polyvinyl acetal composition according to claim 1, wherein a number average molecular weight of the polyester obtained on the basis of GPC analysis is 200 to 5,000.

14. The polyvinyl acetal composition according to claim 1, wherein the polyester is a hydroxylated polyester and a number average molecular weight of the polyester obtained on the basis of hydroxyl value is 200 to 2,500.

15. The polyvinyl acetal composition according to claim 1, wherein the ester plasticizer is a hydroxyl carboxylic acid ester compound.

16. The polyvinyl acetal composition according to claim 15, wherein the polyvinyl acetal composition comprises 5 to 100 parts by mass of the hydroxyl carboxylic acid ester compound compared to 100 parts by mass of the polyvinyl acetal.

17. The polyvinyl acetal composition according to claim 15, wherein the hydroxyl carboxylic acid ester compound is an ester compound of hydroxyl carboxylic acid and alcohol, and the hydroxyl carboxylic acid is ricinoleic acid.

18. The polyvinyl acetal composition according to claim 15, wherein the hydroxyl carboxylic acid ester compound is an ester compound of hydroxyl carboxylic acid and polyhydric aliphatic alcohol having 2 to 20 carbon atoms.

19. The polyvinyl acetal composition according to claim 1, wherein the acid value is 10.0 mgKOH/g or less.

20. The polyvinyl acetal composition according to claim 1, wherein the average degree of acetalization of the polyvinyl acetal is 40 to 85 mol % and average content of vinyl ester unit is 0.01 to 30 mol %.

21. The polyvinyl acetal composition according to claim 1, wherein the polyvinyl acetal is obtained by acetalization of a vinyl alcohol polymer having viscosity average polymerization degree of 150 to 3000.

22. The polyvinyl acetal composition according to claim 1, wherein the polyvinyl acetal is polyvinyl butyral.

23. The polyvinyl acetal composition according to claim 1, wherein a glass transition temperature of the polyvinyl acetal composition is 0 to 50° C.

24. A sheet comprising the polyvinyl acetal composition described in claim 1.

25. A laminated glass comprising the sheet described in claim 24.

26. A laminate comprising the sheet described in claim 24 and a layer composed of a composition comprising at least one resin selected from a group consisting of poly(meth)acrylic acid ester, polycarbonate, and polyolefin.

27. The laminate according to claim 26, wherein the resin is poly(methyl methacrylate).

28. The laminate according to claim 26, wherein the resin is aromatic polycarbonate.

29. A laminated glass comprising the laminate described in claim 26.

30. A laminate comprising a sheet comprising a polyvinyl acetal composition comprising 100 parts by mass of a polyvinyl acetal and 0.5 to 100 parts by mass of an ester plasticizer or ether plasticizer that has a melting point of 30° C. or less and a hydroxyl value of 15 to 450 mgKOH/g, or an ester plasticizer or ether plasticizer that is amorphous and has a hydroxyl value of 15 to 450 mgKOH/g, and a layer composed of a composition comprising a polymer of at least one compound selected from a group consisting of aliphatic unsaturated hydrocarbon having 2 to 12 carbon atoms and aromatic unsaturated hydrocarbon having 8 to 12 carbon atoms, or a hydrogenated molecule thereof.

31. The laminate according to claim 30, wherein the resin is a block copolymer comprising a polymer block (X) of aromatic unsaturated hydrocarbon having 8 to 12 carbon atoms and a polymer block (Y) of aliphatic conjugated polyene having 2 to 12 carbon atoms, or a hydrogenated molecule thereof.

32. The laminate according to claim 31, wherein the aromatic unsaturated hydrocarbon is styrene and the aliphatic conjugated polyene is at least one compound selected from a group consisting of butadiene, isoprene, and a mixture of butadiene and isoprene.

33. A laminated glass comprising the laminate described in claim 30.

34. A solar cell module comprising a sheet comprising a polyvinyl acetal composition comprising 100 parts by mass of a polyvinyl acetal and 0.5 to 100 parts by mass of an ester plasticizer or ether plasticizer that has a melting point of 30° C. or less and a hydroxyl value of 15 to 450 mgKOH/g, or an ester plasticizer or ether plasticizer that is amorphous and has a hydroxyl value of 15 to 450 mgKOH/g.

* * * * *